United States Patent
Bergsrud et al.

(10) Patent No.: US 10,574,097 B2
(45) Date of Patent: Feb. 25, 2020

(54) DYNAMIC WIRELESS POWER/ENERGY TRANSFER SYSTEM APPARATUS INCLUDING MODELING AND SIMULATION (M AND S), ANALYSIS, AND VISUALIZATION (MSAV) SYSTEMS ALONG WITH RELATED METHODS

(71) Applicant: The United States of America, as represented by the Secretary of the Navy, Crane, IN (US)

(72) Inventors: Corey Alexis Marvin Bergsrud, Bloomington, IN (US); Alex John Zellner, Terre Haute, IN (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 77 days.

(21) Appl. No.: 15/917,248

(22) Filed: Mar. 9, 2018

(65) Prior Publication Data
US 2018/0342910 A1 Nov. 29, 2018

Related U.S. Application Data

(60) Provisional application No. 62/511,524, filed on May 26, 2017.

(51) Int. Cl.
*H02J 50/90* (2016.01)
*H02J 50/70* (2016.01)
(Continued)

(52) U.S. Cl.
CPC .............. *H02J 50/90* (2016.02); *H02J 50/40* (2016.02); *H02J 50/70* (2016.02); *H02J 50/27* (2016.02); *H02J 50/80* (2016.02)

(58) Field of Classification Search
None
See application file for complete search history.

(56) References Cited

U.S. PATENT DOCUMENTS

| | | | | |
|---|---|---|---|---|
| 2013/0159956 A1* | 6/2013 | Verghese | ............ | G06F 17/5036 716/122 |
| 2015/0073768 A1* | 3/2015 | Kurs | .................. | G06F 17/5036 703/13 |
| 2015/0204949 A1* | 7/2015 | Von Novak, III | ..... | G01R 33/02 324/258 |

OTHER PUBLICATIONS

Wireless Power Analysis GUI: I 1.N. Shinohara, "Beam efficiency of wireless power transmission via radio waves from short range to long range," Journal of Korean Institute of Electromagnetic Engineering and Science, vol. 10, No. 4, Dec. 2010. 2.W.C. Brown and E.E. Eves, "Beamed microwave transmission and its application to space," IEEE Trans. MTT, vol. 40, No. 6, Jun. 1992. 3.W.C. Brown, Electronic and Mechanical Improvement of the Receiving Terminal of a Free-Space Microwave Power Transmission System, Raytheon Company, MA, USA, Tech. Rep. PT-4964, Aug. 1977, NASA Rep. CR-135194. 4.J.O. McSpadden, L. Fan, and K. Chang, "Design and experiments of a high-conversion-efficiency 5.8-GHz rectenna," IEEE Trans. MTT, vol. 46, No. 12, pp. 2053-2060, Dec. 1998. 5.P. Koert, J. Cha, and M. Macina, "35 and 94 GHz rectifying antenna systems," in SPS 91-Power From Space Dig., Paris, France, Aug. 1991, pp. 541-547. 6.B. Strassner and K. Chang, "Microwave power transmission: historical milestones and system components," Proc. of the IEEE, vol. 101, No. 6, Jun. 2013.

(Continued)

*Primary Examiner* — Jared Fureman
*Assistant Examiner* — Joel Barnett
(74) *Attorney, Agent, or Firm* — Naval Surface Warfare Center, Crane Division

(57) ABSTRACT

Systems and related methods are provided for improving cognitive function of a wireless power system designer and simulate various aspects of a wireless power system as an (Continued)

aid in making design selections in a tradeoff environment. Various embodiment enable such improved cognitive function by providing machine instructions that generate various graphical user interfaces which enable the wireless power system designer to visualize, compare, select, and change a variety of independent and dependent variables pertaining to a plurality of potential wireless power systems, a plurality of potential diodes, and a plurality of potential coplanar striplines for use in a plurality of operational environments as desired by the wireless power system designer. Aspects of various embodiments display design constraint warnings thereby providing visual display of design space solutions that do not violate various design constraints.

6 Claims, 54 Drawing Sheets

(51) Int. Cl.
  *H02J 50/40* (2016.01)
  *H02J 50/27* (2016.01)
  *H02J 50/80* (2016.01)

(56) References Cited

OTHER PUBLICATIONS

Wireless Power Analysis GUI: II 1.C. Bergsrud, R. Bernaciak, S. Chaieb, and J. Casler, "Rectenna array equipped on satellites," Journal of Spacecraft and Rockets, vol. 53, pp. 480-493, 2016. 2.J. McSpadden, Rectenna Cover for a Wireless Power Receptor, U.S. Pat. No. 8,334,816 Dec. 18, 2012. 3.International Telecommunication Union, Attenuation by atmospheric gases, Recommendation ITU-R P.676-11. P Series, Radiowave propagation, Sep. 2016. 4.# D. Pozar, "The active element pattern," IEEE Trans. on Antennas and Pro., vol. 42, No. 8, pp. 1176-1178, 1994. 5.#N. Amitay, J. Cook, R. Pecina, and P. Wu, "On mutual coupling and matching conditions in large planar phased arrays," Proc. of the Antennas and Prop. Society International Symposium, IEEE Publ., Piscataway, NJ, pp. 150-156, 1964.

Coplanar Stripline Analysis GUI 1.R. Garg, I. Bahl, and M. Bozzi, Coplanar lines: coplanar waveguide and coplanar strips, in Microstrip Lines and Slotlines, 3rd ed Boston, MA; Artech House, pp. 347-432, 2013. 2.G. Ghione and C. Naldi, "Analytical formulas for coplanar lines in hybrid and monolithic MICs," Electronics Letters, vol. 20, pp. 179-181, 1984.

Diode Analysts GUI 1.J.O. McSpadden, L. Fan, and K. Chang, "Design and experiments of a high-conversion-efficiency 5.8-GHz rectenna," IEEE Trans. MTT, vol. 46, No. 12, pp. 2053-2060, Dec. 1998. 2.B. Strassner and K. Chang, "Microwave power transmission: historical milestones and system components," Proc. of the IEEE, vol. 101, No. 6, Jun. 2013. 3.T.W. Yoo and K. Chang, "Theoretical and experimental development of 10 and 35 GHz rectennas," IEEE Trans. MTT, vol. 40, No. 6, Jun. 1992. 4.C. Valenta and G. Durgin, "Harvesting wireless power," IEEE microwave magazine, pp. 108-120, Jun. 2014. 5.A. Collado and A. Georgiadis, "Optimal waveforms for efficient wireless power transmission," IEEE Microw. Wireless Compon. Lett., vol. 24, No. 5, pp. 354-356, May 2014. 6.C. Valenta, M. Morys, and G. Durgin, "Theoretical energy-conversion efficiency for energy-harvesting circuits under power-optimized waveform excitation," IEEE Trans. MTT, vol. 63, No. 5, May 2015. 7.B. Strassner and K. Chang, "5.8-GHz circularly polarized rectifying antenna for wireless microwave power transmission," IEEE Trans. MTTT, vol. 50, No. 8, Aug. 2002.

\* cited by examiner

Simplified Overview of Wireless Power Transfer System Design Process using MSAV System Step 5A: Determine application scenario requiring wireless power transfer e.g. electric, magnetic, laser, etc. (e.g. see Fig. 1A)

↓

Step 5B: Input design variables into Wireless Power/Energy System (WPES), Modeling and Simulation (M&S), Analysis, and Visualization (MSAV) System (e.g. see Fig. 4, 7, 8)

↓

Step 5C: Generate MSAV System outputs (e.g., see Figs 4, 7, 8), utilize the MSAV System outputs in evaluating design parameter tradeoffs, if a design will exceed a performance or design/component limitation parameter, and otherwise will produce a desired wireless power transfer performance based on performance requirements and limitations designing wireless power transfer system to produce a wireless power transfer system design

↓

Step 5D: Manufacture wireless power transfer system based on MSAV System outputs and resulting wireless power transfer system design

FIG.2

Output of Fig.4 from measured data user input (used to create a library displayed in Fig.5): (A) with "Track Measured Data" unchecked.

Output of Fig.4 from measured data user input (used to create a library displayed in Fig.5): (B) with "Track Measured Data" checked.

Wireless Power System Diode Comparison and Selection Analysis tool for the Interactive WPES MSAV system Coplanar Stripline Analysis tool for the Interactive WPES MSAV system

| \# | \# | 237. Function wireless_power_gui |
|---|---|---|
| | Generates tab_wpa 391, tab_da 451, tab_cpsa 421, and executes WPA_INIT 239, DA_INIT 241, and CPSA_INIT 242 during step 600 |||
| # | Name of Functions | Relationship / Function |
| 239 | WPA_INIT | Generates the Wireless Power Analysis UIObject Variables 401–419 during step 601 |
| 241 | DA_INIT | Generates the Diode Analysis UIObject Variables 453–465 during step 631 |
| 242 | CPSA_INIT | Generates the Coplanar Stripline Analysis UIObject Variables 423–435 during step 661 |
| 243 | WPA_CALLBACK | Accepts user input from Input Variables edit boxes 405, Transmitter Aperture radio buttons 407, Receiver Aperture radio buttons 409, Parametric Analysis lists 411, and button_library 415 by using steps 603, 607, 609, or 611 |
| 245 | DA_CALLBACK | Accepts user input from Input Variables edit boxes 457, library menu/edit box 459, and Parametric Analysis lists 461 by using steps 633, 639, 641, or 644 |
| 246 | CPSA_CALLBACK | Accepts user input from Input Variables edit boxes 427, and Parametric Analysis lists 431 by using steps 663, 667, or 669 |
| 247 | WPA_UPDATE | Displays values for Input Variables Edit Boxes 405, Data Point List 411, Output Variables Graphs 413, Analysis Summary Table 417, and Warning Text 419 during step 605 |
| 249 | DA_UPDATE | Displays values for Output Variables Graphs 463 and Analysis Summary Tables 465 during step 635 |
| 250 | CPSA_UPDATE | Displays values for Output Variables Graphs 433 and Analysis Summary Table 435 during step 665 |

FIG.9A1

| 239. Function Group WPA_INIT ||  |
|---|---|---|
| # | Name of Functions | Relationship / Function |
| 239A | instructions | Generates Operating Instructions button 33 |
| 239B | input | Generates panel_input 401 |
| 239C | parametric_analysis | Generates panel_parametric 403, parametric analysis lists 411, and Reset All button 45 |
| 239D | frequency | Generates panel_f 403 and edit_f 405 |
| 239E | power_density | Generates panel_pd 403 and edit_pd 405 |
| 239F | power_transmitted | Generates panel_pt 403 and edit_pt 405 |
| 239G | distance | Generates panel_d 403 and edit_d 405 |
| 239H | transmitter_aperture_area | Generates panel_at 403, edit_at1, edit_at2, edit_at3 405, and radio buttons 407 |
| 239I | receiver_aperture_area | Generates panel_ar 403, edit_ar1, edit_ar2, edit_ar3 405, and radio buttons 409 |
| 239J | output | Generates panel_output 401 |
| 239K | axes | Generates axes1, axes2, axes3, axes4, axes5 413 and button_library 415 |
| 239L | analysis_summary | Generates panel_analysis 401, table1 417, and text_warn 419 |

FIG. 9A2

| 241. Function Group DA_INIT ||  |
|---|---|---|
| # | Name of Functions | Relationship / Function |
| 241A | instructions | Generates Operating Instructions button 131 |
| 241B | input | Generates panel_input 453 |
| 241C | parametric_analysis | Generates panel_parametric 455, diode analysis and duty cycle analysis lists 461, Reset Diode button 143, and Reset Duty Cycle button 141 |
| 241D | frequency | Generates panel_f 455 and edit_f 457 |
| 241E | diode_input | Generates panel_diode 455 |
| 241F | diode_spice | Generates panel_spice 455 |
| 241G | diode_library_load | Generates menu_library 459 |
| 241H | series_resistance | Generates edit_rs 457 |
| 241I | barrier_voltage | Generates edit_vbi 457 |
| 241J | reverse_bias_voltage | Generates edit_vbr 457 |
| 241K | junction_capacitance | Generates edit_cjo 457 |
| 241L | diode_library_save | Generates edit_library 459 and Add Diode to Library button 163 |
| 241M | load | Generates panel_rl 455 and edit_rl 457 |
| 241N | duty_cycle | Generates panel_dc 455 and edit_dc 457 |
| 241O | reset_button | Generates Reset All button 169 |
| 241P | output | Generates panel_output 453 |
| 241Q | axes | Generates axes1, axes2, axes3, axes4 463 |
| 241R | analysis_summary | Generates panel_analysis 453, table1, table2, table 3 465, and Export Selected Diode button 191 |

FIG.9B1

| 242. Function Group CPSA_INIT ||  |
|---|---|---|
| # | Name of Functions | Relationship / Function |
| 242A | instructions | Generates Operating Instructions button 197 |
| 242B | input | Generates panel_input 423 |
| 242C | parametric_analysis | Generates panel_parametric 423, parametric analysis lists 431, and Reset All button 169 |
| 242D | dielectric | Generates panel_er 425 and edit_er 427 |
| 242E | gap | Generates panel_s 425 and edit_s 427 |
| 242F | width | Generates panel_w 425 and edit_w 427 |
| 242G | height | Generates panel_h 425 and edit_h 427 |
| 242H | output | Generates panel_output 423 |
| 242I | axes | Generates axes1 and axes2 433 |
| 242J | analysis summary | Generates panel_analysis 423, table1 435, and Export Data button 221 |
| 242K | geometry | Generates panel_geometry 423, and Coplanar strip diagrams (panel_top 429, panel_side 429, panel_electro 429, axes_top 429, axes_side 429, axes_electro 429) |

FIG.9B2

| \multicolumn{3}{c}{243. Function Group WPA_CALLBACK} |
|---|---|---|
| # | Name of Functions | Relationship / Function |
| 243A | list_data | Accepts user input from list_data 411 through step 603 |
| 243B | depvar | Accepts user input from menu_depvar or menu_indepvar 411 through step 607 |
| 243C | reset | Accepts user input from Reset Button 45 through step 613 |
| 243D | edit_f, edit_pd, edit_pt, edit_d, edit_at, edit_ar | Accepts user input from edit boxes 405 through step 611 |
| 243E | radio_at, radio_ar | Accepts user input from transmitter radio buttons 407 or receiver radio buttons 409 through step 611 |
| 243F | library_button | Accepts user input from button_library 415 through step 609 and open Fig. 5 GUI 96, generating WPA Experimental Data Library GUI elements 420A-I |
| 243G | export | Accepts user input from Export Button 87 through step 615 |

FIG.9C1

| 243F. Function libray_button |||
|---|---|---|
| # | Name of Subfunction | Relationship / Function |
| 243F1 | table | Accepts user input from table6 420F during step 609E, and executes WPA_UPDATE 247 through step 605 |
| 243F2 | checkbox_mcspadden | Accepts user input from checkbox_mcspadden 420B during step 609E and executes WPA_UPDATE 247 through step 605 |
| 243F3 | checkbox_koert | Accepts user input from checkbox_koert 420C during step 609E and executes WPA_UPDATE 247 through step 605 |
| 243F4 | checkbox_custom | Accepts user input from checkbox_custom 420D during step 609E and executes WPA_UPDATE 247 through step 605 |
| 243F5 | clear_table | Accepts user input from Clear Table button 115 during step 609F to clear values of table6 420F |
| 243F6 | library_name | Accepts user input from library_name 420H during step 609E and executes WPA_UPDATE 247 through step 605 |
| 243F7 | button_library | Accepts user input from Add to Library button 113 during step 609D to save values of table6 420F and library_name 420H to WPES MSAV Library 12A |
| 243F8 | menu_library | Accepts user input from menu_library 420G during step 609C |
| 243F9 | checkbox_custom_f | Accepts user input from checkbox_lib_f 420I during step 609E and executes WPA_UPDATE 247 through step 605 |

FIG.9C2

| 245. Function Group DA_CALLBACK | | |
|---|---|---|
| # | Name of Functions | Relationship / Function |
| 245A | list_data_diode | Accepts user input from list_data_diode 461 through step 633 |
| 245B | reset_diode | Accepts user input from Reset Diode button 143 through step 637 |
| 245C | reset_duty_cycle | Accepts user input from Reset Duty Cycle button 141 through step 643 |
| 245D | edit_f, edit_rs, edit_vbi, edit_vbr, edit_cjo | Accepts user input from edit boxes 457 through step 641 |
| 245E | menu_library | Accepts user input from menu_library 459 through step 639 |
| 245F | button_diode_add | Accepts user input from Add Diode to Library 163 through step 644 |
| 245G | edit_rl | Accepts user input from edit_rl 457 through step 641 |
| 245H | reset_all | Accepts user input from Reset All button 169 through step 645 |
| 245I | diode_export | Accepts user input from Export Selected Diode button 191 through step 646 |

| 246. Function Group CPSA_CALLBACK | | |
|---|---|---|
| # | Name of Functions | Relationship / Function |
| 246A | list_data | Accepts user input from list_data 431 through step 663 |
| 246B | indepvar | Accepts user input from menu_indepvar 431 through step 667 |
| 246C | reset | Accepts user input from Reset All button 207 through step 671 |
| 246D | edit_er, edit_s, edit_w, edit_h | Accepts user input from edit boxes 427 through step 669 |
| 246E | export | Accepts user input from Export Data button 221 through step 673 |

FIG. 9D

| 247. Function Group WPA_UPDATE | | |
|---|---|---|
| # | Name of Functions | Relationship / Function |
| 247A | update | Executes step 605A by calling function 247B, executes step 605B, executes functions 247C-H during steps 605C-F, then fills in table1 417 entries during step 605F |
| 247B | calculate_dependent | Executes step 605A which calculates the dependent variable 43 and fills in its corresponding edit box 405 |
| 247C | check_bounds | Executes step 605C which checks the power density boundaries, then displays text_warn 419 and highlights corresponding list_data entry 411 if step 605D is executed |
| 247D | plot_axes1 | Executes step 605F to plot axes1 413 |
| 247E | plot_axes2 | Executes step 605F to plot axes2 413 |
| 247F | plot_axes3 | Executes step 605F to plot axes3 413 |
| 247G | plot_axes4 | Executes step 605F to plot axes4 413 |
| 247H | plot_axes5 | Executes step 605F to plot axes5 413 |

| 249. Function Group DA_UPDATE | | |
|---|---|---|
| # | Name of Functions | Relationship / Function |
| 249A | update | Executes step 635A and fills in table1 465 entries, then executes functions 249B, 249C, 249D, and 249E during steps 635B-E |
| 249B | plot_axes1 | Executes step 635B to plot axes1 463 and fill in table2 465 entries |
| 249C | plot_axes2 | Executes step 635C to plot axes2 463 |
| 249D | plot_axes3 | Executes step 635D to plot axes3 463 and fill in table3 465 entries |
| 249E | plot_axes4 | Executes step 635E to plot axes4 463 |

| 250. Function Group CPSA_UPDATE | | |
|---|---|---|
| | Name of Functions | Relationship / Function |
| 250A | update | Executes step 665A and executes functions 250B, 250C during step 655B and 655C, then fills in table1 435 entries |
| 250B | plot_axes1 | Executes step 665B to plot axes1 433 |
| 250C | plot_axes2 | Executes step 665C to plot axes2 433 |

FIG.9E

| Wireless Power Analysis Variables | | |
|---|---|---|
| # | Name of Variables | Relationship / Function |
| 301 | ndata | Sets the maximum number of data points 303 |
| 303 | n | Tracks the currently – selected data point to replace/store the correct input variable 305, tau 313, efficiencies 315, pdc 317 |
| 305 | f, pd, pt, d, at, ar | Stores values for frequency, power density, transmitted power, separation distance, calculated transmitter aperture area, and calculated receiver aperture area during step 611 for use in equation 501 to calculate the dependent variable 43 as determined by depend_var_flag 335 during step 605A or calculated using equation 501 during step 605A |
| 307 | at_radio, at_sub1, at_sub2, at_sub3 | Stores values for either transmitter diameter (at_sub1) or transmitter length and width (at_sub2, at_sub3) depending on user selection of circular or rectangular transmitter (at_radio) for use in calculating transmitter aperture area (at) 305 using known equations for area |
| 309 | ar_radio, ar_sub1, ar_sub2, ar_sub3 | Stores values for either receiver diameter (ar_sub1) or receiver length and width (ar_sub2, ar_sub3) depending on user selection of circular or rectangular receiver (ar_radio) for use in calculating receiver aperture area (ar) 305 using known equations for area |
| 311 | dmin | Minimum feasible separation distance calculated by equation 513 |
| 313 | tau | Calculated in equation 507 for use in calculating collection efficiency nu1 315 in equation 509 |
| 315 | nu1, nu2 | Rectenna efficiency and collection efficiency calculated in equations 509, 505 (respectively) for use in calculating output DC power pdc 317 in equation 511 |
| 317 | pdc | Output DC power calculated by equation 511 |
| 319 | valid_data_point | Tracks the data points n 303 that do not violate the inequality in equation 504 |
| 321 | data_point_flag | Tracks which data points n 303 have been selected for viewing |
| 323 | custom_library_name | User-specified name of user-entered Power density and Rectenna conversion efficiency values 325 loaded to/from WPES MSAV Library 12A during step 609 |

FIG.10A1

| 325 | custom_library _data | Power density and Rectenna conversion efficiency (User-entered) loaded to/from WPES MSAV Library 12A during step 609 |
|---|---|---|
| 327 | checkbrown checkmcspadden checkkoert checkcustom checkcustomfreq | Boolean values altered during step 609E that determine which Power density and Rectenna conversion efficiency values (329, 331, 333, 325) are displayed on the WPA GUI 30 and whether custom_library_data 325 or pd_Brown 329 is used for pd_lib in equation 504 |
| 329 | pd_Brown Eta_Brown | Power density and Rectenna conversion efficiency (Brown) loaded from WPES MSAV Library 12A and plotted during step 605E |
| 331 | pd_McSpadden Eta_McSpadden | Power density and Rectenna conversion efficiency (McSpadden) loaded from WPES MSAV Library 12A and plotted during step 605E |
| 333 | pd_Koert Eta_Koert | Power density and Rectenna conversion efficiency (Koert) loaded from WPES MSAV Library 12A and plotted during step 605E |
| 335 | depend_var_flag independ_var_flag | Determines which input variables 305 are selected as independent variables or dependent variables; selected during step 607 |
| 337 | pd_scaled Eta_scaled | Power density and Rectenna conversion efficiency values calculated in equation 503 during step 605B for use in equation 504, 505 |

FIG.10A2

| Coplanar Stripline Analysis Variables |||
|---|---|---|
| # | Name of Variable | Relationship / Function |
| 339 | ndata | Sets the maximum number of data points 341 |
| 341 | n | Tracks the currently – selected data point to replace/store the correct input variable 343, characteristic impedance (Zc1, Zc2) 345, effective permativities (Eps_eff1, Eps_eff2) 347 |
| 343 | er, s, w, h | Stores values dielectric constant, gap distance, width, and height for use in equations 515, 519, 523, 529, and 533 to calculate effective permittivity 347 |
| 345 | Zc1, Zc2 | Characteristic impedance calculated in equations 531 and 535 |
| 347 | Eps_eff1, Eps_eff2 | Effective permittivity calculated in equations 529 and 533 |
| 349 | data_point_flag | Tracks which data points n 341 have been selected for viewing |
| 351 | independ_var_flag | Determines which input variables 343 are selected as independent variables |

Simplified Coplanar Stripline Analysis Variables Data Structure

FIG.10B1

| Diode Analysis Variables |||
|---|---|---|
| # | Name of Variable | Relationship / Function |
| 361 | ndata_diode, ndata_dutycycle | Sets the maximum number of data points 366 |
| 366 | n_diode, n_dutycycle | n_diode tracks the currently-selected diode data point to replace/store the correct input variables ( Frequency, Series Resistance, Built-in Barrier Voltage, Reverse Bias Voltage, Zero Bias Junction Capacitance, and Load Resistance 369)<br><br>n_dutycycle tracks the currently-selected duty cycle data point to replace/store the correct input variable (duty cycle 370) |
| 369 | f, rs, vbi, vbr, cjo, rl | Frequency, Series Resistance, Built-in Barrier Voltage, Reverse Bias Voltage, Zero Bias Junction Capacitance, and Load Resistance for use in equations 537 through 553 and 559 |
| 370 | duty_cycle | Percentage of time that diode is active within one cycle (e.g., when RF signals impinging a rectenna are active and thereby inducing power that is transferred into a diode). |
| 371 | Zd | Diode Input Impedance calculated using equation 547 |
| 373 | pdcmax | Maximum DC output power calculated using equation 557 |
| 375 | diode_name | User-specified name of user-entered Diode SPICE parameters rs, vbi, vbr, cjo 369 loaded to/from WPES MSAV Library 12B during steps 639 or 646 |

Simplified Diode Analysis Variables Data Structure

FIG.10B2

| Wireless Power Analysis UIObject Variables ||| 
|---|---|---|
| # | Name of UIObject | Relationship / Function |
| 391 | tab_wpa | Wireless Power Analysis tab 31 generated from function uitab (see MATLAB® "uitab" documentation) during wireless_power_gui 237 |
| 401 | panel_input, panel_output, panel_analysis | Input Variables panel 35, Output Variables panel 63, and Analysis Summary panel 83 generated from function uipanel (see MATLAB® "uipanel" documentation) during WPA_INIT 239 |
| 403 | panel_parametric panel_f, panel_pd panel_pt, panel_d panel_at, panel_ar | Parametric Analysis panel 37, frequency panel 47, power density panel 49, transmitted power panel 51, separation distance panel 53, transmitter aperture area panel 55, receiver aperture area panel 59 generated from function uipanel (see MATLAB® "uipanel" documentation) during WPA_INIT 239 |
| 405 | edit_f, edit_pd edit_pt, edit_d edit_at1, edit_ar1 edit_at2, edit_ar2 edit_at3, edit_ar3 | Frequency edit box 47, power density edit box 49, transmitted power edit box 51, separation distance edit box 53, transmitter aperture area edit boxes 55, receiver aperture area edit boxes 59 generated from function uicontrol (see MATLAB® "uicontrol" documentation) during WPA_INIT 239 that each trigger WPA_CALLBACK 243D when edited by user and is updated by WPA_UPDATE 247B |
| 407 | bgroup_at radio_at1 radio_at2 | Transmitter aperture area button group and radio buttons 57 generated from functions uibuttongroup and uicontrol (see MATLAB® "uibuttongroup" and "uicontrol" documentation) during WPA_INIT 239 that triggers WPA_CALLBACK 243E when edited by user |
| 409 | bgroup_ar radio_ar1 radio_ar2 | Receiver aperture area button group and radio buttons 61 generated from functions uibuttongroup and uicontrol (see MATLAB® "uibuttongroup" and "uicontrol" documentation) during WPA_INIT 239 that triggers WPA_CALLBACK 243E when edited by user |
| 411 | list_data menu_indepvar menu_depvar | Data Point selection list 39, independent variable selection drop-down menu 41, and dependent variable selection drop-down menu 43 generated from function uicontrol (see MATLAB® "uicontrol" documentation) during WPA_INIT 239 that triggers WPA_CALLBACK 243A or 243B when edited by user and updated during WPA_UPDATE 247C |

FIG. 11A1

| 413 | axes1, axes2 axes3, axes4 axes5 | Rectenna RF-to-DC Conversion Efficiency graph 67, Collection Efficiency graph 73, Visual Representation of Apertures graph 77, DC Power Output graph 89, and Atmospheric Efficiency graph 81 generated from function axes (see MATLAB® "axes" documentation) during WPA_INIT 239 and updated during WPA_UPDATE 247D-H |
|---|---|---|
| 415 | button_library | Open Library button 65 generated from function uicontrol (see MATLAB® "uicontrol" documentation) during WPA_INIT 239 that triggers WPA_CALLBACK 243F when edited by user |
| 417 | table1 | Analysis Summary table 83 generated from function uitable (see MATLAB® "uitable" documentation) during WPA_INIT 239 and updated during WPA_UPDATE 247A |
| 419 | text_warn | Boundary Warning Text 85 generated from function uicontrol (see MATLAB® "uicontrol" documentation) during WPA_INIT 239 and updated during WPA_UPDATE 247C |

FIG. 11A2

| # | Name of UIObject | Relationship / Function |
|---|---|---|
| \multicolumn{3}{l|}{420. Wireless Power Analysis (Experimental Data Library) UIObject Variables} |
| 420A | checkbox_brown | Brown Checkbox 101 generated from function uicontrol (see MATLAB® "uicontrol" documentation) during library_button 243F |
| 420B | checkbox_mcspadden | McSpadden Checkbox 101 generated from function uicontrol (see MATLAB® "uicontrol" documentation) during library_button 243F that triggers checkbox_mcspadden 243F2 when edited by user |
| 420C | checkbox_koert | Koert Checkbox 101 generated from function uicontrol (see MATLAB® "uicontrol" documentation) during library_button 243F that triggers checkbox_koert 243F3 when edited by user |
| 420D | checkbox_custom | User Measured Checkbox 105 generated from function uicontrol (see MATLAB® "uicontrol" documentation) during library_button 243F that triggers checkbox_custom 243F4 when edited by user |
| 420E | table5 | Experimental Data Table 99 generated from function uitable (see MATLAB® "uitable" documentation) during library_button 243F |
| 420F | table6 | User Measured Data Table 106 generated from function uitable (see MATLAB® "uitable" documentation) during library_button 243F that triggers table 243F1 when edited by user |
| 420G | menu_library | Input from Library drop-down menu 109 generated from function uicontrol (see MATLAB® "uicontrol" documentation) during library_button 243F that triggers menu_library 243F8 when edited by user |
| 420H | library_name | Library Name edit box 111 generated from function uicontrol (see MATLAB® "uicontrol" documentation) during library_button 243F that triggers library_name 243F6 when edited by user |
| 420I | checkbox_lib_f | Track Measured Data Checkbox 117 generated from function uicontrol (see MATLAB® "uicontrol" documentation) during library_button 243F that triggers checkbox_custom_f243F9 when edited by user |

FIG. 11B

| | | Coplanar Stripline Analysis UIObject Variables |
|---|---|---|
| # | Name of UIObject | Relationship / Function |
| 421 | tab_cpsa | Coplanar Stripline Analysis tab 195 generated from function uitab (see MATLAB® "uitab" documentation) during wireless_power_gui 237 |
| 423 | panel_input<br>panel_output<br>panel_analysis<br>panel_geometry | Input Variables panel 199, Output Variables panel 217, Analysis Summary panel 219, and Coplanar Stripline Geometry panel 229 generated from function uipanel (see MATLAB® "uipanel" documentation) during CPSA_INIT 242 |
| 425 | panel_parametric<br>panel_er, panel_s<br>panel_w, panel_h | Parametric Analysis panel 201, dielectric constant panel 209, gap panel 211, width panel 213, and height panel 215 generated from function uipanel (see MATLAB® "uipanel" documentation) during CPSA_INIT 242 |
| 427 | edit_er<br>edit_s<br>edit_w<br>edit_h | Dielectric constant edit box 209, gap edit box 211, width edit box 213, and height edit box 215 generated from function uicontrol (see MATLAB® "uicontrol" documentation) during CPSA_INIT 242 that triggers CPSA_CALLBACK 246D when edited by user |
| 429 | panel_top<br>axes_top<br>panel_side<br>axes_side<br>panel_electro<br>axes_electro | Top View panel and axes 231, Side View panel and axes 233, and Field View panel and axes 235 generated from function uipanel and axes (see MATLAB® "uipanel" and "axes" documentation) during CPSA_INIT 242 |
| 431 | list_data<br>menu_indepvar | Data Point selection list 203 and independent variable selection drop-down menu 205 generated from function uicontrol (see MATLAB® "uicontrol" documentation) during CPSA_INIT 242 that triggers CPSA_CALLBACK 246A, 246B when edited by user |
| 433 | axes1<br>axes2 | Characteristic Impedance graph 223 and Effective Permittivity graph 227 generated from function axes (see MATLAB® "axes" documentation) during CPSA_INIT 242 and is updated by CPSA_UPDATE 250B, 250C |
| 435 | table1 | Analysis Summary table 219 generated from function uitable (see MATLAB® "uitable" documentation) during CPSA_INIT 242 and is updated by CPSA_UPDATE 250A |

FIG.11C

| | | Diode Analysis UIObject Variables |
|---|---|---|
| # | Name of UIObject | Relationship / Function |
| 451 | tab_da | Diode Analysis tab 129 generated from function uitab (see MATLAB® "uitab" documentation) during wireless_power_gui 237 |
| 453 | panel_input<br>panel_output<br>panel_analysis | Input Variables panel 133, Output Variables panel 171, and Analysis Summary panel 183 generated from function uipanel (see MATLAB® "uipanel" documentation) during DA_INIT 241 |
| 455 | panel_parametric<br>panel_f<br>panel_diode<br>panel_spice<br>panel_rl<br>panel_dc | Parametric Analysis panel 135, frequency panel 145, diode inputs panel 147, SPICE parameters panel 149, load resistance panel 165, and duty cycle panel 167 generated from function uipanel (see MATLAB® "uipanel" documentation) during DA_INIT 241 |
| 457 | edit_f<br>edit_rs<br>edit_vbi<br>edit_vbr<br>edit_cjo<br>edit_rl<br>edit_dc | Frequency edit box 145, series resistance edit box 153, built-in barrier voltage edit box 155, reverse bias voltage edit box 157, zero-bias junction capacitance edit box 159, load resistance edit box 165, and duty cycle edit box 167 generated from function uicontrol (see MATLAB® "uicontrol" documentation) during DA_INIT 241 that triggers DA_CALLBACK 245D or 245G when edited by user |
| 459 | menu_library<br>edit_library | Select Diode From Library drop-down menu 151 and Diode Name edit box 161 generated from function uicontrol (see MATLAB® "uicontrol" documentation) during DA_INIT 241 that triggers DA_CALLBACK 245E when edited by user |
| 461 | list_data_diode<br>list_data_dutycycle | Diode data Point selection list 139 and duty cycle Data Point selection list 137 generated from function uicontrol (see MATLAB® "uicontrol" documentation) during DA_INIT 241 that triggers DA_CALLBACK 245A, when edited by user |
| 463 | axes1<br>axes2<br>axes3<br>axes4 | Load Resistance vs Calculated Diode Impedance graph 175, Diode Voltage vs Calculated Diode Impedance graph 179, Calculated RF -to-DC Conversion Efficiency (Continuous Wave) graph 181, and Calculated RF-to-DC Conversion Efficiency (Variable Duty Cycle) graph 193 generated from function axes (see MATLAB= =axes> documentation) during DA_INIT 241 and is updated by DA_UPDATE 249B-E |
| 465 | table1<br>table2<br>table3 | Diode SPICE parameters and max output DC power graph 185, Electrical characteristics of diode graph 187, and Power and Voltage graph 189 generated from function uitable (see MATLAB® "uitable" documentation) during DA_INIT 241 and is updated by DA_UPDATE 249A,B,D |

FIG.11D

| Wireless Power Analysis Equations |||
|---|---|---|
| # | Equation | Relationship / Function |
| 501 | $$p_d = \frac{A_t P_t f^2}{c^2 d^2}$$ | Calculates the dependent variable as specified by depend_var_flag 335 using the other Input Variables 305 (power density $>$ ,Transmitter aperture area A , power transmitted = ,frequency =, separation distance ?) and the speed of light constant @during step 605A |
| 503 | $$p_{d,scaled} = \begin{cases} \left(\frac{f}{f_{Brown}}\right)^2 p_{d,Brown} \\ p_{d,Custom} \end{cases}$$ $$\eta_{2,scaled} = \begin{cases} \eta_{2,Brown} \\ \eta_{2,Custom} \end{cases}$$ | Sets the power density and conversion efficiency values 337 used in equations 504, 505 during step 605B if checkcustfreq 327 is not selected (top) using frequency = 305 and the frequency, power density, and conversion efficiency of Brown 329; or if checkcustfreq 327 is selected (bottom) using custom_library_data 325 |
| 504 | $$\min(p_{d,scaled}) \leq p_d \leq \max(p_{d,scaled})$$ | Calculates the min/max feasible boundary for power density during step 605B using $>$ 337 from equation 503, then checks to see if values for power density 305 is within the calculated boundaries during step 605C. |
| 505 | $$\eta_2 = \text{interp}(p_{d,scaled}, \eta_{2,scaled}, p_d)$$ | Uses the interpolate function (see MATLAB® "interp2" documentation) to interpolate the values of $>$ 305 between the collection of points ($>$ $\eta_2$ ) 337 calculated in equation 503, during step 605F |
| 507 | $$\tau = \frac{f\sqrt{A_t A_r}}{cd}$$ | Calculates $\tau$ used in equation 509 using Input Variables 305 (Transmitter aperture area A ,Receiver aperture area A ,frequency =,separation distance ?) and the speed of light constant @during step 605F |
| 509 | $$\eta_1 = 1 - e^{-\tau}$$ | Calculates a collection efficiency $\eta_1$ 315 using $\tau$ from equation 507 during step 605F |
| 511 | $$P_{DC} = P_t \eta_1 \eta_2 \eta_3$$ | Calculates the output DC power 317 using power transmitted = 305, collection efficiency $\eta_1$ 315, rectenna RF-to-DC conversion efficiency $\eta_2$ 315, and atmospheric efficiency $\eta_3$ 315 during step 605F |
| 513 | $$d_{min} = \sqrt{\frac{A_t P_t f^2}{c^2 p_{d,max}}}$$ | Calculates the minimum feasible separation distance ? 311 using Input Variables 305 (frequency =, power transmitted = , Transmitter aperture area A ), the maximum feasible power density from WPES MSAV Experimental Rectenna Performance Library Data 12A, and the speed of light constant @ during step 605F |

FIG. 12A

| Coplanar Stripline Analysis Equations ||| 
|---|---|---|
| # | Equation | Relationship / Function |
| 515 | $k = \dfrac{a}{b} = \dfrac{S}{S+2W}$ | Calculate a value k for use in equation 517 where S 343 is the gap distance between selected coplanar striplines and W 343 is the width of selected coplanar striplines |
| 517 | $k' = \sqrt{1-k^2}$ | Calculate a value k' using the value k, from equation 515, for use in equation 519 |
| 519 | $k_1 = \sinh(\pi a/2h)/\sinh(\pi b/2h)$ | Calculate a value $k_1$', for use in equation 521 where values a and b come from equation 515 and a value h 343 is the height of the substrate of the selected coplanar strips 4B1, 4B2 |
| 521 | $k_1' = \sqrt{1-k_1^2}$ | Calculate a value $k_1$', for use in equation 523, using the value $k_1$ from equation 519 |
| 523 | $k_{10} = \tanh\left(\dfrac{\pi a}{4h}\right)/\tanh\left(\dfrac{\pi b}{4h}\right)$ | Calculate a value $k_{10}$, for use in equation 525, using the values a and b from equation 515 and the value h 343 |
| 525 | $k_{10}' = \sqrt{1-k_{10}^2}$ | Calculate a value $k_{10}$', for use in equation 527, using the value $k_{10}$ from equation 523 |
| 527 | $\dfrac{K(k)}{K'(k)} = \dfrac{\pi}{\ln[2(1+\sqrt{k'})/(1-\sqrt{k'})]}$ | Calculate a function $\dfrac{A(B)}{A'(B)}$ for use in equations 529, 531, 533, and 535, that uses one of the values k, $k_1$, or $k_{10}$ with each respective prime value k', $k_1$', or $k_{10}$' corresponding to the chosen value |
| 529 | $\varepsilon_{eff,1} = 1 + \dfrac{\varepsilon_r - 1}{2}\dfrac{K(k')K(k_1)}{K(k)K(k_1')}$ | Formula to calculate effective permittivity 347 of a selected coplanar strip using the formula from equation 527 and the dielectric constant er 343 |
| 531 | $Z_{c,1} = \dfrac{120\pi}{\sqrt{\varepsilon_{eff}}}\dfrac{K(k)}{K(k')}$ | Formula to calculate characteristic impedance 345 of selected coplanar strips 4B1, 4B2 using the formula from equation 527 and the effective permittivity 347 of the selected coplanar strip 4B1, 4B2 |
| 533 | $\varepsilon_{eff,2} = 1 + \dfrac{\varepsilon_r - 1}{2}\dfrac{K'(k_{10})K(k_1)}{K(k_{10})K'(k_1)}$ | Alternative formula to calculate effective permittivity 347 of a selected coplanar strips 4B1, 4B2 using the formula from equation 527 and the dielectric constant 343 |
| 535 | $Z_{c,2} = \dfrac{120\pi}{\sqrt{\varepsilon_{eff}}}\dfrac{K(k_1)}{K'(k_1)}$ | Alternative formula to calculate characteristic impedance 345 of selected coplanar strips 4B1, 4B2 using the formula from equation 527 and the effective permittivity 529 of the selected coplanar strips 4B1, 4B2 |

FIG. 12B

| Diode Analysis Equations | | |
|---|---|---|
| # | Equation | Relationship / Function |
| 537 | $P_{DC,max} = \dfrac{V_{br}^2}{4R_L}$ | Calculate maximum DC power 373 using reverse bias voltage (vbr) 369 and load resistance (rl) 369 during step 635A |
| 539 | $V_o = \dfrac{V_{br}}{2}$ | Calculate output self-bias DC voltage across the load during step 635A for use in equation 543 and 545 during step 635C |
| 541 | $\omega = 2\pi f$ | Calculates Angular frequency during step 635A for use in equation 547 |
| 543 | $\tan\theta_{on} - \theta_{on} = \dfrac{\pi R_s}{R_L\left(1 + \dfrac{V_{bi}}{V_o}\right)}$ | Determine Forward Bias Turn-On Angle $\Theta_{on}$ for use in equations 547, 549-553 using 539 and variable rl during step 635B, and variable and user-input rl during step 635C and 635D |
| 545 | $C_j = C_{jo}\sqrt{\dfrac{V_{bi}}{V_{bi} + |V_x|}}$ | Calculate Nonlinear Junction Capacitance for use in equations 547, 551 using 539 and variable rl during step 635B, and variable and user-input rl during steps 635C and 635D |
| 547 | $Z_d = \dfrac{\pi R_s}{\cos\theta_{on}\left(\dfrac{\theta_{on}}{\cos\theta_{on}} - \sin\theta_{on}\right) + j\omega R_s C_j\left(\dfrac{\pi - \theta_{on}}{\cos\theta_{on}} + \sin\theta_{on}\right)}$ | Diode Input Impedance calculated and plotted during steps 635B, 635C, and 635D using step-specific instructions described in equations 543 and 545 |
| 549 | $A = \dfrac{R_L}{\pi R_s}\left(1 + \dfrac{V_{bi}}{V_o}\right)^2\left[\theta_{on}\left(1 + \dfrac{1}{2\cos^2\theta_{on}}\right) - \dfrac{3}{2}\tan\theta_{on}\right]$ | Calculated during step 635D for use in calculating $\eta$ |
| 551 | $B = \dfrac{R_s R_L C_j^2 \omega^2}{2\pi}\left(1 + \dfrac{V_{bi}}{V_o}\right)\left(\dfrac{\pi - \theta_{on}}{\cos^2\theta_{on}} + \tan\theta_{on}\right)$ | Calculated during step 635D for use in calculating $\eta$ |
| 553 | $C = \dfrac{R_L}{\pi R_s}\left(1 + \dfrac{V_{bi}}{V_o}\right)\dfrac{V_{bi}}{V_o}(\tan\theta_{on} - \theta_{on})$ | Calculated during step 635D for use in calculating $\eta$ |
| 555 | $\eta_d = \dfrac{1}{A + B + C}$ | Calculates the Diode RF-to-DC conversion efficiency using equations 549-554 during step 635D |
| 556 | $P_{in} = \dfrac{V_o^2}{R_L}$ | Calculates the input power for use in equation 557 using variable and user-input rl during step 635D |
| 557 | $P_{out} = P_{in}\eta_d$ | Determines the Power output from selected diode using the results from equations 555 and 556 during step 635D |
| 559 | $V_{out} = \sqrt{P_{out} R_L}$ | Calculates the Voltage output from selected diode using equations 557 and user-specified rl during step 635D |

FIG.12C

Detail View of Step 635: DA_UPDATE

Continued from Step 633 or 637–647

↓

Step 635A: Calculates pdcmax 373, ((output self-bias DC voltage, and angular frequency)) if the necessary Input Variables 369 are defined using function update 249A, then fills in the Diode SPICE Parameters and Max Output DC Power table using Input Variables 369, pdcmax 373, and diode_name 375

↓

Step 635B: Plot Diode Input Impedance 371 vs variable rl 369 if the necessary Input Variables 369 are defined, then fill in the Electrical Characteristics of Diode table using the variable rl 369 and Diode Input Impedance 371 using plot_axes1 249B; else skip this step

↓

Step 635C: Plot Diode Input Impedance 371 vs user-defined rl 369 if the necessary Input Variables 369 are defined and plot the red line 173 as defined by rl 369, using plot_axes2 249C; else skip this step

↓

Step 635D: Plot Input Power calculated using equation 556 vs Conversion Efficiency from equation 555 using plot_axes3 249D, then fill in the Power and Voltage table using these same values, output voltage from equation 559, and output power from equation 557 if the required variables are defined; else skip this step

↓

Step 635E: Run function 249E

↓

Continued at Step 632

FIG.18

Step 817: Open WPES MSAV Software 13 and open Coplanar Stripline Analysis tab 195. Designate and select independent variable form variable dropdown list 205 (e.g. dielectric constant 209, gap 211, width 213, height 215) and enter known values from design question from Step 815

Step 821: Select a new data point from Data Point list 203 and enter another candidate value for independent variable 199 and calculate and display results in Gap vs Characteristic Impedance graph 223, Gap vs Effective Permittivity graph 227, and Analysis Summary results table 219

Continued at Fig. 26B

DYNAMIC WIRELESS POWER/ENERGY TRANSFER SYSTEM APPARATUS INCLUDING MODELING AND SIMULATION (M AND S), ANALYSIS, AND VISUALIZATION (MSAV) SYSTEMS ALONG WITH RELATED METHODS

CROSS-REFERENCE TO RELATED APPLICATION

This application is a Non Provisional application which claims priority to U.S. Provisional Patent Application Ser. No. 62/511,524, filed on May 26, 2017, entitled WIRELESS POWER/ENERGY ANALYSIS TOOL WITH INTERFACE, the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,439) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to systems and methods to improve analytic tools used in contexts such as wireless power and energy system or scenario analysis, systems for reducing a variety of errors in collaborative or distributed research activities, systems useable to enable enterprise standardizing procedures across multiple design locations and teams, and enabling human-machine interface based cognition associated with such power and energy analysis which improves or creates rapid insights into a variety of power and energy scenarios. In addition, present invention includes a dynamic library that has the ability to save and apply user-generated data. Exemplary systems can include dynamic wireless power/energy transfer system apparatus MSAV systems enabling rapid and improved understanding of effects of performance and design relationships on operational scenario suitability, design reliability, and design functions including input systems, user interfaces, computation systems, libraries, analysis, reconfigurable graph systems, design constraint violation warnings enabling dynamic changing, comparison, viewing, and comprehension of multiple performance and design relationships along with related methods of use within design and manufacturing tasks.

When doing MSAV analysis and design effort, a variety of problem have been encountered which have led to significant rework, uncertainty as to whether or not a given design will or will not operate in a given environment and design element combination, and miscommunication or confusion when evaluating designs created by different design teams which are using different design methodologies or varying ways to compute different performance or efficiency predictions for a given design/environment combination. A result of these problems includes creation of unworkable designs that suffer from a range of engineering or system integration failures ranging from inoperability in a given set of operational conditions to burn out or component failure. A variety of reasons for these failures have been identified including design methodologies and systems that do not enable designers or engineers to effectively balance a significant number of performance, design, operational need, component limitations within a system, and constraints in a way that support cognitive function and understanding on the part of designers and users. For example, a designer can create a system which violates a design boundary constraint arising from a particular combination of design variables and constraints (including environmental or mission related) without realizing they have done so. Moreover designers can be overwhelmed with too many potential choices without understanding which one of a particular combination of design choices will be more effective in a given set of operational, component performance/limitations, and design environment. There is also a lack of a system which creates visualizations which are useful as an aid for imposing bounds on their design to inform design choices to constrain possibilities to what is possible. For example, a designer might come up with a functional system that may suffer from too much or too little power due to a lack of understanding of how that system will function or be employed by a user in a given set of conditions.

Therefore, a need exists to provide a set of solution to these problems which includes creating a system to enable visual and dynamic correlation of a number of constrained or boundary limited parameters which eliminates the need to create numerous different designs and design performance analysis data which require a designer to flip back and forth between thereby losing critical correlations between design choices and various constraints for a given set of applications, environments, and designs.

Generally, an embodiment of the invention enables visual comparison of different design variations by providing, among other things, a visualization, simulation, and analysis capability. In part, aspects of at least one embodiment provide simulation and visualization outputs through association of efficiency based on both currently measured or previously measured data for one or more design elements (e.g. diode, rectenna performance). Another aspect of at least one embodiment provides a visualization which enables a view of direct current (DC) power into or out of a specified component as a function of different parameters. In at least one embodiment, once an output of a selected rectenna and diode system within independent and dependent variables is known and that selected design does not violate one or more boundary conditions, a designer will then know that the proposed design meets various operational and design constraints then can proceed to follow on design tasks.

According to an illustrative embodiment of the present disclosure, a wireless power/energy system modeling and simulation (M&S), analysis, and visualization system and related methods is provided. Exemplary embodiments include a design element input section adapted to receive user input design specifications including element performance and constraints/limits including design element variables, design build section to enable users to select or include one or more of the design elements create a system of design elements, a variable control section that enables visual locking or fixing of one or more variables to enable modeling or simulation of dependent and independent variables. Exemplary embodiments are used to generate visualizations that aid in understanding parameter influence on and correlations with design vs performance/behavior as well as visualization design parameter selection restrictions or limits that present constrained capacity to change parameters based on real world limitations of selected design components, component relationships, and other design factors to set limits on user options to change parameters. Embodiments also enable failure mode analysis using visually selectable parameter limits alterations and dynamic performance or design limit alteration of other limits based on one or more limit relationships.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 2 shows an exemplary method of designing and manufacturing a wireless power transfer system based on use of an exemplary WPES MSAV system;

FIG. 4) based on measured data user input, where section A shows an output that does not track measured data and section B shows an output that does track measured data;

FIG. 9A1 and 9A2 show tables of exemplary WPES MSAV function groups and an exemplary table of a WPA_INIT function group and their relationship to other variables and steps used by the WPES MSAV system;

FIGS. 9B1 and 9B2 show tables of exemplary DA_INIT and CPSA_INIT function groups and their relationship to other variables and steps used by the WPES MSAV system;

FIGS. 9C1 and 9C2 show tables of exemplary WPA_CALLBACK and library_button function groups and their relationship to other variables and steps used by the WPES MSAV system;

FIG. 9D shows tables of exemplary DA_CALLBACK and CPSA_CALLBACK function groups and their relationship to other variables and steps used by the WPES MSAV system;

FIG. 9E shows tables of exemplary WPA_UPDATE, DA_UPDATE, $CPSA_{13}$ UPDATE function groups and their relationship to other variables and steps used by the WPES MSAV system;

FIGS. 10A1 and 10A2 show an exemplary table of variables to be used by the WPA tool and a brief description of each variable;

FIGS. 10B1 and 10B2 show an exemplary table of variables to be used by the DA tool, the CPSA tool, and a brief description of each variable;

FIGS. 11A1 and 11A2 show an exemplary table of UIObject variables to be used by the WPA tool of the WPES MSAV system and their relationship to the WPA tool GUI;

FIG. 11B shows an exemplary table of UIObject variable to be used by the WPA Interactive User-Input Action and Experimental Data Storage Library GUI of the WPES MSAV system;

FIG. 11C shows an exemplary table of UIObject variables to be used by the CPSA tool of the WPES MSAV system and their relationship to the CPSA tool GUI;

FIG. 11D shows an exemplary table of UIObject variables to be used by the DA tool of the WPES MSAV system and their relationship to the DA tool GUI;

FIG. 12A shows an exemplary tables of equations used by functions in the WPA_UPDATE function group in FIG. 9E, and which use variables from FIGS. 10A1 and 10A2;

FIG. 12B shows an exemplary table of equations used by functions in the CPSA_UPDATE function group of FIG. 9E, and which use variables from FIGS. 10B1 and 10B2;

FIG. 12C shows an exemplary table of equations used by functions in the DA_UPDATE function group of FIG. 9E, and which use variables from FIGS. 10B1 and 10B2;

FIG. 18 shows an exemplary block diagram showing the execution steps of the DA_UPDATE function group (e.g., see FIGS. 9C1 and 9C2);

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1A:
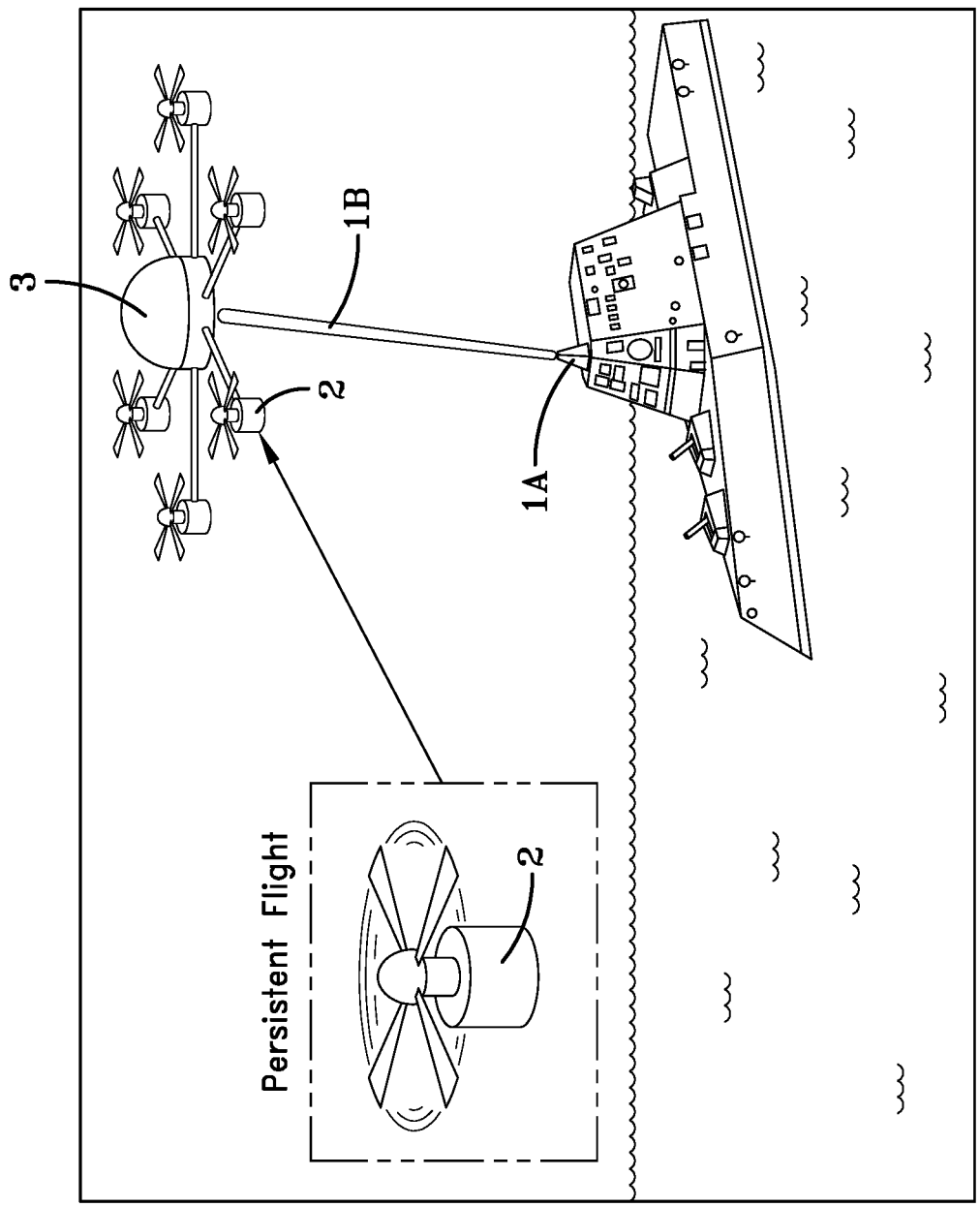
FIG. 1A shows an exemplary operational environment with an airborne platform having a wireless transfer system and a power transfer platform.

Referring initially to FIG. 1A, FIG. 1A shows an exemplary operational environment with simplified wireless transfer system that that includes a power transfer emitter 1A and an exemplary airborne platform 3 mounting a rectenna 2 that receives emitted power 1B (e.g., an RF beam) from the power transfer emitter 1A. The power transfer emitter 1A can be located on various fixed or mobile platforms, including, for example, a ship. Such systems can be used to enable persistent or long duration flight or operation remote from a power supply or fuel system such as a refueling system on board the ship shown in FIG. 1A.

Figure 1B:
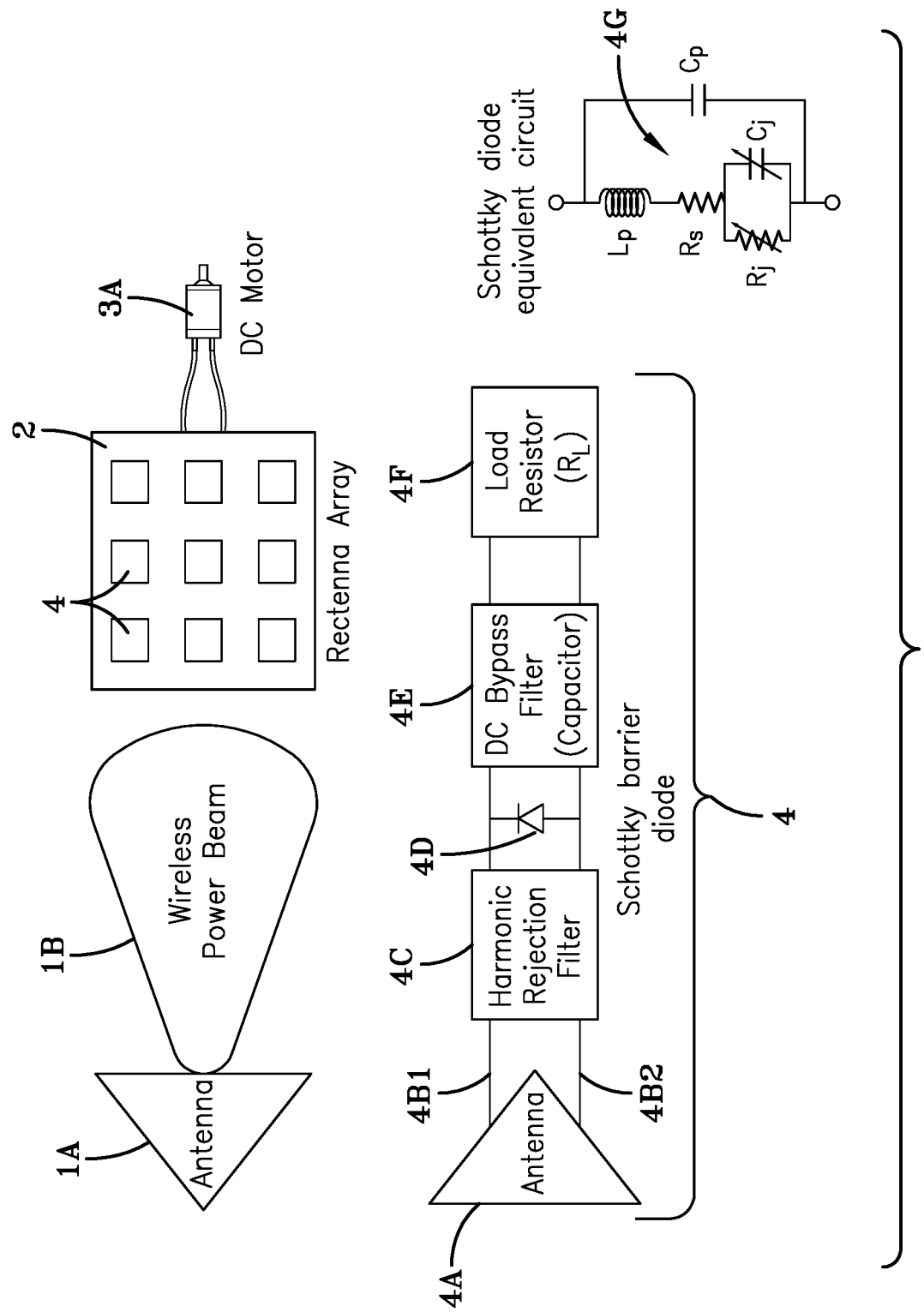
FIG. 1B shows a simplified exemplary block diagram of aspects of a system which is being modelled or simulated by an exemplary embodiment of the Wireless Power/Energy System (WPES) Modeling and Simulation (M&S), Analysis, and Visualization (MSAV) system.
Figure 3:
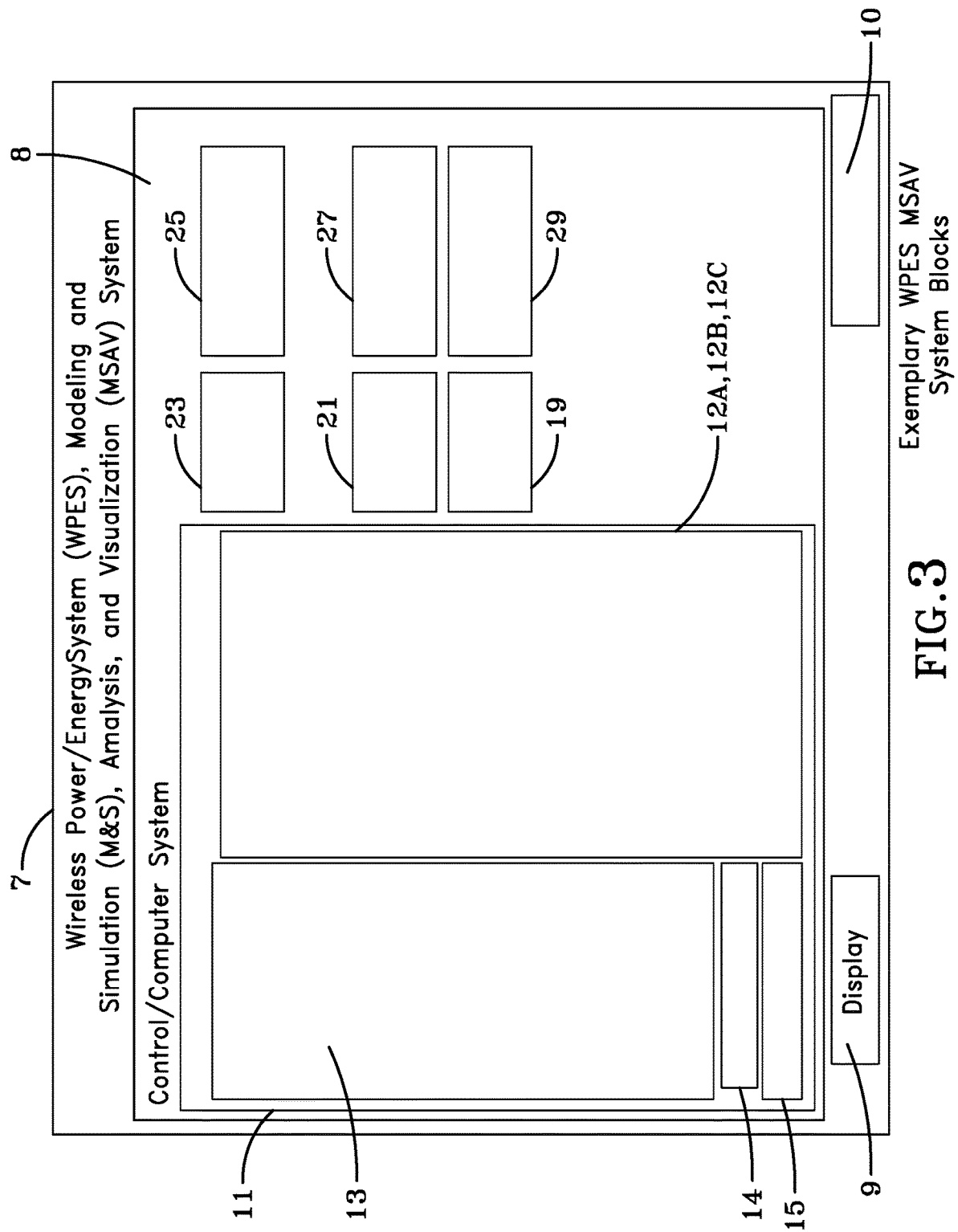
FIG. 3 shows an exemplary simplified functional system block diagram of an exemplary WPES MSAV system.

FIG. 1B shows a simplified exemplary block diagram of aspects of a system which is being modelled or simulated by an exemplary embodiment of an exemplary WPES MSAV system (e.g., see FIG. 3). In this example, the power transfer emitter 1A includes a transmitter antenna 1A that transmits a wireless power beam 1B that is received by the rectenna array 2. The rectenna array 2 includes array elements 4 that converts transmitted wireless power beam 1B into DC current to be used by systems, e.g., a DC motor 3A, installed in the airborne platform 3. In at least one embodiment, the exemplary rectenna array 2 is made up of rectenna elements 4 that include an antenna 4A, a harmonic rejection filter 4C, a diode 4D, which, for example, behaves as a Schottky diode equivalent circuit 4G, a DC bypass filter 4E, a load resistor 4F, as well as two coplanar strips 4B1 and 4B2 that electrically connect these rectenna element components.

FIG. 2 shows an exemplary method of designing and manufacturing a wireless power transfer system based on use of an exemplary WPES MSAV system 7 (See FIG. 3). First, at step 5A a user determines an application scenario that requires the use of the wireless power transfer system. Next at step 5B, the user inputs the design variables corresponding to the chosen application scenario into the WPES MSAV system 7. Next at step 5C the WPES MSAV system 7 generates system outputs (e.g. DC Power Output 89 at, e.g., FIG. 4), allowing the user to utilize these outputs in evaluating design parameter tradeoffs to determine, for example, if a tested design will exceed performance or design component limitation parameters or otherwise will produce the desired wireless power transfer performance based on the requirements and limitations of the application scenario requiring the use of a wireless power transfer system. Finally, at Step 5D the user manufactures the wireless power transfer system based on system outputs from the WPES MSAV system 7 (see FIG. 3) and resulting wireless power transfer system design.

FIG. 3 shows an exemplary simplified functional system block diagram of an exemplary WPES MSAV system 7 can include a control computer system 8, a display 9, and a keyboard/mouse 10. The control computer system 8 can include, for example, a machine instruction storage system 11 (e.g. hard drive), a power supply 23, a processor 25, an I/O system 21, removable storage medium 27, RAM 19, and a network interface card 29. The exemplary machine instruction storage system 11 stores an operating system 14, a WPES MSAV operating manual 15, libraries (e.g., 12A, 12B, and 12C), and the WPES MSAV software 13 which generates, for example, three visualization GUIs for WPA, Coplanar Stripline Analysis (CPSA), and Diode Analysis (DA). Exemplary libraries 12A, 12B, and 12C respectively can include, e.g., a first library that can include, for example, previously measured and user input WPES MSAV Experimental Rectenna Performance library 12A which can include a list of power convention efficiency performance data by design and power density used by WPES MSAV software 13, a second library that can include, for example, diode Simulation Program with Integrated Circuit Emphasis (SPICE) parameters data library 12B, and a third library that can include, for example, exported input/output variables library 12C used and generated by the WPES MSAV software 13. Exemplary WPA GUIs (see e.g. FIG. 4) enables selection, simulation, and visual correlation of WPES system design variables with an analysis summary table 83 and design limitation boundary condition warning flags 85. Exemplary CPSA GUIs (see e.g. FIG. 8) shows performance and design of selected coplanar stripline (CPS) design configuration for a rectenna design which is in turn used by the DA GUI. The DA GUI (see e.g. FIG. 7) provides visualization graphs such as, e.g., Calculated RF-to-DC Conversion Efficiency (Variable Duty Cycles) 193 and Calculated RF-to-DC Conversion Efficiency (Continuous Wave) 181) and an analysis summary table 183 for diode component and CPS design using, for example, programs in FIGS. 9A1-C2 and variables in FIGS. 10A1-B2/11A1-C.

Figure 4:
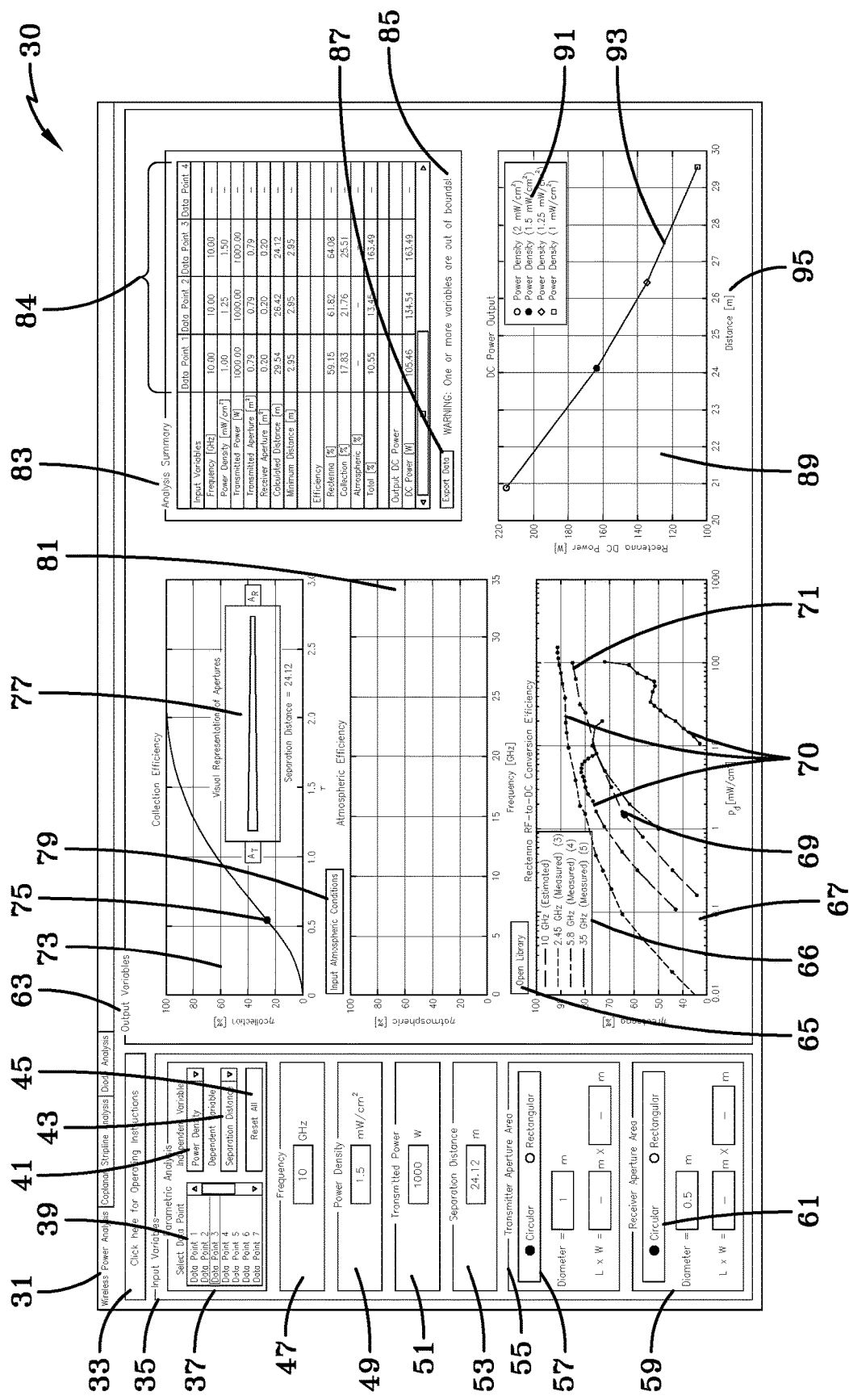
FIG. 4 shows an exemplary embodiment of the Wireless Power Analysis (WPA) tool graphical user interface (GUI) of the WPES MSAV system.

FIG. 4 shows an exemplary embodiment of the WPA tool graphical user interface (GUI) 31 of the WPES MSAV system 7 that can include an input variable (and impliedly constant selections) section 35, an output variable section 63, and a section for accessing the operating instruction by means of an Operating Instructions action button 33. The input variable section 35 includes a Select Data Point list menu portion 39 within a Parametric Analysis panel 37 that enables creation of a wireless power analysis scenario stored in a relational database or scenario data structure based on user selection/definition of multiple data points within the Select Data Point(s) list menu 39 (e.g. scroll up and down to select Data Point 1, Data Point 2, Data Point 3, etc.) that define a group or collection of data points which are then associated with specific parametric data in the Parametric Analysis panel 37 via data input/panel element selections. In at least one embodiment, each data point identifier within the group or collection of data point identifiers (e.g., Data point 1, Data Point 2, Data Point 3, etc) is defined with a common (to all data points associated with a given design scenario) independent variable identifier selection 41, a common (to all data points associated with a given design scenario) dependent variable identifier selection 43, and common constant (potential input variable identifiers listed in the independent and dependent variable drop down menu lists 41, 43 that are not designated as independent or dependent). Data values associated with each constant identifier remain the same for a given design scenario while dependent variable values change for each different independent variable data value. Common independent variable 41 and common dependent variable 43 selections are made from potential variable identifiers comprising frequency 47, power density 49, transmitted power 51, separation distance 53, transmitter aperture area 55, or receiver aperture area 59). However, there are different user data value inputs for a selected independent variable identifier associated with each separate data point identifier. Design or performance identifiers (selected variables and unselected identifiers (impliedly constants)) can also be viewed as design or performance parameters. A design or performance parameter can be defined in at least some embodiments as a numerical or other measurable factor forming one of a set that defines a system or sets the conditions of its operation; alternatively, a design or performance parameter can be viewed as a quantity whose value is selected for a particular set of circumstances and in relation to which other variable quantities may be expressed.

In other words, at least one embodiment of the invention operates based on a set of designated common independent and dependent variables as well as resulting constant identifiers (potential variable identifiers not designated as independent or dependent) as well as different user input independent variable data values associated with each data point within the Select Data Point selectable list 39 thereby collectively defining a wireless power analysis scenario. Such wireless power analysis scenarios are used in part to generate different efficiency (collection, atmospheric, and rectenna RF to DC conversion) and DC power graphs (e.g., 73, 81, 67, 89) as well as analysis summary 83 within variable graph section 63. The analysis summary 83 shows a table of data points/associated data 84 for data points selected using the Data Point list drop down menu 39 as column headers. Each of the data points in the table of data points/associated data 84 is displayed rows of associated input variables data 35, efficiency data ("y" value of data plots 69, 75), and Output DC Power data from y values 93. User selection of independent variable identifier drop down option 41 and dependent variable identifier drop down option 43 within the WPES MSAV System GUI causes designation of remaining variables within the input variable section 35 as constants by machine instructions within the WPES MSAV software 13 (e.g., see FIG. 3). Generally, FIG. 4 graphs and analysis sections within output variable section 63 are generated based on various software implemented formulas or algorithms within the WPES MSAV software 13 that receive input variable 35 selections and different user input independent variable input data and measurement or performance data from one or more libraries (e.g., 12A, 12B, 12C; See FIG. 3 and FIG. 5) associated with one or more rectennas and diodes. Users input different independent variable data values for each defined data point (defined in part by association with data point identifiers within Data Point selection list or menu 39) within a collection of data points. In particular, users input a common set of constant variables (variables shown in input variable 35 not defined as independent 41 or dependent 43) which are the same for all individual data points within groups of saved data points (under Data Point selection list or menu 39). In one or more embodiments, in a given scenario, an "x" axis of the DC power graph 89 is defined by selection of dependent variable identifier 43. Thus, the x-axis of the DC power graph 89 can be any of the potential variable identifiers listed in the dependent variable drop down list 43. Also, this graph's 89 legend 91 is defined by selecting an independent variable identifier in independent variable identifier drop down list 41.

In this example, a user can use the FIG. 4 user interface 30, 31 to select each desired data point, e.g., "Data Point 1", "Data Point 2", "Data Point 3", etc (in this example, a user can select "Data Point 3" (within list 39)), then associate or select: an independent variable from a dropdown menu 41 (e.g. frequency 47, power density 49, transmitted power 51, separation distance 53, transmitter aperture area 55, receiver aperture area 59); select a dependent variable from a drop-down menu 43 (e.g. frequency 47, power density 49, transmitted power 51, separation distance 53, transmitter aperture area 55); alternatively, a user can select or activate a Reset All action button 45 which triggers a reset function 243C (See FIGS. 9C1 and 9C2) clearing all data in the wireless power analysis tab 31 to enable start of a fresh wireless power system study. Generally, a dependent variable selected within the Input Variable 35 section can be automatically recalculated based on selection of a given independent variable drop down 41 and designated constants within the list of potential variables within Input Variable section 35.

In the FIG. 4 example, a list of potential independent or dependent variables are listed in input variable section 35 under the wireless power analysis tab 31 which each can be designated as an independent or dependent variable via drop down menus 41, 43. In at least some embodiments, within a study, all or some of the selected data points in data point list 39, can have common independent and dependent variable identifiers along with constants while each data point will have user input data for selected independent variable 41. Independent and dependent variable selections will result in the FIG. 4 wireless power analysis user interface 30, 31 being configured with colored boxes around variable fields (e.g., teal (independent), black (constants), and pink (dependent)) to aid a user to know which field should receive input data vs ones that will automatically calculate data. In other words, in at least some embodiments, a particular, selection of independent and dependent variable identifiers via drop down menus 41, 43, results in rendering each variable box with a colored border so they are each associated with independent variable selection 41, dependent variable selection 43, and constant variables (ones not designated as independent or dependent). Designation as an independent and dependent variable enables user data input into variable input fields that are designated as the independent variable as well as constant fields which are not designated or selected (via drop down menu) as independent or dependent variables (e.g., variable fields 47, 49, 51, 53, 55, 59) which in turn will result in automatic computation of dependent variable values for each dependent variable associated with each data point (within data point list 39).

In particular, the FIG. 4 exemplary input variables section 35 includes sections enabling user input of specific values for each independent variable and constant (potential variables not designated as independent or dependent) (e.g. frequency 47, power density 49, transmitted power 51, separation distance 53, transmitter aperture area 55, and receiver aperture area 59). Within the transmitter aperture area subsection 55, the exemplary system enables a user to also select either a circular or rectangular aperture shape by enabling selection of one of a plurality of receiver rectenna Shape radio buttons 57. Within the receiver rectenna aperture area subsection, the FIG. 4 interface enables user selection of either a circular or rectangular aperture shape by selecting one of a plurality of Shape radio buttons 61 comprising circular or rectangular buttons.

The output variables section 63 includes a plurality of graphs which display output data, including, for example, a Collection Efficiency graph 73, an Atmospheric Efficiency graph 81, a Rectenna RF-to-DC Conversion Efficiency graph 67, and a DC Power Output graph 89. The output variables section 63 also can include an Analysis Summary table 83 which stores and displays both the input variables (e.g. e.g. frequency 47, power density 49, transmitted power 51, separation distance 53, transmitter aperture area 55, receiver aperture area 59) and output variables (e.g. DC power output 93). Within the Collection Efficiency graph 73, a transmit/receiver apertures and separation distance correlation visualization graph 77 (optionally also correlating frequency and portion of beam hitting receive aperture) showing separation distance 53 between the transmitting aperture (e.g. the antenna 1A in FIG. 1A or 1B) and the receiving aperture (e.g. the rectenna array 2 in FIG. 1A or 1B) (and optionally frequency related data) is displayed by using the separation distance 53, transmitter aperture area 59, and receiver aperture area 55 variables within the input variables section 35 (and optionally frequency variable 47). A first tracking dot 75 shows a visualization of the collection efficiency for design parameters selected in step 5A. Within the Rectenna RF-to-DC Conversion efficiency graph 67 a second tracking dot 69 shows a visualization of the RF-to-DC conversion efficiency for the design parameters selected in Step 5A (e.g., from FIG. 2). In this embodiment, tracking dots shown within each graph (73, 81, 67, and 89) are generated based on a currently selected data point, e.g., "Data Point 3" (within data point list 39) within the group of data points defined in data point list 39 in the input variable section 35. A graph legend 66 is shown in the Rectenna RF-to-DC Conversion Efficiency graph 67 that are used to depict different plot lines (e.g., up to five plot lines 70, 71 from e.g., experimental data 99 and user measured data 106 discussed in FIG. 5). These plot lines are generated by various functions (e.g., see plot_axes 1-5 245D-247G) executing Step 605F based on library data (e.g., 12A, 12B, and/or 12C) and user input data from Input Variables section 35.

The output variables section 63 also can include a plurality of action buttons, including, for example, an Input Atmospheric Conditions action button 79, an Open Library action button 65 which triggers the library_button function 243F (e.g., see FIGS. 9C1 and 9C2) which in turn opens the Interactive User-Input Action and Experimental Data Storage Library GUI (see e.g. FIG. 5), and an Export Data action button 87 which triggers the export function 243G (e.g., see FIGS. 9C1 and 9C2) that in turn allows the user to export the analysis summary table 83 as a file readable by other programs (e.g. Excel®). The output variables section 63 also can include a subsection that displays warning text 85 if the selected input variables will result in a design that falls outside of the boundary limitations for the application scenario determined in Step 5A (e.g., see FIG. 2).

The FIG. 4 DC Power Output graph GUI 89 is designed with an x-axis label of distance 95 and a y-axis label of rectenna DC power (not numbered). The y-axis value (rectenna DC power) is a fixed graph label that isn't swapped with another variable in this graph. However, the x-value label and the x-axis data values themselves are determined in this graph based on a user selection of a dependent variable in the Input Variables GUI panel or subsection 35. Thus, a user can rapidly swap out the x-axis variable with different variables through selection of Dependent Variable 43 list drop down menu items. This is one of a number of important functions or features of this embodiment of the invention because this swappability of dependent variables to fixed graph variables in a single visualization enables rapid switching of visualizations to compare different design scenarios and aids in cognitive function of rapidly evaluating design tradeoffs in a single visualization.

Figure 5:
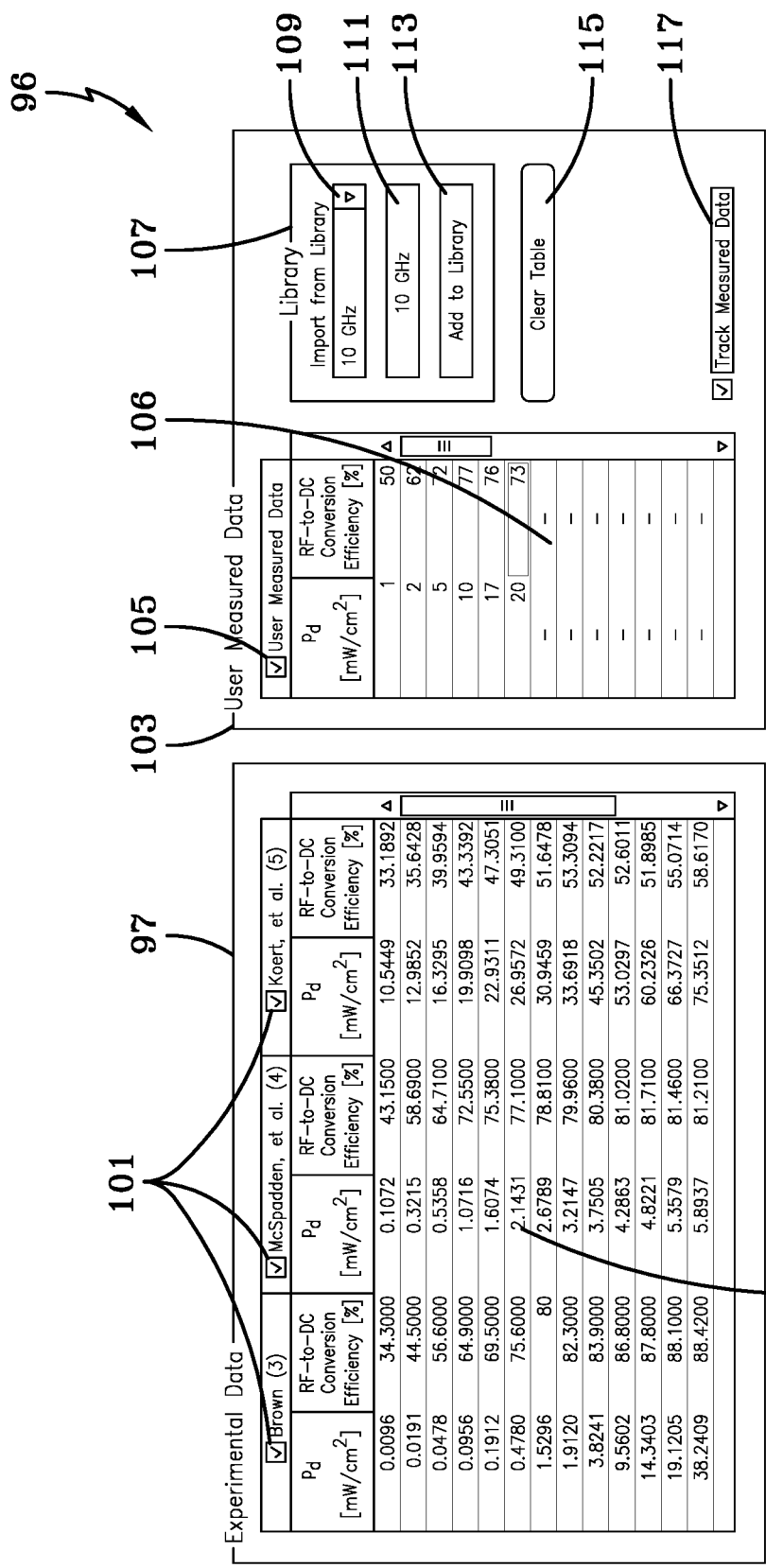
FIG. 5 shows an exemplary embodiment of a WPA Interactive User-Input Action and Experimental Data Storage Library GUI of the WPES MSAV system.

FIG. 5 shows an exemplary embodiment of a WPA Interactive User-Input Action and Experimental Data Storage Library GUI 96 generated by the WPES MSAV software 13 which can include an Experimental Data GUI display section 97 and a User Measured Data GUI section 103. This GUI 96 is displayed when the user activates the Open Library button 65 in FIG. 4, which in turn triggers the library_button function 243F (e.g., see FIGS. 9C1 and 9C2). The Experimental Data section 97 within can include a power density and RF-to-DC Conversion Efficiency Data 99 displayed in Library Table GUIs 101 which can be drawn from data stored in Library 12A that originates from previously completed analysis or studies for specific components or arrays (e.g., studies or reports by W. C. Brown, Electronic and Mechanical Improvement of the Receiving Terminal of a Free-Space Microwave Power Transmission System, Raytheon Company, MA, USA, Tech. Rep. PT-4964, August 1977, NASA Rep. CR-135194; J. O. McSpadden, L. Fan, and K. Chang, "Design and experiments of a high-conversion-efficiency 5.8-GHz rectenna," IEEE Trans. MTT, Vol. 46, No. 12, pp. 2053-2060, December 1998; P. Koert, J. Cha, and M. Macina, "35 and 94 GHz rectifying antenna systems," in SPS 91-Power From Space Dig., Paris, France, August 1991, pp. 541-547). In this example, the library data of Brown cannot be unselected and will always be displayed on the Rectenna RF-to-DC Conversion Efficiency graph 67 in FIG. 4. Remaining individual libraries (e.g. McSpadden and Koert) can be selected or unselected using a checkbox corresponding to each library 101. If the checkbox for a specific library is selected that library will be displayed 70 in the Rectenna RF-to-DC Conversion Efficiency graph 67 in FIG. 4.

The User Measured data section 103 also allows the user to input data points corresponding to power density and RF-to-DC Conversion Efficiency into the User Measured Data table 106. This user input data is saved to the Rectenna Performance Library 12A when the user activates the Add to Library action button 113 within the User Measured Data Library GUI panel 107 which triggers the button_library function 243F7 (e.g., see FIGS. 9C1 and 9C2). This user input data file is named by the user's input of a library file name entered into a User Measured Data name textbox 111 displayed after clicking on the Add to Library action button 113. The graph plot legend 66 within the Rectenna RF-to-DC Conversion Efficiency Graph 67 in the FIG. 4 WPA GUI is added to or changed when this user input data file name is input in the User Measured Data name textbox 111. In particular, the user can input a plurality of different user measured data sets, which after being saved to an associated library (e.g., see FIG. 3, 12A), are able to be selected from the User Data dropdown menu 109 within the User Measured Data Library GUI panel 107. When the user selects a data set from the User Data dropdown menu 109 the function menu_library 243F8 (e.g., see FIGS. 9C1 and 9C2) is triggered which populates the User Measured Data table 106 using that data set. A clear table button 115 triggers the clear_table function 243F5 (e.g., see FIGS. 9C1 and 9C2) which clears all data from the user measured data table 106. A User Measured Data checkbox 105 allows data from the User Measured Data table 106 to be displayed in the Rectenna RF-to-DC Conversion Efficiency graph 67. A Track Measured Data checkbox 117 allows the user to choose whether or not the second tracking dot 69 will be displayed on the User Measured data curve 125 on the Rectenna RF-to-DC Conversion Efficiency graph 67 in, e.g., FIG. 4.

Figure 6A:
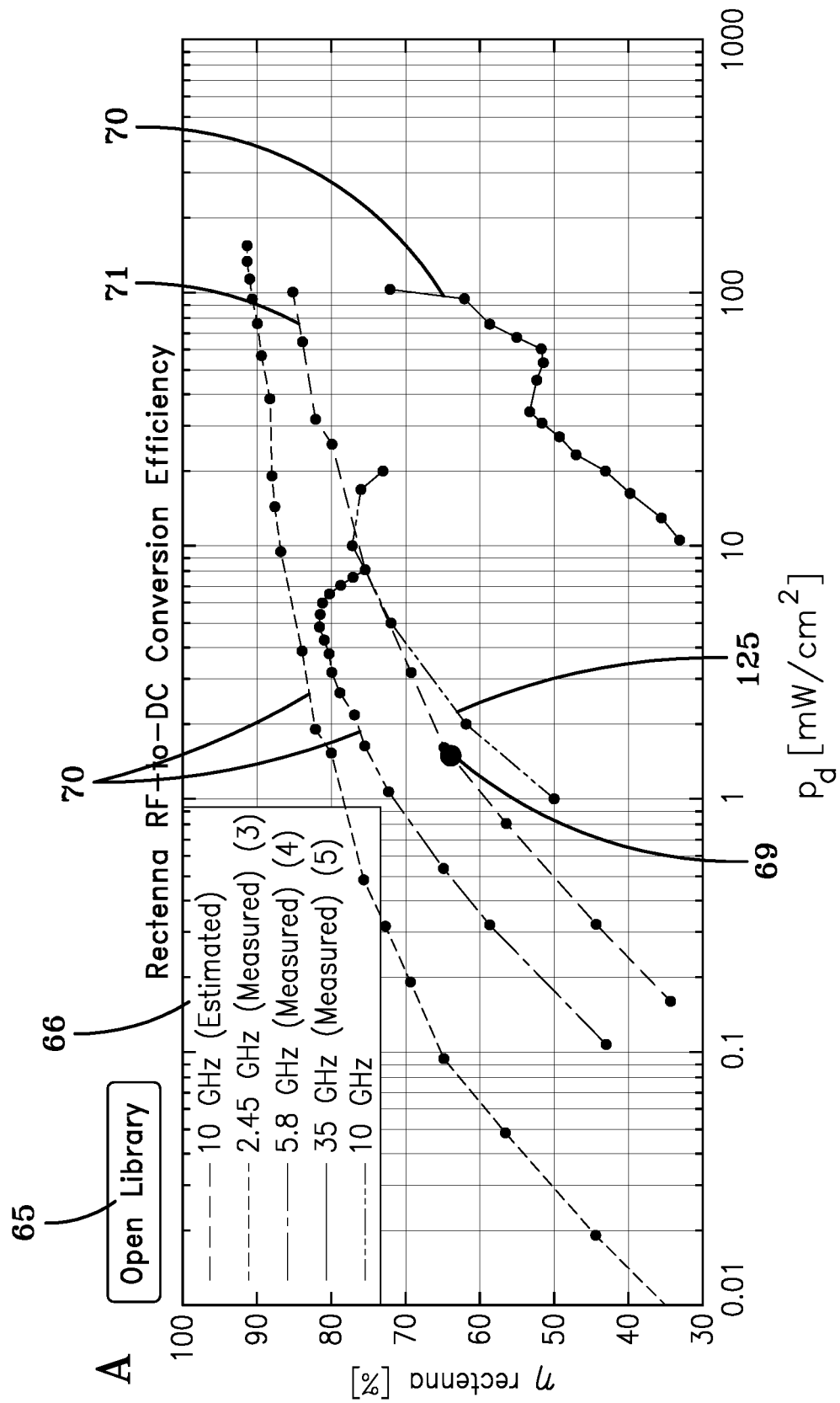
FIGS. 6A and 6B show an exemplary output of the WPA tool (see, e.g.
Figure 6B:
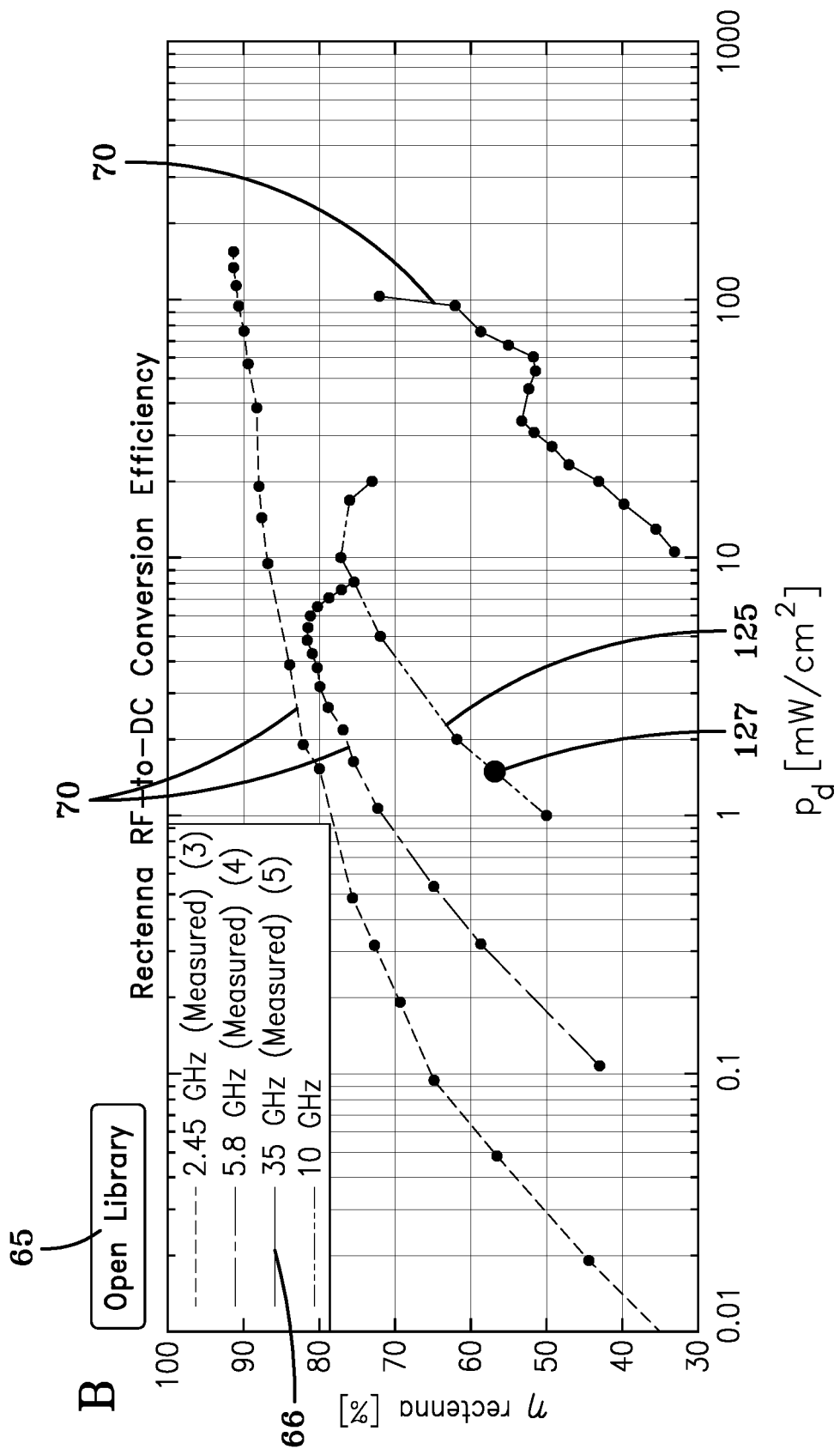

FIGS. 6A and 6B show two exemplary outputs of the Rectenna RF-to-DC Conversion Efficiency graph 67 in FIG. 4. In version A, the Track Measured Data checkbox 117 of FIG. 5 has been left unchecked so the second tracking dot 69 will not be displayed on the User Measured data curve 125.

In version B, the Track Measured Data checkbox 117 of FIG. 5 has been checked so the second tracking dot will be displayed on the User Measured data curve 125.

Figure 7:
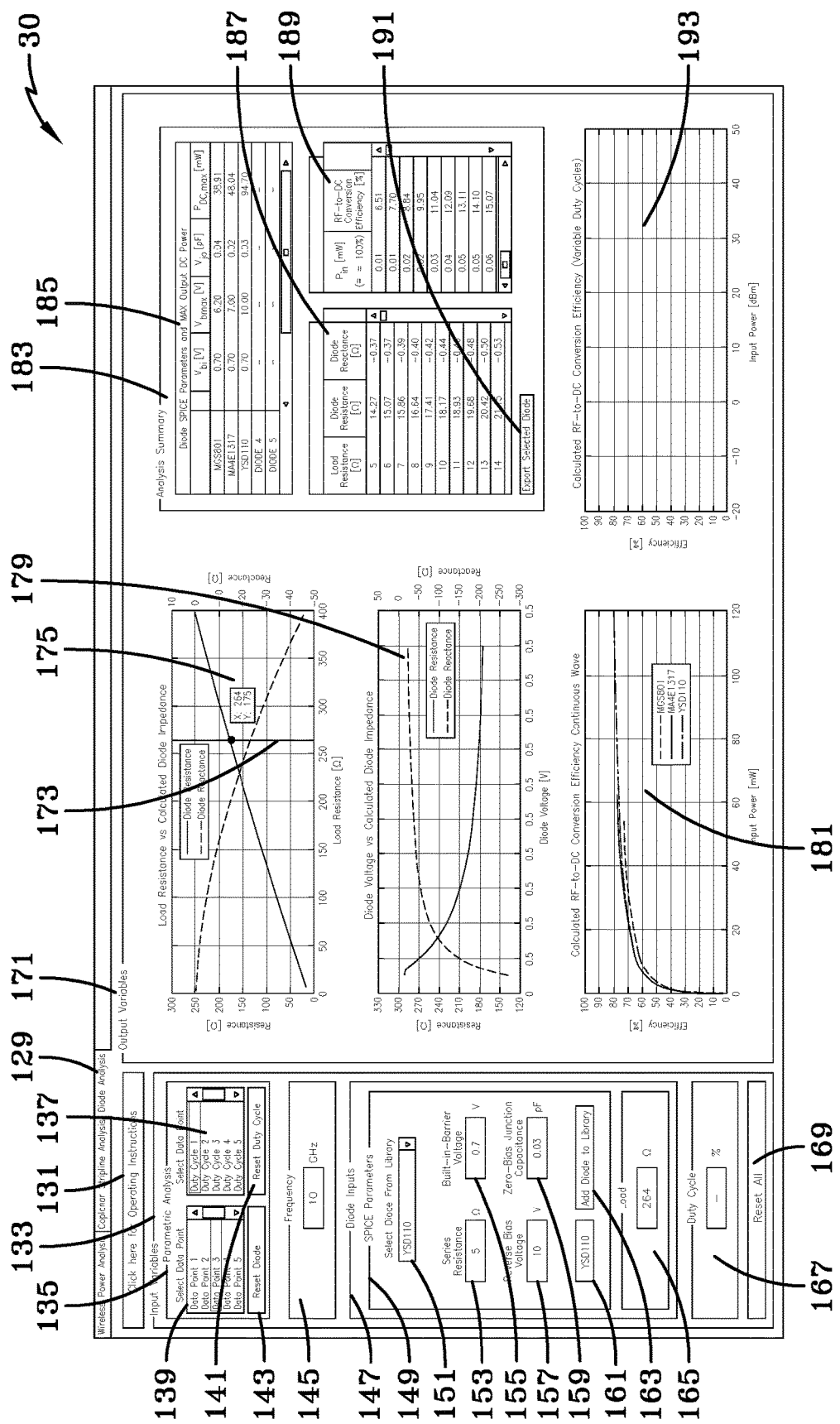
FIG. 7 shows an exemplary embodiment of the Diode Comparison and Selection Analysis (DA) tool GUI of the WPES MSAV system.

FIG. 7 shows an exemplary embodiment of the Diode Comparison and Selection Analysis (DA) tool GUI tab 129 of the WPES MSAV software 13, which includes an Input Variables subsection 133, an Output Variables subsection 171, and a section for accessing the operating instruction by means of an Operating Instructions action button 131. The Input Variables section can include a plurality of subsections, including a Parametric Analysis subsection 135, a Frequency subsection 145, a Diode Inputs subsection 147, and a Duty Cycle section 167. The Parametric Analysis subsection 135 includes, for example, a list menu allowing the user to select a data point for a specific diode 139 (e.g. Diode 1, Diode 2, Diode 3, etc.) and a list menu allowing the user to select a data point for a specific duty cycle 137 (e.g. Duty Cycle 1, Duty Cycle 2, Duty Cycle 3, etc.). The Parametric Analysis section 135 also includes a Reset Diode action button 143 which, upon activation by the user, triggers the reset_diode function 245B (e.g., see 9D), and a Reset Duty Cycle action button 141 which, upon activation by the user, triggers the reset_duty_cycle function 245C (e.g., see FIG. 9D). The frequency section 145 allows the user to input a specific value for frequency to be used by a series of diode analysis equations 537-559 (e.g., see FIG. 12C).

The Diode Inputs subsection 147 can include two subsections, a SPICE Parameter section 149 and a Load section 165. The SPICE parameter section allow the user to select a specific type of diode from the diode SPICE Parameters Library 12B (e.g. YSD110 151), and to input values for specific variables, including Series Resistance 153, Built-In Barrier Voltage 155, Reverse Bias Voltage 157 and, Zero-Bias Junction Capacitance 159. The user can also input a custom name for the diode 161 and activate an Add Diode to Library action button 163 which triggers a button_diode_add function 245F (e.g., see FIG. 9D) which saves SPICE data to second library (FIG. 3, 12B). The Load section 165 allows the user to enter a custom value for the load (e.g. FIGS. 10B1 and 10B2, "rl" variable 369). The Duty Cycle section 167 allows the user to input a value for a duty cycle, i.e. the percentage of use time an RF signal will be active over a predetermined range of time (e.g., on/non-zero). Finally, the Input Variables section 133 contains a Reset All action button 169 which, upon activation by the user, triggers a reset_all function 245H.

The Output Variables section 171 contains a Load Resistance vs. Calculated Diode Impedance graph 175, a Diode Voltage vs. Calculated Diode Impedance graph 179, a Calculated RF-to-DC Conversion Efficiency (Continuous Wave) graph 181, and a Calculated RF-to-DC Conversion Efficiency (Variable Duty Cycles) 193. The Load Resistance vs Calculated Diode Impedance graph 175 displays a tracking line 173 that corresponds to the user entered Load variable 163. The Output Variables section also contains an Analysis Summary subsection 183 which contains tables that display, for example, Diode SPICE Parameters and Max Output DC Power 185, Electrical Characteristics of Diode 187, Power and Voltage 189. The Analysis Summary section 183 also contains an Export Selected Diode action button 191 which, upon activation by the user, triggers a diode_export function 245I (e.g., see FIG. 9D). The Calculated RF-to-DC Conversion Efficiency (Continuous Wave) graph 181 displays different diode data points 139 for a constant duty cycle (e.g. 100%). The Calculated RF-to-DC Conversion (Variable Duty Cycles) graph 193 displays different duty cycle data points 137 for a single type of selected diode 139.

Figure 8:
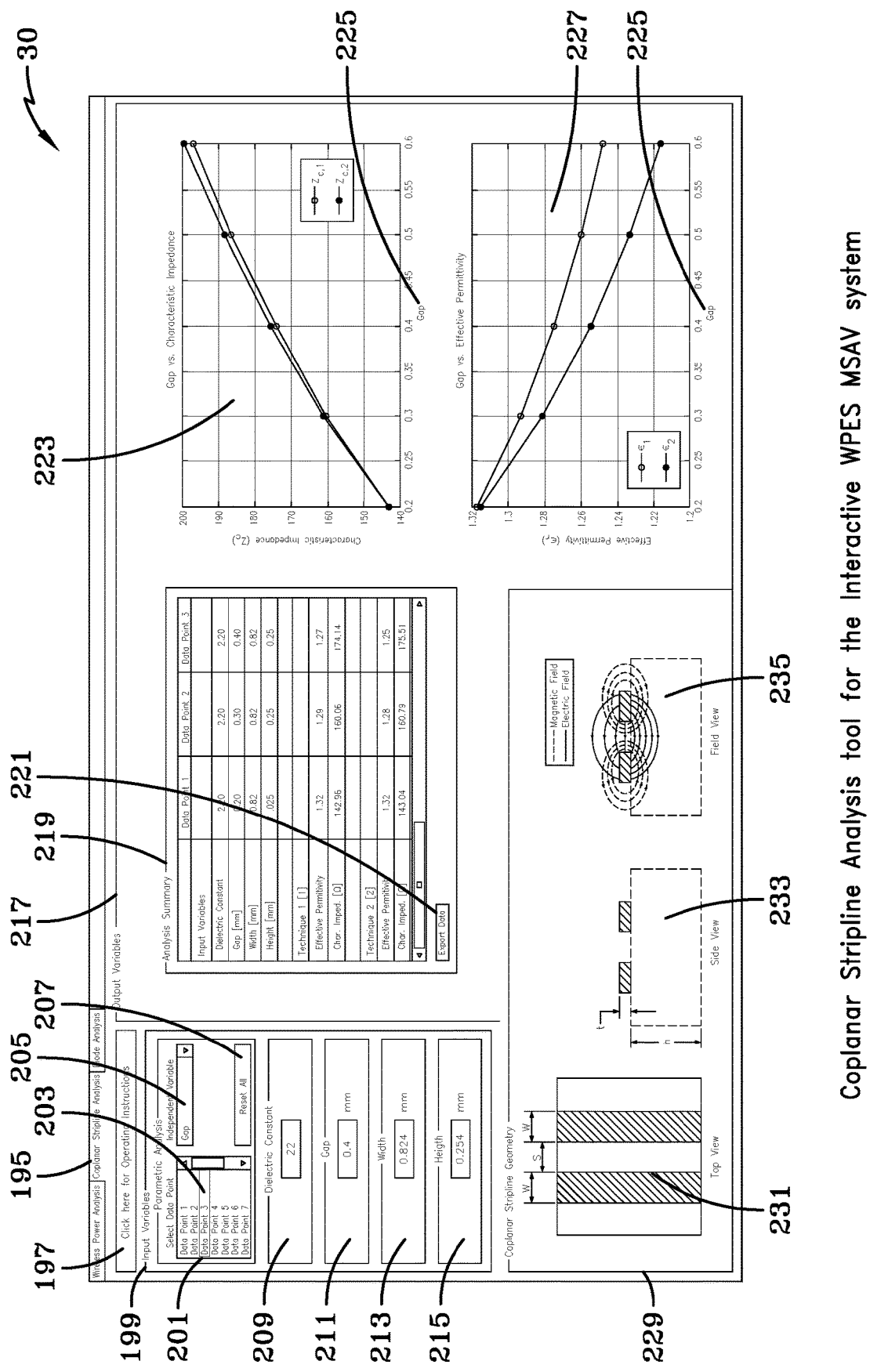
FIG. 8 shows an exemplary embodiment of the Coplanar Stripline Analysis (CPSA) tool GUI of the WPES MSAV system.

FIG. 8 shows an exemplary embodiment of the Coplanar Stripline Analysis (CPSA) tool GUI tab 195 of the WPES MSAV system, which includes, for example, a section containing an action button used to open the Operating Instructions 197, an Input Variables section 199, an Output Variables section 217, and a Coplanar Stripline Geometry section 229. The Input Variables section contains several subsections, including a Parametric Analysis subsection 201, a Dielectric Constant subsection 209, a Gap subsection 211, a Width subsection 213, and a Height subsection 215. The Parametric Analysis subsection 201 allows the user to select a data point from a list of potential data points 203 (e.g. Data Point 1, Data point 2, Data point 3, etc.), to select a user specified independent variable from a drop down of potential independent variables 205 (including, e.g. dielectric constant, gap, width, and height), and to activate a Reset All action 207 button which triggers reset function 246C (e.g., see FIG. 9D). The Dielectric Constant subsection 209 allows the user to input a value for the dielectric constant of a substrate on which the coplanar striplines 4B1, 4B2 are located being examined. The Gap subsection 211 allows the user to input a value for separation gap between the two parallel conducting striplines 4B1, 4B2 (e.g., see FIG. 1B). The Width subsection 213 allows the user to input a value for the width of the two parallel conducting striplines 4B1, 4B2. The Height subsection 215 allows the user to input a value for the height of the substrate on which the coplanar stripline 4B1, 4B2 are located. The Output Variable section 217 contains, for example, a Gap (e.g., the user specified independent variable 225) vs. Characteristic Impedance graph 223 (e.g., fixed variable), which generates two curves, one using equation 531 and one using equation 535 (e.g., for these equations, see FIG. 12B), a Gap v. Effective Permittivity graph 227 (also a user specified independent variable in at least some embodiments), which generates two curve in this graph 223, one using equation 529 and one using equation 533 (e.g., see FIG. 12B). The Output Variables section 217 also contains an Analysis Summary section 219, which stores and displays a table of both the Input Variables (e.g. dielectric constant 209, gap 211, width 213, and height 215) as well as the output variables (e.g. effective permittivity 529, 533, and characteristic impedance 531, 535 in FIG. 12B). The Analysis Summary section 219 also has an Export Data action button 221, which, when triggered by the user, triggers an export function 246E (e.g., see FIG. 9D). The Coplanar Stripline Geometry section 229 displays a plurality of views of the coplanar striplines 4B1, 4B2 being examined, including a top view 31, a side view 233, and a view showing magnetic and electric fields around each stripline 235. [0059]

In important aspect of the cognitive aid and rapid tradeoff analysis capabilities of this embodiment of the invention, the graphs 223, 227 within CPSA GUI 195 can be rapidly changed or swapped out to change their x-axis variables and titles based on what independent variables 209, 211, 213, and 215 are selected in the Output Variables section 217 of the CPSA GUI 195. The first graph 223 in this example has a displayed and user selected independent variable selection of "Gap" 211 which then causes the first graph to display gap as an x-axis label with gap data drawn from Input Variable GUI section 199 and thereby generates a title associated with this variable selection of "Gap vs Characteristic Impendence". The first graph 223 y-axis value is "characteristic impedance" which in this embodiment is not altered based on variable selections in the Input Variable GUI section 199 of the CPSA Tab 195.

The second graph 227 in this example has a displayed and user selected independent variable selection of "Gap" 211 which then causes the second graph to display gap as an x-axis label with gap data drawn from Input Variable GUI section 199 and thereby generates a title associated with this variable selection of "Gap vs Effective Permittivity". The second graph 227 y-axis value is "Effective Permittivity" which in this embodiment is not altered based on variable selections in the Input Variable GUI section 199 of the CPSA Tab 195. Thus, a user can rapidly swap out the x-axis variable for both the first and second graphs 223, 227 with different data values through selection of independent variable list drop down menu items 205. This is another set of important functions or features of this embodiment of the invention because this swappability of independent variables to fixed graph data in a single visualization enables rapid switching of visualizations to compare different design scenarios and aids in cognitive function of rapidly evaluating design tradeoffs in a single visualization.

FIGS. 9A1 and 9A2 show an exemplary table of WPES MSAV software 13 function groups and an exemplary table of a WPA_INIT function group and their relationship to other variables and steps used by the WPES MSAV software 13 (Also see UI object variables described in FIGS. 11A-11C and processing steps executed by various functions shown in FIGS. 13-20). A wireless_power_gui function 237 contains a plurality of function groups that generate a tab_wpa 391, a tab_da 451, a tab_cpsa 421, and execute function groups WPA_INIT 239, DA_INIT 241, and CPSA_INIT 242 during step 600. A WPA_INIT function group 239 generates the Wireless Power Analysis UIObject Variables 401-419 during step 601. A DA_INIT function group 241 generates the Diode Analysis UIObject Variables 453-465 during step 631. The CPSA_INIT function group 242 generates the Coplanar Stripline Analysis UIObject Variables 423-435 during step 661. A WPA_CALLBACK function group 243 which accepts user input from Input Variables edit boxes 405, Transmitter Aperture radio buttons 407, Receiver Aperture radio buttons 409, Parametric Analysis lists 411, and button_library 415 by using step 603, 607, 609, or 611. A DA_CALLBACK function group 245 accepts user input from Input Variables edit boxes 457, library menu/edit box 459, and Parametric Analysis lists 461 by using step 633, 639, 641, 644. A CPSA_CALLBACK function group 246 accepts user input from Input Variables edit boxes 427, and Parametric Analysis lists 431 by using step 663, 667, or 669. A WPA_UPDATE function group 247 displays values for Input Variables Edit Boxes 405, Data Point List 411, Output Variables Graphs 413, Analysis Summary Table 417, and Warning Text 419 during step 605. A DA_UPDATE function group 249 displays values for Output Variables Graphs 463 and Analysis Summary Tables 465 during step 635. A CPSA_UPDATE function group 250 displays values for Output Variables Graphs 433 and Analysis Summary Table 435 during step 665.

FIGS. 9A1 and 9A2 also include a table showing functions that comprise the WPA_INIT function group which generates the WPA GUI. An instructions function 239A generates Operating Instructions action button 33. An input function 239B generates panel_input 401. A parametric_analysis 239C generates panel_parametric 403, parametric analysis lists 411, and Reset All button 45. A frequency function 239D generates panel_f 403 and edit_f 405. A power_density function 239E generates panel_pd 403 and edit_pd 405. A power_transmitted function 239F generates panel_pt 403 and edit_pt 405. A distance function 239G generates panel_d 403 and edit_d 405. A transmitter_aperture_area function 239H generates panel_at 403, edit_at1, edit_at2, edit_at3 405, and radio buttons 407. A receiver_aperture_area function 239I generates panel_ar 403, edit_ar1, edit_ar2, edit_ar3 405, and radio buttons 409. An output function 239J generates panel_output 401. An axes function 239K generates axes1, axes2, axes3, axes4, axes5 413 and button_library 415. An analysis summary function 239L generates panel_analysis 401, table1 417, and text_warn 419.

FIGS. 9B1 and 9B2 show tables of exemplary DA_INIT and CPSA_NIT function groups and their relationship to other variables and steps used by the WPES MSAV system. Within the DA_INIT function group 241: An instructions function 241A generates Operating Instructions button 131. An input 241B generates panel_input 453. A parametric_analysis function generates panel_parametric 455, diode analysis and duty cycle analysis lists 461, Reset Diode action button 143, and Reset Duty Cycle action button 141. A frequency function 241D generates panel_f 455 and edit_f 457. A diode_input function 241E generates panel_diode 455. A diode_spice function 241F generates panel_spice 455. A diode_library_load function 241G generates menu_library 459. A series_resistance function 241H generates edit_rs 457. A barrier_voltage function 241I that generates edit_vbi 457. A reverse_bias_voltage function 241J generates edit_vbr 457. A junction_capacitance function 241K generates edit_cjo 457. A diode_library_save function 241L generates edit_library 459 and the Add Diode to Library actions button 163. A load function 241M generates panel_rl 455 and edit_rl 457. A duty_cycle function 241N generates panel_dc 455 and edit_dc 457. A reset_button function 241O generates the Reset All button 169. An output function 241P generates panel_output 453. An axes function 241Q generates axes1, axes2, axes3, axes4 463. An analysis_summary function 241R generates panel_analysis 453, table1, table2, table3 465, and the Export Selected Diode action button 191.

Within the CPSA_INIT function group 242: An instructions function 242A generates the Operating Instructions action button 197. An input function 242B generates panel_input 424. A parametric_analysis function 242C generates panel_parametric 423, parametric analysis lists 431, and the Reset All action button 169. A dielectric function 242D generates panel_er 425 and edit_edit 427. A gap function 242E generates panel_s 425 and edit_s 427. A width function 242F generates panel_w 425 and edit_w 427. A height function 242G generates panel_h 425 and edit_h 427. An output function 242H generates panel_output 424. An axes function 242I generates axes1 and axes2 433. An analysis summary function 242J generates panel_analysis 423, table1 435, and the Export Data action button 221. A geometry function 242K generates panel_geometry 424, and Coplanar stripline diagrams (e.g. panel_top 429, panel_side 429, panel_electro 429, axes_top 429, axes_side 429, and axes_electro 429).

FIGS. 9C1 and 9C2 show tables of exemplary functions within the WPA_CALLBACK 243 and library_button 243F function groups. Within the WPA_CALLBACK function group 243: A list_data function 243A accepts user input from list_data 411 through step 603. A depvar function 243B accepts user input from menu_depvar or menu_indepvar 411 through step 607. A reset function 243C accepts user input from Reset Button 45 through step 613. A plurality of functions 243D (e.g. edit_f, edit_pd, edit_pt, edit_d, edit_at, edit_ar) accept user input from edit boxes 405 through step

611. A plurality of functions 243E (radio_at and radio_ar) accept user input from transmitter radio buttons 407 or receiver radio buttons 409 through step 611. A library_button function 243F accepts user inut from button_library 415 through step 609 and opens FIG. 5 GUI 96, generating WPA Experimental Data Library GUI elements 420A-I. An export function 243G accepts user input from Export Button 87 through step 615.

Within the library_button function group 243F: A table function 243F1 accepts user input from table6 420F during step 609E and executes function group WPA_UPDATE 247 through step 605. A checkbox_mcspadden function 243F2 accepts user input from checkbox_mcspadden 420B during step 609E and executes function group WPA_UPDATE 247 through step 605. A checkbox_koert function 243F3 accepts user input from checkbox_koert 420C during step 609E and executes function group WPA_UPDATE 247 through step 605. A checkbox_custom function 243F4 accepts user input from checkbox_custom 420D during step 609E and executes function group WPA_UPDATE 247 through step 605. A clear_table function 243F5 accepts user input from the Clear Table action button 115 during step 609F to clear values in table6 420F. A library_name function 243F6 accepts user input from library_name 420H during step 609E and executes function group WPA_UPDATE 247 through step 605. A button_library function 243F7 accepts user input from the Add to Library action button 113 during step 609D to save values of table6 420F and library_name 420H to WPES MSAV Library 12A. A menu_library function 243F8 accepts user input from menu_library 420G during step 609C. A checkbox_custom_f function 243F9 accepts user input from checkbox_lib_f 420I during step 609E and executes function group WPA_UPDATE 247.

FIG. 9D shows tables of exemplary DA_CALLBACK and CPSA_CALLBACK function groups and their relationship to other variables and steps used by the WPES MSAV system. Within the DA_CALLBACK function group 245: A list_data_diode function 245A accepts user input from list_data_diode 461 through step 633. A reset_diode function 245B accepts user input from the Reset Diode action button 143 through step 637. A reset_duty_cycle function 245C accepts user input from Reset Duty Cycle action button through step 643. A plurality of functions (e.g. edit_f, edit_rs, edit_vbi, edit_vbr, edit_cjo) 245D accept user input from edit boxes 457 through step 641. A menu_library fuctnion 245E accepts user input from menu_library 459 through step 639. A button_diode_add function 245F accepts user input from the Add Diode to Library 163 through step 644. An edit_rl function 245G accepts user input from edit_rl 457 through step 641. A reset_all function 245H accepts user input from the Reset All action button 169 through step 645. A function diode_export 245I accepts user input from the Export Selected Diode action button 191 through step 646.

Within the CPSA_CALLBACK function group 246: A list_data function 246A accepts user input from list_data 431 through step 663. An indepvar function 246B accepts user input from menu_indepvar 431 through step 667. A reset function 246C accepts user input from the Reset All action button 207 through step 671. A plurality of functions (e.g. edit_er, edit_s, edit_w, edit_h) 246D accepts user input from edit boxes 427 through step 669. An export function 246E accepts user input from the Export Data action button 221 through step 673.

FIG. 9E shows tables of exemplary WPA_UPDATE (updates and modifies the WPA Tab 31 GUI elements (e.g., graph, tables, changes some inputs, etc), FIG. 4), DA_UPDATE (updates and modifies the DA Tab 129 GUI elements (e.g., graph, tables, changes some inputs, etc), FIG. 7), CPSA_UPDATE function groups (updates and modifies the CPSA Tab 195 GUI elements (e.g., graph, tables, changes some inputs, etc), FIG. 8), and their relationship to other variables and steps used by the WPES MSAV software 13. Within the WPA_UPDATE function group 247: An update function 247A executes step 605A by calling function 247B, executes step 605B, executes functions 247C-H during steps 605C-F, then fills in table1 417 entries during step 605F. A calculate_dependent function 247B executes step 605A which calculates the dependent variable 43 and fills in its corresponding edit box 405 in the WPA GUI tab 31, FIG. 4. A check_bounds function 247C executes step 605C which checks the boundaries on edit_pd 405 entry, then displays text_warn 419 and highlights corresponding list_data entry 411 if step 605D is executed. A plot_axes1 function 247D executes step 605F to plot axes1 413. (which generates Rectenna RF to DC Conversion Efficiency graph 67 in WPA Tab 31, FIG. 4) A plot_axes2 function 247E executes step 605F to plot axes2 413. (which generates collection efficiency graph 73 in WPA Tab 31, FIG. 4) A plot_axes3 function 247F executes step 605F to plot axes3 413. (which generates visual representation of apertures 77 in FIG. 4, WPA Tab 31) A plot_axes4 function 247G executes step 605F to plot axes4 413 (which produces the DC Power Output Graph 89 in WPA Tab 31, FIG. 4). A plot_axes5 function 247H executes step 605F to plot axes5 413 (atmospheric efficiency plot which shows an estimate of how much power is not attenuated due atmospheric conditions).

Within the DA_UPDATE function group 249: An update function 249A executes step 635A and fills in table1 465 entries, then executes functions 249B, 249C, 249D, and 249E during steps 635B-E. A plot_axes1 function 249B executes step 635B to plot axes1 463 and fill in table2 465 entries. A plot_axes2 function 249C executes step 635C to plot axes2 463. A plot_axes3 function 249D executes step 635D to plot axes3 463 and fill in table3 465 entries. A plot_axes4 function 249E executes step 635E to plot axes4 463.

Within the CPSA_UPDATE function group 250: An update function 250A executes step 665A and executes functions 250B, 250C during step 655B and 655C, then fills in table1 435 entries. A plot_axes1 function 250B executes step 665B to plot axes1 433. A plot_axes2 function 250C executes step 665C to plot axes2 433.

FIGS. 10A1 and 10A2 show an exemplary table of variables to be used by the WPA tool GUI 30 and a brief description of each variable. A variable ndata 301 sets the maximum number of data points 303 that can be included in the Select Data Point list menu 39. A variable n 303 Tracks the currently-selected data point to replace and store the correct input variable 305, tau 313, efficiencies 315, pdc 317. Variables f, pd, pt, d, at, and ar 305 store values for frequency, power density, transmitted power, separation distance, calculated transmitter aperture area, and calculated receiver aperture area respectively for use in equation 501 to calculate the dependent variable 43 as determined by depend_var_flag 335 or calculated using equation 501 during step 605A. Variables at radio, at_sub1, at_sub2, at_sub3 307 store values for either transmitter diameter (at_sub 1) or transmitter length and width (at_sub2, at_sub3) depending on user selection of circular or rectangular transmitter (at_radio) for use in calculating transmitter aperture area (at) 305 using known equations for area. Variables ar_radio, ar_sub1, ar_sub2, ar_sub3 309 store values for either receiver diameter (ar_sub1) or receiver length and width (ar_sub2, ar_sub3) depending on user selection of circular or rectangular receiver (ar_radio) for use in calculating receiver aperture area (ar) 305 using known equations for area. A variable dmin 311 stores the minimum feasible separation distance calculate by equation 513. A variable tau 313 is calculated in equation 507 for use in calculating a collection efficiency nu1 315 in equation 509. Variables nu1 and n2 315 store rectenna efficiency and collection efficiency respectively as calculated in equations 509 and 505 for use in calculating output DC power in equation 511. A variable pdc 317 stores output DC power calculated by equation 511. A variable valid_data_point 319 tracks the data points n 303 that do not violate the inequality in equation 504. A variable data_point_flag 321 tracks which data points n 303 have been selected by the user for viewing. A variable custom_library_name 323 stores a user-specified name of user-entered Power density and Rectenna conversion efficiency values 325 loaded to/from WPES MSAV Library 12A during step 609. A variable custom_library_data 325 stores power density and Rectenna conversion efficiency (User-entered) data loaded to or from WPES MSAV Library 12A during step 609. Variables checkbrown, checkmcspadden, checkkoert, checkcustom, checkcustomfreq 327 store boolean values altered during step 609E that determine which Power density and Rectenna conversion efficiency values (329, 331, 333, 325) are displayed on the WPA GUI 30 and whether custom_library_data 325 or pd_Brown 329 is used for pd_lib in equation 504. Variables pd_Brown and Eta_Brown 329 store exemplary power density and Rectenna conversion efficiency (Brown) data loaded from the WPES MSAV Library 12A. Variables pd_McSpadden and Eta_McSpadden 331 store exemplary power density and Rectenna conversion efficiency (McSpadden) data loaded from the WPES MSAV Library 12A. Variables pd_Koert and Eta_Koert 333 store exemplary power density and Rectenna conversion efficiency (Koert) data loaded from the WPES MSAV Library 12A. Variables depend_var_flag and independ var flag 335 determine and identify which input variables 305 the user selected as the independent variable 41 or the dependent variable 43 for use in equations 501. Variables pd_scaled and Eta_scaled 337 store power density and Rectenna conversion efficiency values calculated in equation 503 for use in equations 504, 505.

FIGS. 10B1 and 10B2 show tables of exemplary variables to be used by the DA tool GUI 30 and the CPSA tool GUI 30 and a brief description of each variable. For the CPSA variables: A variable ndata 339 sets the maximum number of data points 341 that will be displayed in the Select Data Point list menu 203. A variable n 341 stores the currently-selected data point to replace and store the correct input variable 343, characteristic impedance (Zc1, Zc2) 345, and effective permittivities (Eps_eff1, Eps_eff2) 347. Variables er, s, w, h 343 store values for the dielectric constant 209, gap distance 211, width 213, and height 215 for use in equations 515, 519, 523, 529, and 533 to calculate effective permittivity 347. Variables Zc1 and Zc2 345 store a value for the characteristic impedance calculated in equations 531 and 535. Variables Eps_eff1 and Eps_eff2 347 store a value for the effective permittivity calculated using equations 529 and 533. A variable data_point_flag 349 tracks and stores data points which have been selected for viewing. A variable independ_var_flag 351 stores which input variable 343 is selected as the independent variable 205.

For the Diode Analysis variables: variables ndata_diode and ndata_dutycycle 361 set the maximum number of data points 366 that will be displayed in the Diode Select Data Point list menu 139 and the Duty Cycle Select Data Point list menu 137 respectively. A variable n_diode 366 tracks the currently-selected diode data point to replace and store the correct input variables (e.g. Frequency 145, Series Resistance 153, Built-in Barrier Voltage 155, Reverse Bias Voltage 157, Zero Bias Junction Capacitance 159, and Load Resistance 167). A variable n_dutycycle 366 tracks the currently-selected duty cycle data point to replace and store the correct input variable (e.g. duty cycle 370). Variables f, rs, vbi, vbr, cjo, and rl 369 store Frequency 145, Series Resistance 153, Built-in Barrier Voltage 155, Reverse Bias Voltage 157, Zero Bias Junction Capacitance 159, and Load Resistance 167 respectively for use by equations 537 through 553 and 559. A variable duty cycle 370 stores the percentage of time that the diode is active within one cycle for use in a computation equation. A variable Zd 371 stores Diode Input Impedance calculated using equation 547. A variable pdcmax 373 stores the maximum DC output power calculated using equation 557. A variable diode_name 375 stores the user-specified name 161 of user-entered Diode SPICE parameters rs, vbi, vbr, cjo 369 loaded to/from WPES MSAV Library 12B during steps 639 or 646.

FIGS. 11A1 and 11A2 show tables of exemplary UIObject variables used by the WPA tool GUI 30 of the WPES MSAV software 13 and their relationship to the WPA tool GUI 30. A UIObject tab_wpa 391 stores and displays the Wireless Power Analysis tab 31 generated from function uitab (see MATLAB® "uitab" documentation) during function wireless_power_gui 237. UIObjects panel_input, panel_output, and panel_analysis 401 store and display the Input Variables panel 35, Output Variables panel 63, and Analysis Summary panel 83 generated from function uipanel (see MATLAB® "uipanel" documentation) during execution of function group WPA_INIT 239. UIObjects panel_parametric, panel_f, panel_pd, panel_pt, panel_d, panel_at, panel_ar 403 store and display Parametric Analysis panel 37, frequency panel 47, power density panel 49, transmitted power panel 51, separation distance panel 53, transmitter aperture area panel 55, receiver aperture area panel 59 generated from function uipanel (see MATLAB® "uipanel" documentation) during execution of function group WPA_INIT 239. UIObjects edit_f, edit_pd, edit_pt, edit_d, edit_at1, edit_ar1, edit_at2, edit_ar2 edit_at3, edit_ar3 405 store and display Frequency edit box 47, power density edit box 49, transmitted power edit box 51, separation distance edit box 53, transmitter aperture area edit boxes 55, receiver aperture area edit boxes 59 generated from function uicontrol (see MATLAB® "uicontrol" documentation) during execution of function group WPA_INIT 239 that each trigger function group WPA_CALLBACK 243 when edited by the user. UIObjects bgroup_at, radio_at1, and radio_at2 407 store and display transmitter aperture area button group and radio buttons 57 generated from functions uibuttongroup and uicontrol (see MATLAB® "uibuttongroup" and "uicontrol" documentation) during execution of function group WPA_INIT 239 that each trigger function group WPA_CALLBACK 243 when edited by the user. UIObjects bgroup_ar, radio_ar1, and radio_ar2 407 store and display receiver aperture area button group and radio buttons 61 generated from functions uibuttongroup and uicontrol (see MATLAB® "uibuttongroup" and "uicontrol" documentation) during execution of function group WPA_INIT 239 that each trigger function group WPA_CALLBACK 243 when edited by the user. UIObjects list_data, menu_indepvar, and menu_depvar 411 store and display Data Point selection list 39, independent variable selection drop-down menu 41, and dependent variable selection drop-down menu 43 generated from function uicontrol (see MATLAB® "uicontrol" documentation) during execution of function group WPA_INIT 239 that triggers function group WPA_CALLBACK 243 when edited by the user. UIObjects axes1, axes2, axes3, axes4, axes5 413 store and display Rectenna RF-to-DC Conversion Efficiency graph 67, Collection Efficiency graph 73, Visual Representation of Apertures graph 77, DC Power Output graph 89, and Atmospheric Efficiency graph 81 generated from function axes (see MATLAB® "axes" documentation) during function group WPA_INIT 239 and updated during function group WPA_UPDATE 247. A UIObject button_library 415 Open Library button 65 generated from function uicontrol (see MATLAB® "uicontrol" documentation) during function group WPA_INIT 239 that triggers function group WPA_CALLBACK 243 when edited by user. A UIObject table1 417 stores and displays Analysis Summary table 83 generated from function uitable (see MATLAB® "uitable" documentation) during function group WPA_INIT 239 and updated during function group WPA_UPDATE 247. A UIObject text_warn 419 stores and displays Boundary Warning Text 85 generated from function uicontrol (see MATLAB® "uicontrol" documentation) during function group WPA_INIT 239 and updated during function group WPA_UPDATE 247.

FIG. 11B shows an exemplary table of UIObject variables 420 to be used by the WPA Interactive User-Input Action and Experimental Data Storage Library GUI (see e.g. FIG. 5), used with the WPES MSAV software 13. A UIObject checkbox_brown 420A which stores and displays Brown Checkbox 101 generated from function uicontrol (see MATLAB® "uicontrol" documentation) during execution of function library_button 243F. A UIObject checkbox_mcspadden 420B stores and displays McSpadden Checkbox 101 generated from function uicontrol (see MATLAB® "uicontrol" documentation) during execution of function library_button 243F that triggers subfunction checkbox_mcspadden 243F2 when edited by the user. A UIObject checkbox_koert 420C stores and displays Koert Checkbox 101 generated from function uicontrol (see MATLAB® "uicontrol" documentation) during execution of function library_button 243F that triggers subfunction checkbox_koert 243F3 when edited by the user. A UIObject checkbox_custom 420D that stores and displays User Measured Checkbox 105 generated from function uicontrol (see MATLAB® "uicontrol" documentation) during execution of function library_button 243F that triggers subfunction checkbox_custom 243F4 when edited by the user. A UIObject table5 420E that stores and displays Experimental Data Table 99 generated from function uitable (see MATLAB® "uitable" documentation) during execution of function library_button 243F. A UIObject table6 420F that stores and displays User Measured Data Table 106 generated from function uitable (see MATLAB® "uitable" documentation) during execution of function library_button 243F that triggers subfunction table 243F1 when edited by the user. A UIObject menu_library 420G that stores and displays input from Library drop-down menu 109 generated from function uicontrol (see MATLAB® "uicontrol" documentation) during execution of function library_button 243F that triggers subfunction menu_library 243F8 when edited by the user. A UIObject library_name 420H that stores and displays Library Name edit box 111 generated from function uicontrol (see MATLAB® "uicontrol" documentation) during execution of function library_button 243F that triggers subfunction library_name 243F9 when edited by the user. A UIObject checkbox_lib_f that stores and displays Track Measured Data Checkbox 117 generated from function uicontrol (see MATLAB® "uicontrol" documentation) during execution of function library_button 243F that triggers subfunction checkbox_custom_f 243F9 when edited by the user.

FIG. 11C shows an exemplary table of UIObject variables to be used by the CPSA tool GUI 30 of the WPES MSAV software 13 and their relationship to the CPSA tool GUI 30. A UIObject tab_cpsa 421 stores and displays the Coplanar Stripline Analysis tab 195 generated from function uipanel (see MATLAB® "uipanel" documentation) during execution of function wireless_power_gui 237. UIObjects panel_input, panel_output, panel_analysis, panel_geometry 423 store and display Input Variables panel 199, Output Variables panel 217, Analysis Summary panel 219, and Coplanar Stripline Geometry panel 229 generated from function uipanel (see MATLAB® "uipanel" documentation) during execution of function CPSA_INIT 242. UIObjects panel_parametric, panel_er, panel_s, panel_w, panel_h 425 store and display Parametric Analysis panel 201, dielectric constant panel 209, gap panel 211, width panel 213, and height panel 215 generated from function uipanel (see MATLAB® "uipanel" documentation) during execution of function CPSA_INIT 242. UIobjects edit_er, edit_s, edit_w, and edit_h 427 store and display Dielectric constant edit box 209, gap edit box 211, width edit box 213, and height edit box 215 generated from function uicontrol (see MATLAB® "uicontrol" documentation) during execution of function CPSA_INIT 242 that trigger function group CPSA_CALLBACK 246D when edited by the user. UIObjects panel_top, axes_top, panel_side, axes_side, panel_electro, and axes_electro 429 store and display Top View panel and axes 231, Side View panel and axes 233, and Field View panel and axes 235 generated from function uipanel and axes (see MATLAB® "uipanel" and "axes" documentation) during execution of function CPSA_INIT 242. UIObjects list_data and menu_indepvar 431 store and display the Data Point selection list 203 and the independent variable selection drop-down menu 205 generated from function uicontrol (see MATLAB® "uicontrol" documentation) during execution of the function CPSA_INIT 242 that triggers the function group CPSA_CALLBACK 246 when edited by the user. UIObjects axes1 and axes 2 433 store and display the Characteristic Impedance graph 223 and the Effective Permittivity graph 227 generated from function axes (see MATLAB® "axes" documentation) during execution of the function CPSA_INIT 242 and updated during execution of the function CPSA_UPDATE 250B, 250C. A UIobject table1 435 stores and displays the Analysis Summary table 219 generated from function uitable (see MATLAB® "uitable" documentation) during execution of the function CPSA_INIT 242 and updated during execution of the function CPSA_UPDATE 250A.

FIG. 11D shows an exemplary table of UIObject variables to be used by the DA tool GUI 30 of the WPES MSAV software 13 and their relationship to the DA tool GUI 30. A UIObject tab_da 451 stores and displays the Diode Analysis tab 129 generated from function uipanel (see MATLAB® "uipanel" documentation) during execution of the function wireless_power_gui 237. UIObjects panel_input, panel_output, and panel_analysis 453 store and display the Input Variables panel 133, the Output Variables panel 171, and the Analysis Summary panel 183 generated from function uipanel (see MATLAB® "uipanel" documentation) during execution of the function DA_INIT 241. UIobjects panel_parametric, panel_f, panel_diode, panel_spice, panel_rl, and panel_dc 455 store and display the Parametric Analysis panel 135, the frequency panel 145, the diode inputs panel 147, the SPICE parameters panel 149, the load resistance panel 165, and the duty cycle panel 167 generated from function uipanel (see MATLAB® "uipanel" documentation) during executing of the function DA_INIT 241. UIObjects edit_f, edit_rs, edit_vbi, edit_vbr, edit_cjo, edit_rl, and edit_dc 457 stores and display the Frequency edit box 145, the series resistance edit box 153, the built-in barrier voltage edit box 155, the reverse bias voltage edit box 157, the zero-bias junction capacitance edit box 159, the load resistance edit box 165, and the duty cycle edit box 167 generated from function uicontrol (see MATLAB® "uicontrol" documentation) during execution of the function DA_INIT 241 that trigger the function group DA_CALLBACK 245 when edited by the user. UIObjects menu_library and edit_library 459 store and display the Select Diode From Library drop-down menu 151 and the Diode Name edit box 161 generated from function uicontrol (see MATLAB® "uicontrol" documentation) during execution of the function DA_INIT 241 that trigger the function group DA_CALLBACK 245 when edited by the user. UIObjects list_data_diode and list_data_dutycycle 461 store and display Diode data Point selection list 139 and duty cycle data Point selection list 137 generated from function uicontrol (see MATLAB® "uicontrol" documentation) during execution of the function DA_INIT 241 that trigger the function group DA_CALLBACK 245 when edited by the user. UIObjects axes1, axes2, axes3, and axes4 463 store and display the Load Resistance vs Calculated Diode Impedance graph 175, the Diode Voltage vs Calculated Diode Impedance graph 179, the Calculated RF-to-DC Conversion Efficiency (Continuous Wave) graph 181, and the Calculated RF-to-DC Conversion Efficiency (Variable Duty Cycle) graph 193 generated from function axes (see MATLAB® "axes" documentation) during execution of the function DA_INIT 241 and updated by the functions DA_UPDATE 249B-E. UIObjects table1, table2, and table3 465 Diode SPICE parameters and max output DC power graph 185, Electrical characteristics of diode graph 187, and Power and Voltage graph 189 generated from function uitable (see MATLAB® "uitable" documentation) during execution of the function DA_INIT 241 and updates by the functions DA_UPDATE 249A, B, and D.

FIG. 12A shows an exemplary tables of equations used by functions in the WPA_INIT 239 and WPA_CALLLBACK 243 function groups in FIGS. 9A1, 9A2, 9C1 and 9C2, and which use variables from FIGS. 10A1 and 10A2. Equation 501 calculates the user-specified dependent variable 43 as specified by the depend_var_flag 335 using the other Input Variables 305 (power density $p_d$, Transmitter aperture area $A_t$, power transmitted $P_t$, frequency f, separation distance d) and the speed of light constant c during step 605A. Equation 503 sets the power density and conversion efficiency values 337 used in equations 504 and 505 during step 605B if checkcustfreq 327 is not selected (top) using frequency f 305 and the frequency, power density, and conversion efficiency of Brown 329; or if it is selected (bottom) using data from custom_library_data 325. Equation 504 calculates the min/max feasible boundary for power density during step 605B using $p_{d,scaled}$ 337 from equation 503, then checks to see if values for power density 305 is within the calculated boundaries during step 605C. Equation 505 uses the interpolate function (see MATLAB® "interp2" documentation) to interpolate the values of $p_d$ 305 between the collection of points $(p_{d,scaled}, \eta_{2,scaled})$ 337 calculated in equation 503, during step 605F. Equation 507 calculates a value tau $\tau$ used in equation 509 along with the user-specified Input Variables 305 (Transmitter aperture area $A_t$, Receiver aperture area $A_r$, frequency f, separation distance d) and the speed of light constant c during step 605F. Equation 509 calculates a collection efficiency $\eta_1$ 315 using the value tau $\tau$ from equation 507 during step 605F. Equation 511 Calculates the output DC power 317 using power transmitted $P_t$ 305, collection efficiency $\eta_1$ 315, rectenna RF-to-DC conversion efficiency $\eta_2$ 315, and atmospheric efficiency $\eta_3$ 315 during step 605F. Equation 513 calculates the minimum feasible separation distance $d_{min}$ 311 between the transmitting antenna 1A and the receiving rectenna array 2 using Input Variables 305 (frequency f, power transmitted $P_t$, Transmitter aperture area $A_t$), the maximum feasible power density from WPES MSAV Experimental Rectenna Performance Data 12A, and the speed of light constant c during step 605F.

FIG. 12B shows a table of exemplary equations used by functions in the CPSA_INIT 242 and CPSA_CALLLBACK 246 function groups of FIGS. 9B1, 9B2 and 9D, and which use variables from FIGS. 10B1 and 10B2. Equation 515 calculates a value k for use in step 517 where S 343 is the gap distance between selected coplanar striplines 4B1, 4B2 and W 343 is the width of selected coplanar striplines 4B1, 4B2. Equation 517 calculates a value k', using the value k from equation 515, for use in equation 519. Equation 519 calculates a value $k_1$ for use in step 521 where values a and b are defined in equation 515 and a value h 343 is the height of the substrate of the selected coplanar strips 4B1, 4B2. Equation 521 calculates a value $k_1'$, for use in equation 523, using the value $k_1$ from equation 519. Equation 523 calculates a value $k_{10}$, for use in equation 525, using the values a and b from equation 515 and the value h 343. Equation 525 calculates a value $k_{10}'$, for use in equation 527, using the value $k_{10}$ from step 523. Equation 527 calculates a function $$\frac{K(k)}{K'(k)}$$

for use in equations 529, 531, 533, and 535, that uses one of the user-selected values k, $k_1$, or $k_{10}$ with each respective prime value k', $k_1'$, or $k_{10}'$ corresponding to the chosen value. Equation 529 calculates the effective permittivity 347 of a selected coplanar strip using the formula from step 527 and the dielectric constant er 343. Equation 531 calculates the characteristic impedance 345 of selected coplanar striplines 4B1, 4B2 using the formula from equation 527 and the effective permittivity 347 of the selected coplanar striplines 4B1, 4B2. Equation 533 is an alternative formula that calculates effective permittivity 347 of a selected coplanar strips 4B1, 4B2 using the formula from step 527 and the dielectric constant 343. Equation 535 is an alternative formula that calculates characteristic impedance 345 of the selected coplanar striplines 4B1, 4B2 using the formula from equation 527 and the effective permittivity 529 of the selected coplanar striplines 4B1, 4B2.

FIG. 12C shows an exemplary table of equations used by functions in the DA_INIT and DA_CALLLBACK function groups of FIGS. 9B1, 9B2 and 9D, and which use variables from FIGS. 10B1 and 10B2. Equation 537 calculates the maximum DC power 373 using the reverse bias voltage (vbr) 369 and load resistance (rl) 369 during step 635C. Equation 539 calculates output self-bias DC voltage across the load during step 635A for use in equations 543 and 545 during step 635C. Equation 541 calculates angular frequency during step 635A for us in equations 547. Equations 543 calculates Forward Bias Turn-On Angle $\theta_{on}$ for use in equations 547, 549-553 using $V_x=V_o$ 539 and variable rl during step 635B, and variable $V_x$ and user-input rl during step 635C and 635D. Equation 545 calculates Nonlinear Junction Capacitance $C_j$ for use in equations 547, 551 using $V_x=V_o$ 539 and variable rl during step 635B, and variable $V_x$ and user-input rl 369 during steps 635C and 635D. Equation 547 calculates Diode Input Impedance to be plotted during steps 635B, 635C, 635D. Equation 549 calculates a value A used during step 635D to calculate a Diode RF-to-DC conversion efficiency $\eta_d$ using equation 555. Equation 551 calculates a value B used during step 635D to calculate a Diode RF-to-DC conversion efficiency $\eta_d$ using equation 555. Equation 553 calculates a value C used during step 635D to calculate a Diode RF-to-DC conversion efficiency $\eta_d$ using equation 555. Equation 555 calculates the diode RF-to-DC conversion efficiency using equations 549-554 during step 635D. Equation 556 calculates the input power for use in equation 557 using variable $V_x$ and user-input load resistance 369 during step 635D. Equation 557 calculates the power output from the selected diode using the results from equations 555 and 556 during step 635D. Equation 559 calculates the Voltage output from the selected diode using equations 557 and user-specified rl 369 during step 635D.

Figure 13:
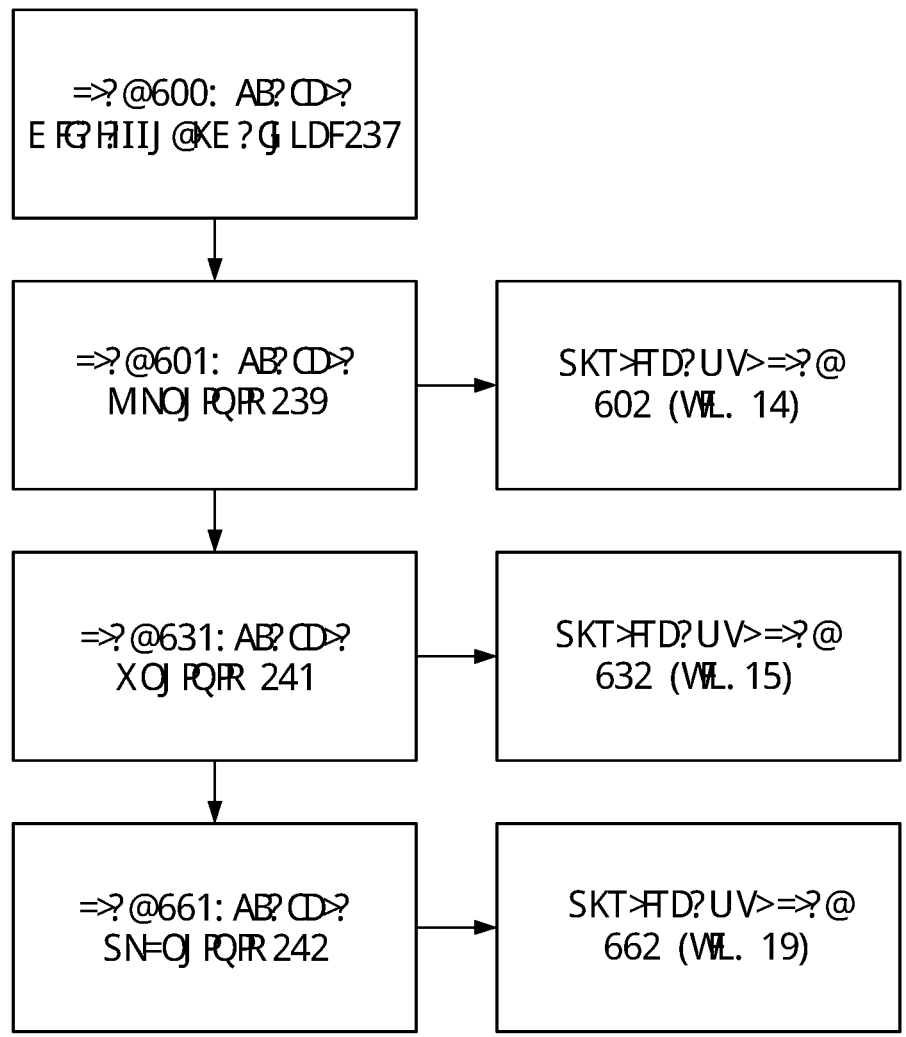
FIG. 13 shows an exemplary, simplified block diagram of the steps followed by the WPES MSAV system.

FIG. 13 shows an exemplary, simplified block diagram of the steps followed by the WPES MSAV software 13. At step 600 the wireless_power_gui function group 237 is executed. At step 601 the WPA_INIT function group 239 is executed. At step 631 the DA_INIT function group 241 is executed. At step 661 the CPSA_INIT function group 242 is executed. More detailed views of steps 601, 631, and 661 are shown in FIGS. 14, 15, and 16 respectively.

Figure 14:
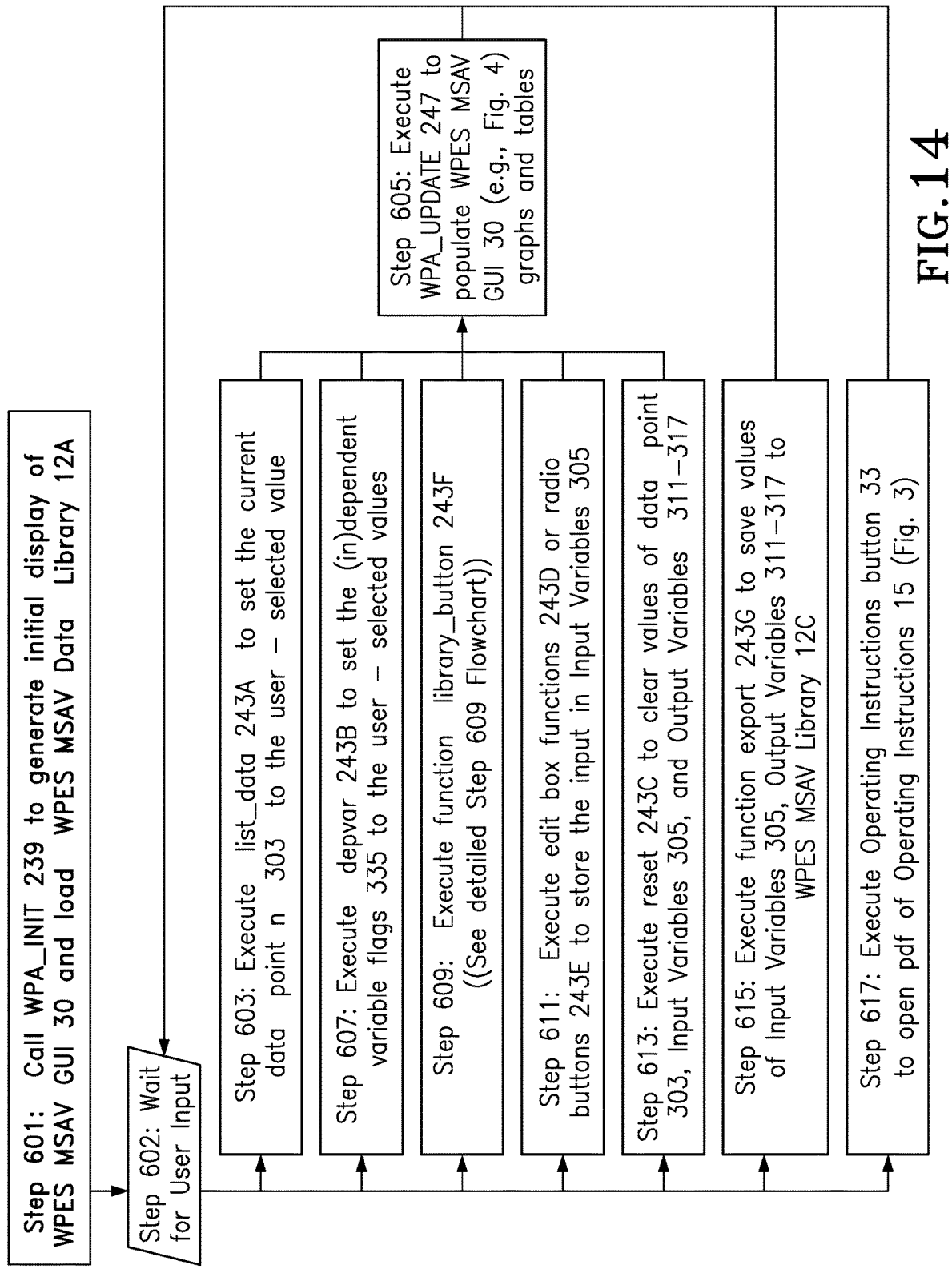
FIG. 14 shows an exemplary, simplified block diagram of the execution of the WPA tool GUI, starting with execution of the WPA_INIT function group (See FIGS. 9A1 and 9A2)

FIG. 14 shows an exemplary, simplified block diagram of the execution of the WPA tool GUI, starting with execution of the WPA_INIT function group FIGS. 9A1 and 9A2. Step 601 calls WPA_INIT 239 which generates an initial display of the WPES MSAV GUI 30 and loads the WPES MSAV Data Library e.g., some or all of libraries 12A, 12B, and 12C. At step 602, the WPES MSAV software 13 waits for user input, which will determine which step among steps 603, 607, 609, 611, 613, 615, and 617 will occur. When the user selects a data point from the Select Data Point dropdown menu or list 39, step 603 executes the function list_data 243A which sets the current data point n 303 to the user-selected value. When the user selects a value from either the Independent Variable dropdown menu 41 or the Dependent Variable dropdown menu 43, step 607 executes the function depbar 243B which sets the independent and dependent variable flags 335 to the user selected values. If the user activates the Open Library action button, step 609 executes the function library_button 243F (see FIG. 16). When the user inputs a value into any of the input variable edit boxes (e.g. Frequency 47, Power Density 49, Transmitted Power 51, Separation Distance 53, Transmitter Aperture Area 55, and Receiver Aperture Area 59) or selects any of the Aperture Shape radio buttons (e.g. Transmitter Aperture Shape 57 or Receiver Aperture Shape 61), step 611 executes the edit box functions 243D or radio button functions 243E which store the input in Input Variables 305. If the user activates the Reset All action button 45, step 613 executes the function reset 243C which clears the values of data point 303, Input Variables 305, and Output Variables 311-317. After any of the steps 603, 607, 609, 611, or 613 is executed, step 605 executes the function group WPA_UPDATE 247, which populates the WPA tool GUI 30 (e.g. FIG. 4) graphs and tables (e.g. Collection Efficiency 73, Rectenna RF-to-DC Conversion Efficiency 67, DC Power Output 89, and Analysis Summary 83). If the user activates the Export Data action button 87, step 615 executes the function export 243G which saves the Input Variables 305 and Output Variables 311-317 to the WPES MSAV Library 12C. If the user activates the Open Operating Instructions action button step 617 opens a PDF version of the Operating Instructions stored within the WPES MSAV Operating Manual data structure 15.

Figure 15:
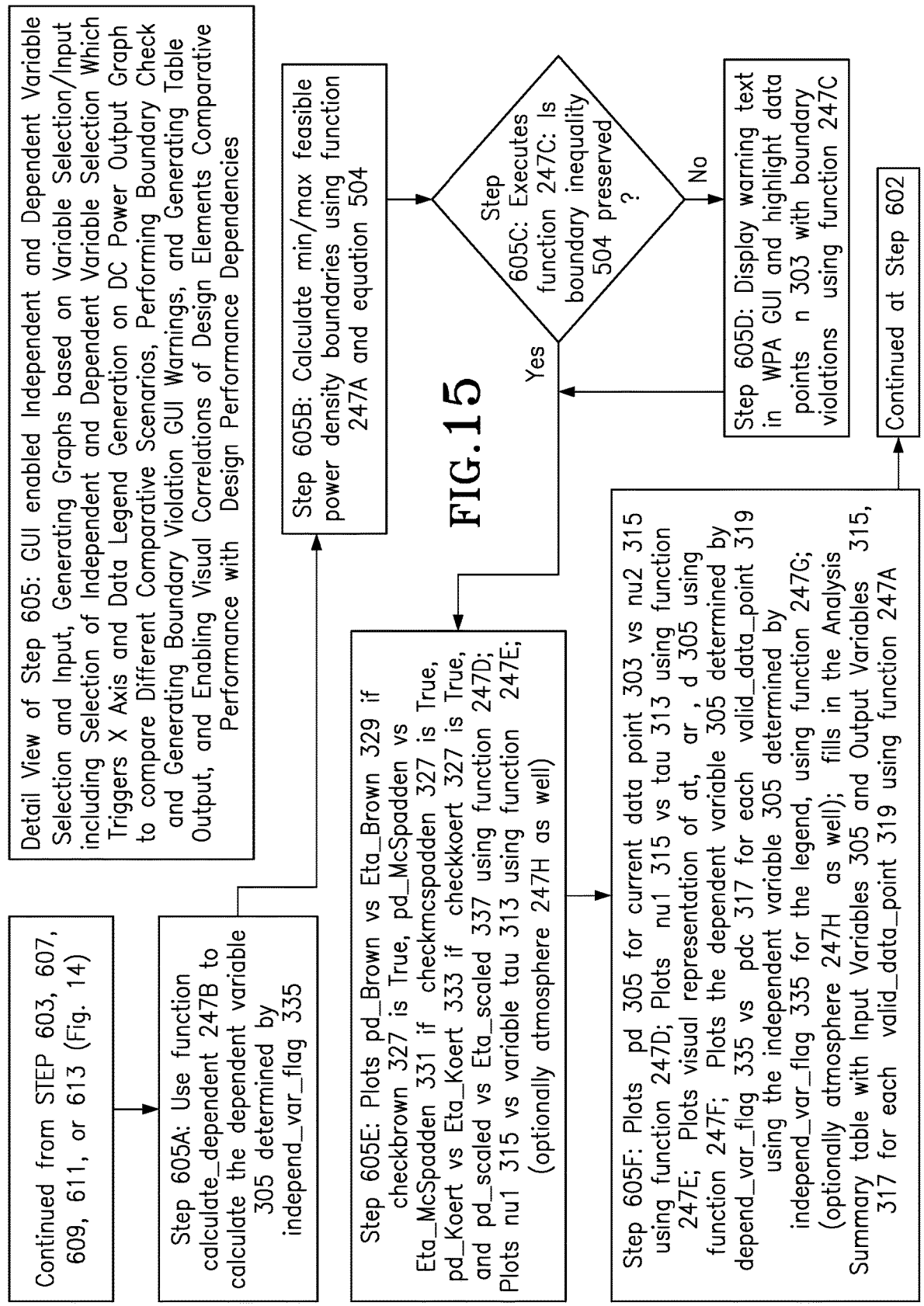
FIG. 15 shows an exemplary block diagram showing execution of the WPA_UPDATE function group (See FIG. 9E)

FIG. 15 shows an exemplary block diagram showing detailed execution of the WPA_UPDATE function group 247. Step 605A uses equation 501 in function calculate_dependent 247B to calculate the dependent variable 43 by using the independent variable 41 as indicated by the independ_var_flag 335. Step 605B calculates min/max feasible power density boundaries using function 247A and equation 504. Step 605C executes function check_bounds 247C which check if the boundary inequality 504 calculated in Step 605B is preserved. If the boundary condition is not preserved, at step 605D, the function check_bounds 247C displays warning text in the Analysis Summary section 83 of the WPA toll GUI 30 and highlight data points n 30l with boundary violations. If the boundary inequality is preserved in step 605C or after the boundary condition warning text 85 has been displayed, step 605E executes function plot_axes1 247D which plots pd_Brown vs Eta_Brown 329 if checkbrown 327 is True, pd_McSpadden vs Eta_McSpadden 331 if checkmcspadden 327 is True, pd_Koert vs Eta_Koert 333 if checkkoert 327 is True, and pd_scaled vs Eta_scaled 337 in the Rectenna RF-to-DC Conversion Efficiency graph 67. Step 605E also executes function plot_axes2 247E which plots the variable nu1 315 vs the variable tau 313 on the Collection Efficiency graph 73. Step 605F also executes the function plot_axes3 247D which plots pd 305 for the current data point n 303 vs the variable nu2 315 on the Rectenna RF-to-DC Conversion Efficiency graph 67. Step 605F also executes the function plot_axes3 247F which generates the Visual Representation of Apertures diagram 77 using at, ar, and d 305. Step 605F also executes the function plot_axes4 247G which plots the dependent variable 305, as identified by the depend_var_flag 335, vs the variable pdc 317 for each valid_data_point 319, using the independent variable 305 as identified the independ_var_flag 335, in the legend 66. Step 605F also executes the function update 247A which populates the Analysis Summary table 83 with the Input Variables 305 and the Output Variables 315, 317 for each valid_data_point 319.

Figure 16:
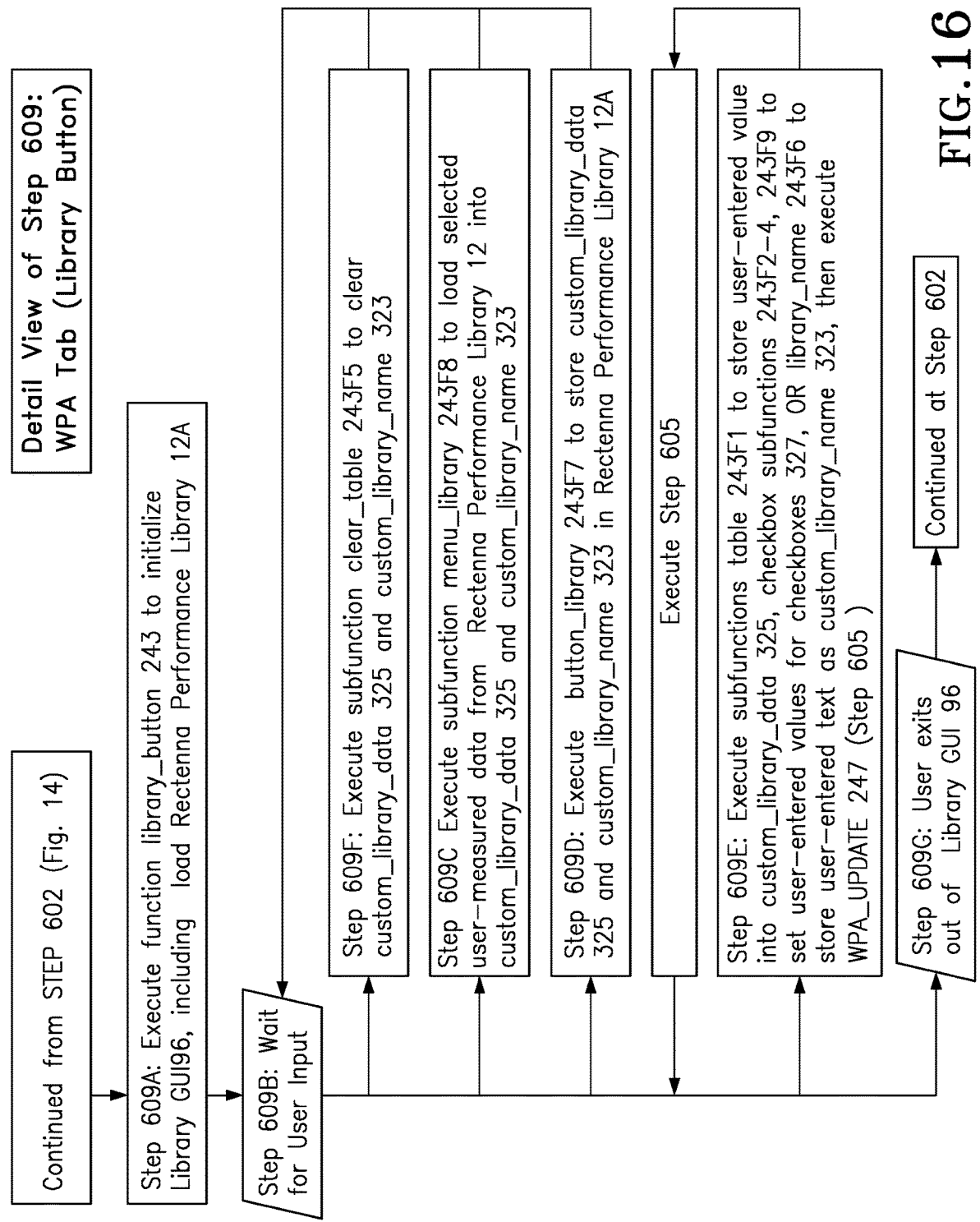
FIG. 16 shows an exemplary block diagram showing execution steps of the library_button function group (e.g., see FIGS. 9C1 and 9C2)

FIG. 16 shows an exemplary block diagram showing execution steps of the library_button function group FIGS. 9C1 and 9C2. Upon user activation of the Open Library action button 65, step 609A executes the function library_button 243 which initializes and displays the Interactive User-Input Action and Experimental Data Storage Library GUI 96 and loads the Rectenna Performance Library 12A. At step 609B, the WPES MSAV software 13 waits for user input which will determine which step will be executed next. If the user activates the Clear Table action button 115, step 609F executes the function clear_table 243F5 which clears the variable custom_library_data 325 and the variable custom_library_name 323. If the user selects data from the User Data dropdown menu 109, step 609C executes the function menu_library 243F8 which loads the selected user measured data from the Rectenna Performance Library 12A into the variables custom_library_data 325 and custom_library name 323 and displays the data in the User Measured Data table 106. If the user activates the Add to Library action button 113, step 609D executes the function button_library 243F7 which stores the custom_library_data 325 and custom_library_name 323 in the Rectenna Performance Library 12A using the data entered into the User Measured Data table 106 and the name entered into the User Data Name text box 111.

After any of step 609F, 609C, or 609D are executed, the WPES MSAV software 12A returns to step 609B and waits for user input before executing any further steps. When the user inputs data into the User Measured Data table 106, step 609E executes the function table 243F1, which stores the user entered data into the variable custom_libray_data 325, checkbox 243F2-4, 243F9 which sets the user-entered values for checkboxes 327, or the function library_name 243F6 which stores the user-entered text as custom_library name 323, then executes the function group WPA_UPDATE 247 (see e.g. step 605, FIG. 15). If the user leaves the Interactive User-Input Action and Experimental Data Storage Library GUI 96, step 609G exits the GUI 96 and returns to the WPA tool GUI 30.

Figure 17:
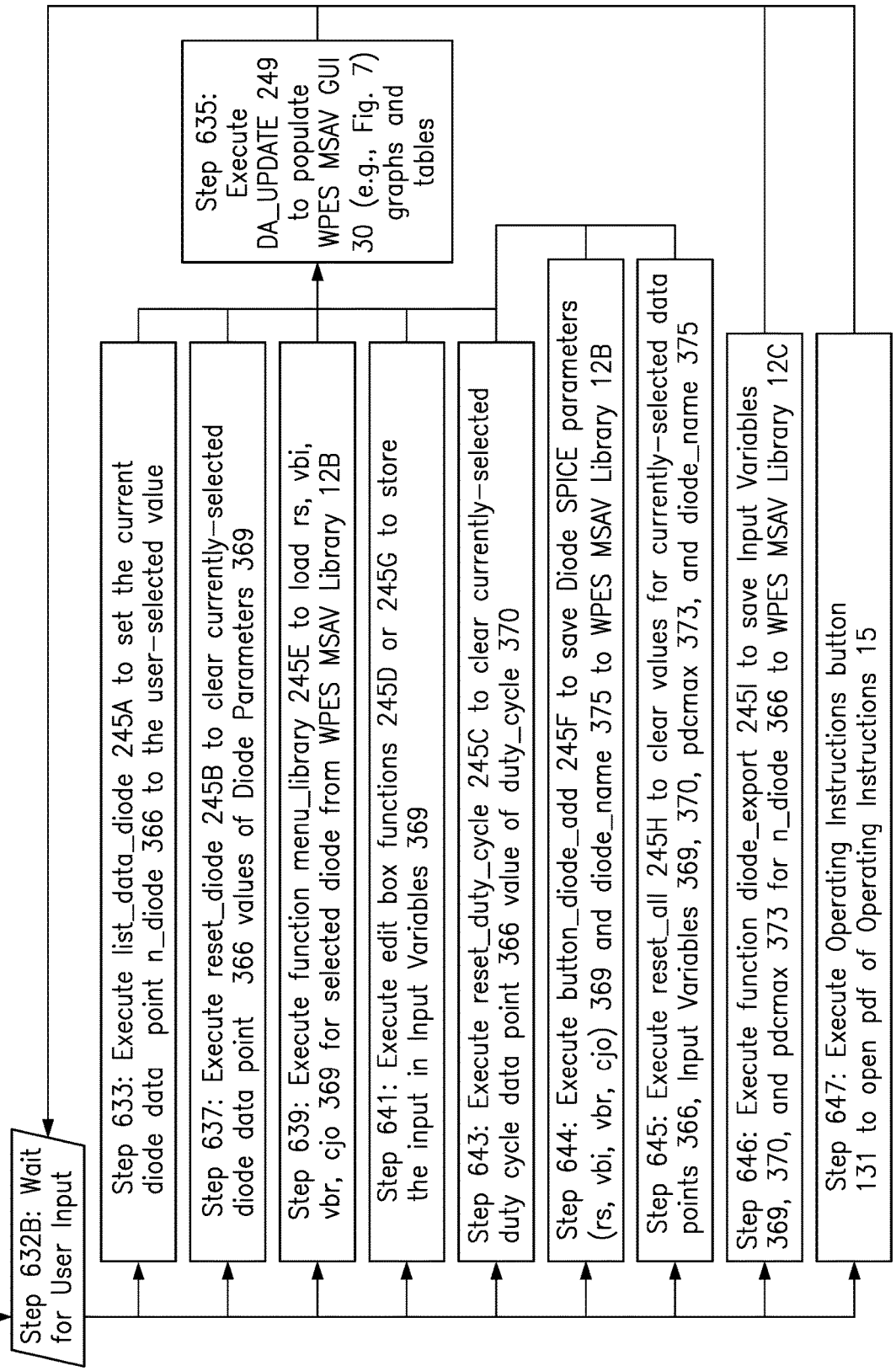
FIG. 17 shows an exemplary block diagram showing execution steps of the DA_INIT function group (e.g., see FIGS. 9B1 and 9B2)

FIG. 17 shows an exemplary block diagram showing the execution steps of the DA_INIT function group 241. After step 601 finishes (which generates the WPA tool tab 31), step 631 calls the DA_INIT function group 241 which generates an initial display the of the WPES MSAV GUI's 30 DA tool tab 129 and loads the one or more of the WPES MSAV Data Libraries 12A, 12B, and/or 12C. At step 632 the WPES MSAV software 13 waits for input from the user, which determines what step will be executed. When the user selects a value from the Diode Select Data Point list menu 139, step 633 executes the function list_data_diode 245A which sets the current diode data point n_diode 366 to the user selected value. If the user activates the Reset Diode action button 143, step 637 executes the function reset_diode 245B which clears the currently selected diode data point n_diode 366 values for the Diode SPICE Parameters (e.g. f, rs, vbi, vbr, cjo, rl) 369 in the Diode Inputs section 147. If the user selects a diode from the Select Diode from Library drop-down menu 151, step 639 executes the function menu_library 245E which loads the SPICE Parameters (rs, vbi, vbr, and cjo) 369 for the selected diode 151 from the WPES MSAV Library 12B. If the user inputs values into any of the edit boxes in the Input variables sections 145, 147, 167, step 641 executes either one of the functions edit_f, edit_rs, edit_vbi_edit_vbr, edit_cjo 245D or the function edit_rl 245G (the function executed corresponds to the edit box into which a value is entered) which each store the input values into the one of the Input Variables (f, rs, vbi, vbr, cjo, fl) 369. If the user activates the Reset Duty Cycle action button 141, step 643 executes the function reset_duty_cycle 245C which clears the currently-selected duty cycle data point n_duty-cycle 366 value of duty_cycle 370. If the user activates the Add Diode to Library action button 163, step 644 executes the function button_diode_add 245F which saves the input Diode SPICE Parameters (rs, vbi, vbr, cjo) 369 and the user-enter diode_name 375 (from the custom diode name edit box 161) to the WPES MSAV Library 12B. If the user activates the Reset All action button 169, step 647 executes the function reset_all 245H which clears the currently-selected data points 366, Input variables 369, pdcmax 373, and diode_name 375. After execution of any one of steps 633, 637, 639, 641, 643, 644, or 645, step 635 executes the function group DA_UPDATE 249 (see FIG. 18) which populates and updates the DA tool GUI's 30 graphs and tables (e.g. Load Resistance vs Calculated Diode Impedance 175, Diode Voltage vs Calculated Diode Impedance 179, Calculated RF-to-DC Conversion Efficiency (Continuous Wave) 181, Calculated RF-to-DC Conversion Efficiency (Variable Duty Cycle) 193, and Analysis Summary table 183). If the user activates the Export Selected Diode action button 191, step 646 executes the function diode_export 245I which saves the Input Variables 369, 370, and pdcmax 373 for the variable n_diode 366 to the WPES MSAV Library 12C. If the user activates the Open Operating Instructions action button 131, step 647 opens a PDF containing the Operating Instructions for the WPES MSAV software 13. After execution of step 635, 646, or 647, the WPES MSAV software 13 returns to step 632 and awaits user input.

FIG. 18 shows an exemplary block diagram showing the execution steps of the DA_UPDATE function group 249. At step 635A, the function update 249A calculates pdcmax 373 using equation 557 if the necessary Input Variables 369 (f, rs, vbi, vbr, cjo, rl) 369 are defined. The function update 249A then populates the Diode SPICE Parameters and Max Output DC Power table 185 using the Input Variables 369, pdcmax 373, and diode_name 375. At step 635B, the function plot_axes1 249B plots diode input impedance 371 vs variable rl 369 in the Load Resistance vs Calculated Diode Impedance graph 175 if the required Input Variables 369 are defined and populates the Electrical Characteristics of Diode table 187 sing the variable rl 369 and the variable Diode Input impedance 371. If either the variable rl 369 or the variable Diode Input impedance are not defined, then step 635B is skipped. Step 635C executes the function plot_axes2 249C which plots the diode input impedances 371 vs the user-defined rl 369 on the Load Resistance vs Calculated Diode Impedance graph 175 and displays the red line 173 as defined by rl 369. If either the diode input impedance 371 or the user-defined rl 369 are not defined, step 635C is skipped. Step 635D executes function plot_axes3 249D which plots the Input Power, as calculated using equation 556, vs the conversion efficiency, as calculated using equation 555, to populate the Calculated RF-to-DC Conversion Efficiency (Continuous Wave) graph 181 and to populate the Power and Voltage table 189 using the values from variables output voltage from equation 559 and output power from equation 557. If either the output voltage from equation 559 or the output power from equation 557 are not defined, then step 635D is skipped. At Step 635E: Run function 249E

Figure 19:
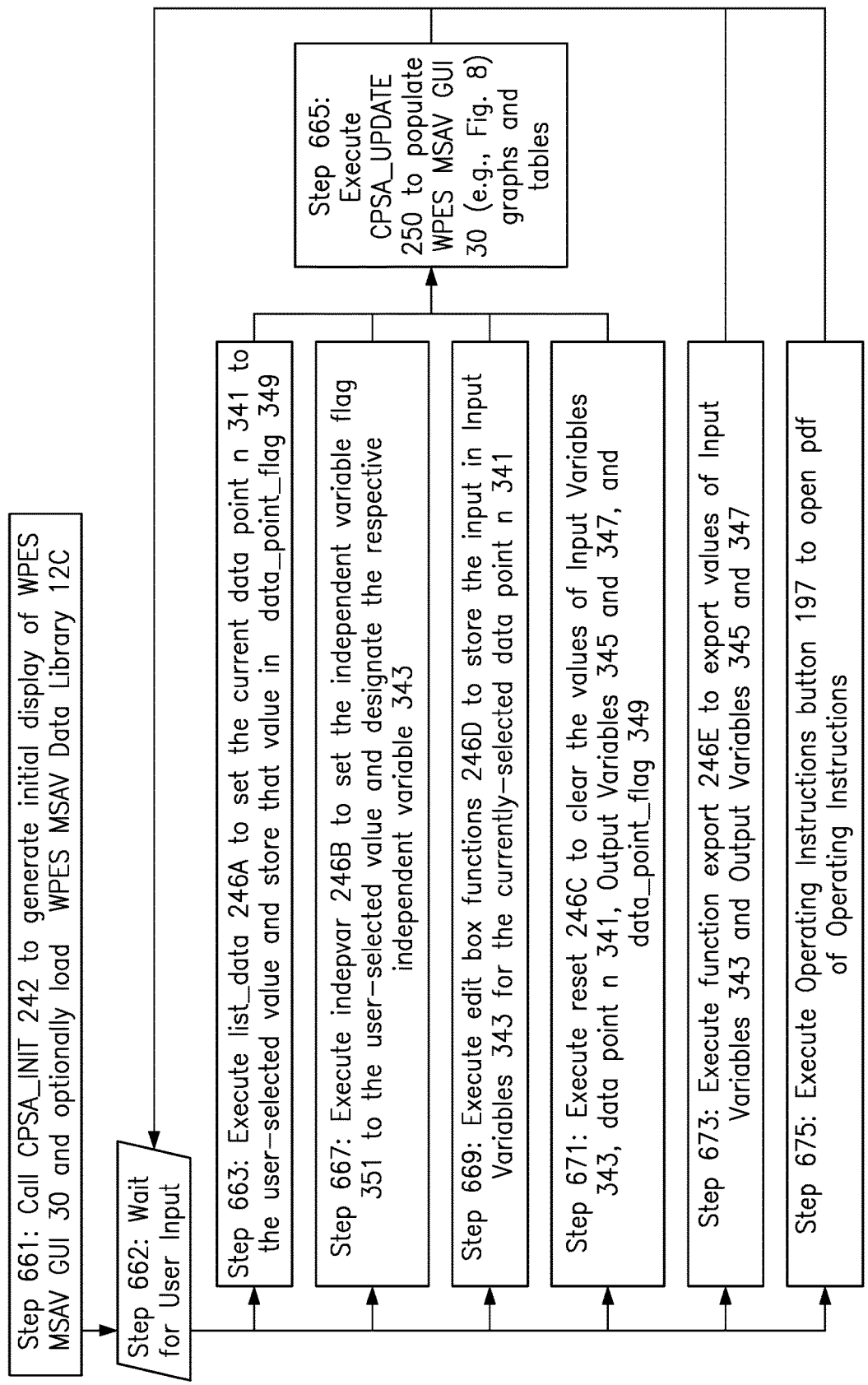
FIG. 19 shows an exemplary block diagram showing the execution steps of the CPSA_INIT function group (e.g., see FIGS. 9B1 and 9B2)

FIG. 19 shows an exemplary block diagram showing the execution steps of the CPSA_INIT function group 242. Step 661 calls the CPSA_INIT function group 242 which generates and displays the initial CPSA tool GUI 30 and loads one or more of the WPES MSAV Data Libraries 12A, 12B, and/or 12C. After the initial display is generated, at step 662 the WPES MSAV software 13 waits for the user input, which determines which step is executed next. When the user selects a data point from the Select Data Point list menu 203, step 663 executes the function list_data 246A which sets the current data point n 341 to the user-selected values and stores that value in the variable data_point_flag 349. When the user selects an independent variable from the Independent variable dropdown menu 205, step 667 executes the function indepvar 254B which sets stores the variable independ_var_flag 351 which designates the respective independent variable 343. When the user edits one of the Input Variables edit boxes (Dielectric Constant 209, Gap 211, Width 213, or Height 215) step 669 executes the edit box functions 256D which store the Input Variables 343 for the currently selected data point n 341. If the user activates the Reset All action button 207, step 671 executes the function reset 246C which clears the values stored in Input Variables 343, data point n 341, Output Variables 345 and 347, and data_point_flag 349. After execution of any of the steps 663, 667, 669, or 671, step 665 executes the function group CPSA_UPDATE 250 which populates the CPSA tool GUI 30 graphs and tables (e.g. Gap vs. Characteristic Impedance 225, Gap vs. Effective Permittivity 227, and Analysis summary table 219. If the user activates the Export Data action button 221, step 673 executes the function export 246E which exports the values of Input Variables 343 and Output Variables 345 and 347. If the user activates the Open Operating Instructions action button 197, step 675 opens a PDF of the Operating Instructions. After the execution of step 665, 673, or 675, the WPES MSAV software 13 returns to step 662 and awaits user input.

Figure 20:
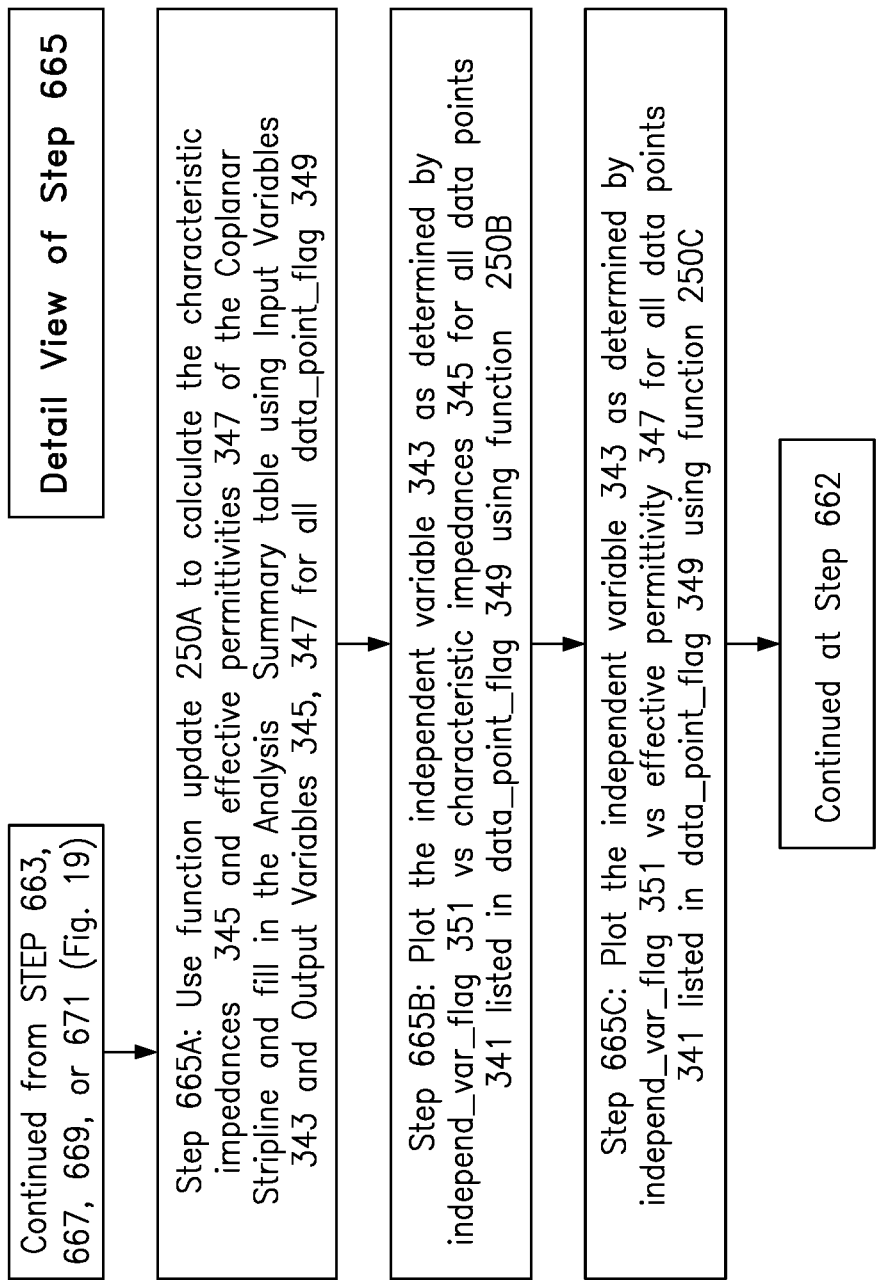
FIG. 20 shows an exemplary block diagram showing the execution steps of the CPSA_UPDATE function group (e.g., see FIGS. 9C1 and 9C2)

FIG. 20 shows an exemplary block diagram showing the execution steps of the CPSA_UPDATE function group 250. Step 665A executes the function update 250A which calculates the characteristic impedance 345 and effective permittivity 347 of the coplanar striplines 4B1, 4B2 and populates the Analysis Summary table 219 using Input Variables 343 and Output Variables 345, 347 for all data_point_flag 349. Step 665B executes function plot_axes1 250B which plots the independent variable 343 as indicated by the independ_var_flag 351 vs characteristic impedance 345 for all data points 341 stores in the variable data_point_flag 349 and displays the result in the Independent Variable vs. Characteristic Impedance graph 223 (e.g. Gap vs. Characteristic Impedance). Step 665C executes the function plot_axes2 250C which plots the independent variable 343 as indicated by the independ_var_flag 351 vs effective permittivity 347 for all data points 341 listed in the data_point_flag 349, and displays the result in the Independent Variable vs. Effective Permittivity graph 227 (e.g. Gap vs. Effective Permittivity).

Figure 21A:
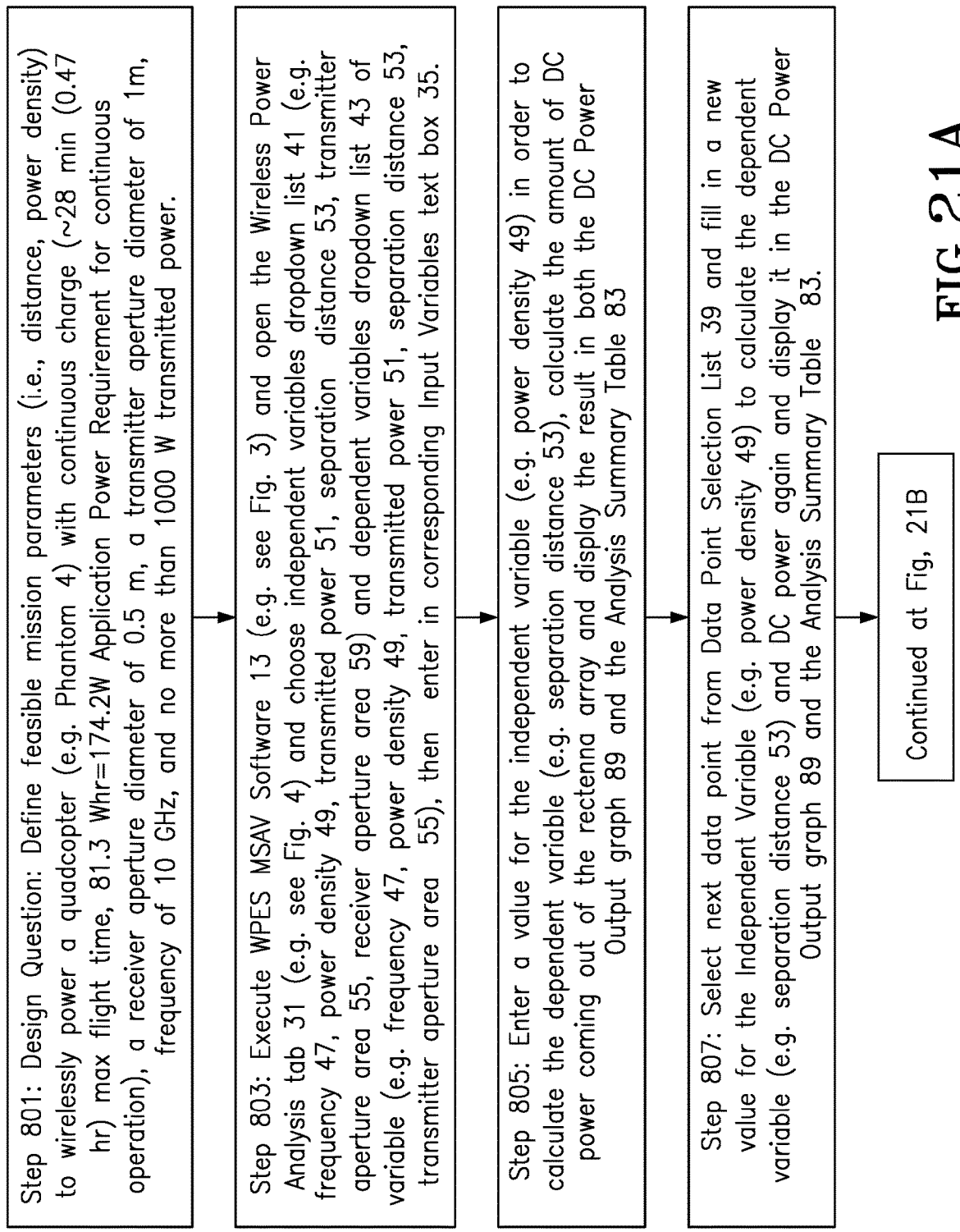
FIG. 21A shows an exemplary block diagram that shows exemplary steps for using the WPA tool GUI.

FIG. 21A shows an exemplary block diagram that shows exemplary steps for using the WPA tool GUI. At step 801, the user defines feasible mission parameters (i.e., distance, power density) to, for example, wirelessly power a quadcopter (e.g. Phantom 4) with a continuous charge, using a receiver aperture diameter of 0.5 m, a transmitter aperture diameter of 1 m, a frequency of 10 GHz, and no more than 1000 W of transmitted power. Step 803 executes WPES MSAV Software 13 (e.g. see FIG. 3) and opens the Wireless Power Analysis tab 31 (e.g. see FIG. 4) and the user chooses the independent variable from the independent variables dropdown list 41 (e.g. frequency 47, power density 49, transmitted power 51, separation distance 53, transmitter aperture area 55, receiver aperture area 59) and the dependent variable from the dependent variables dropdown list 43 of variable (e.g. frequency 47, power density 49, transmitted power 51, separation distance 53, transmitter aperture area 55), then the user inputs values into the corresponding Input Variables text box 35. At step 805, the user inputs a value for the independent variable (e.g. power density 49) in order to calculate the dependent variable (e.g. separation distance 53), calculate the amount of DC power coming out of the rectenna array and display the result in both the DC Power Output graph 89 and the Analysis Summary Table 83. At step 807 the user selects the next data point from Data Point Selection List 39 and inputs a new value for the Independent Variable (e.g. power density 49) to calculate the dependent variable (e.g., separation distance 53) and DC power again and display it in the DC Power Output graph 89 and the Analysis Summary Table 83.

Figure 21B:
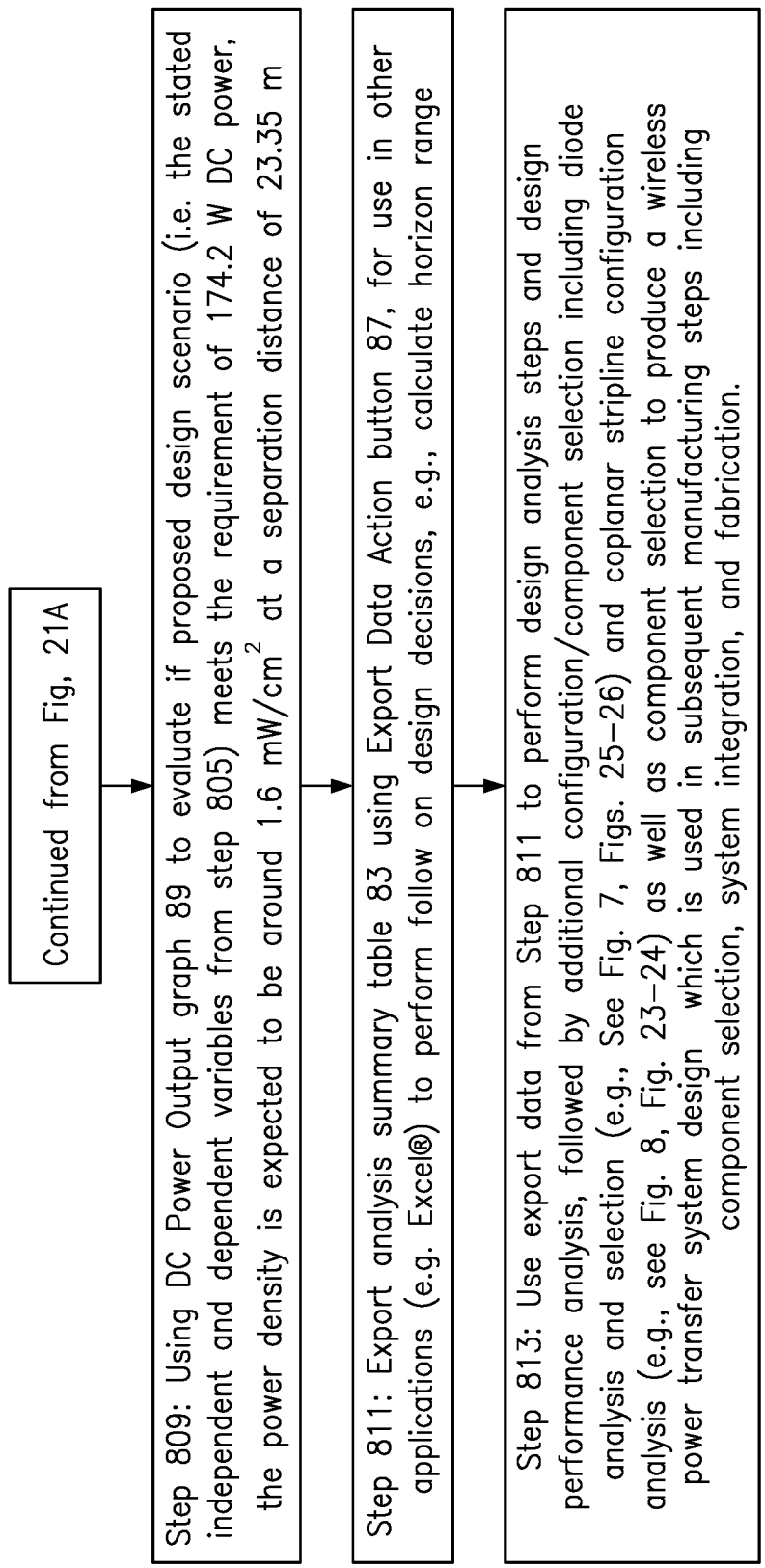
FIG. 21B continues the exemplary block diagram of FIG. 21A.
Figure 22A:
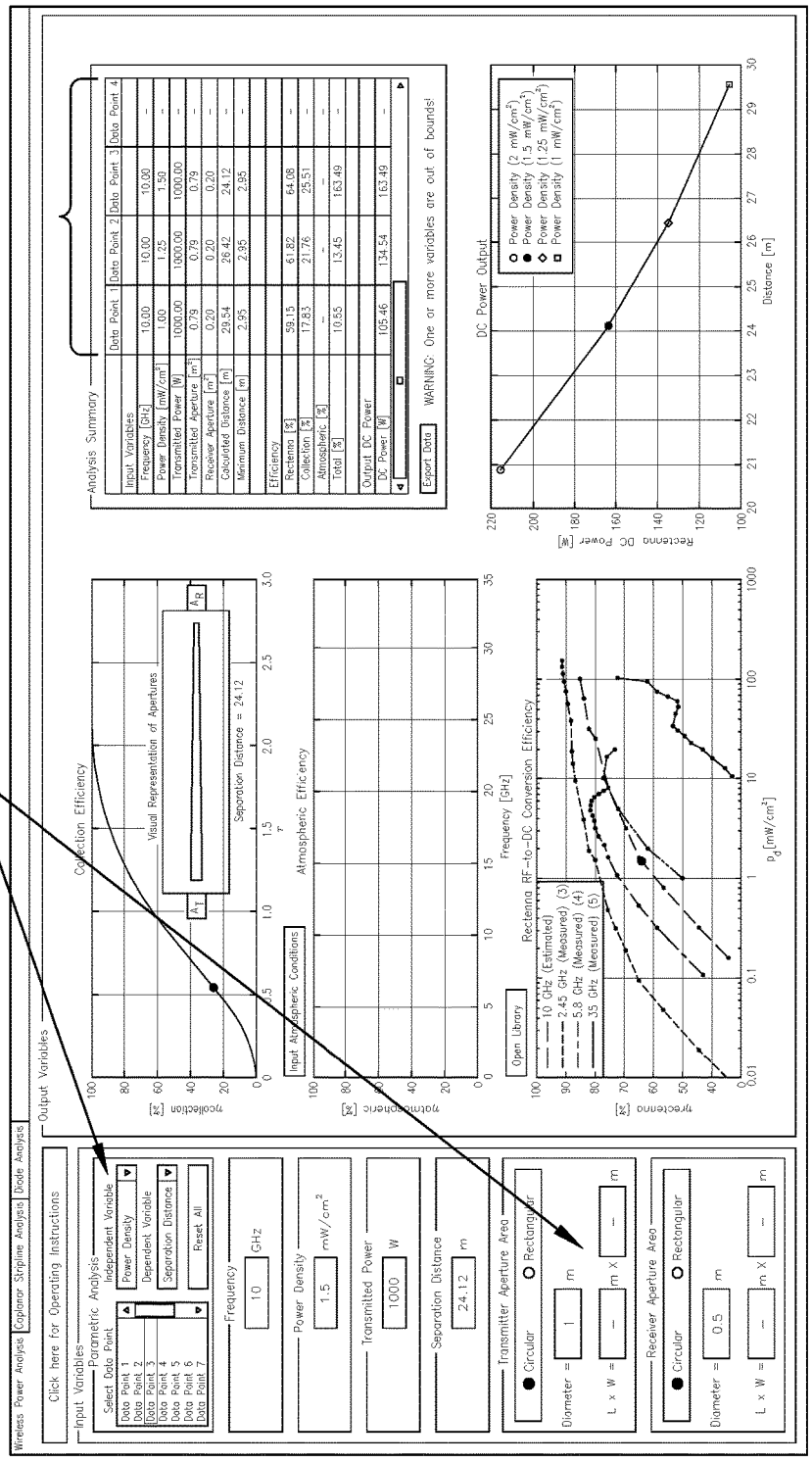
FIGS. 22A, 22B, 22C, and 22D show a simplified visualization of the block diagram steps of FIGS. 21A and 21B, overlaid and associated with exemplary GUI displays.
Figure 22B:
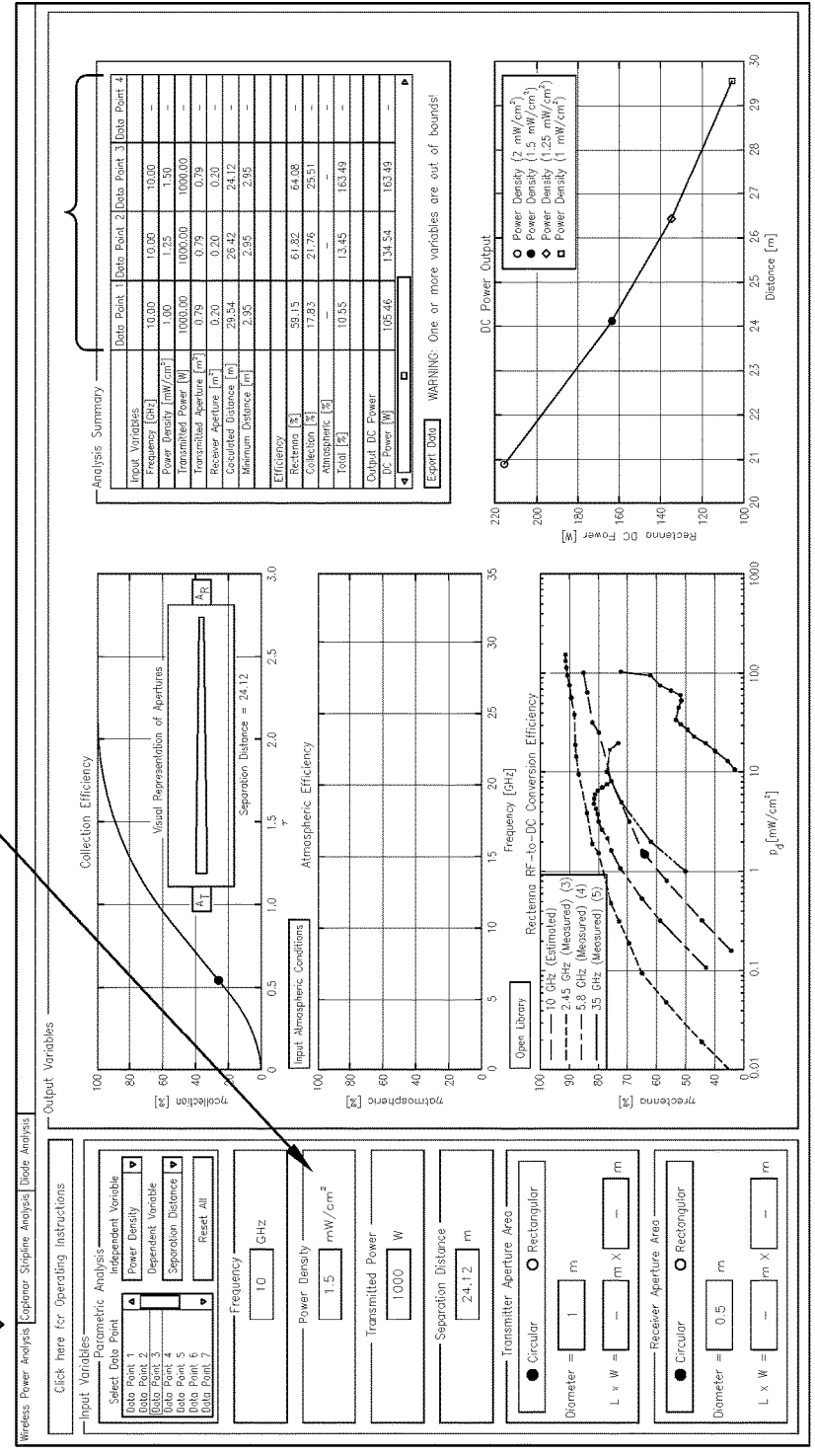
Figure 22C:
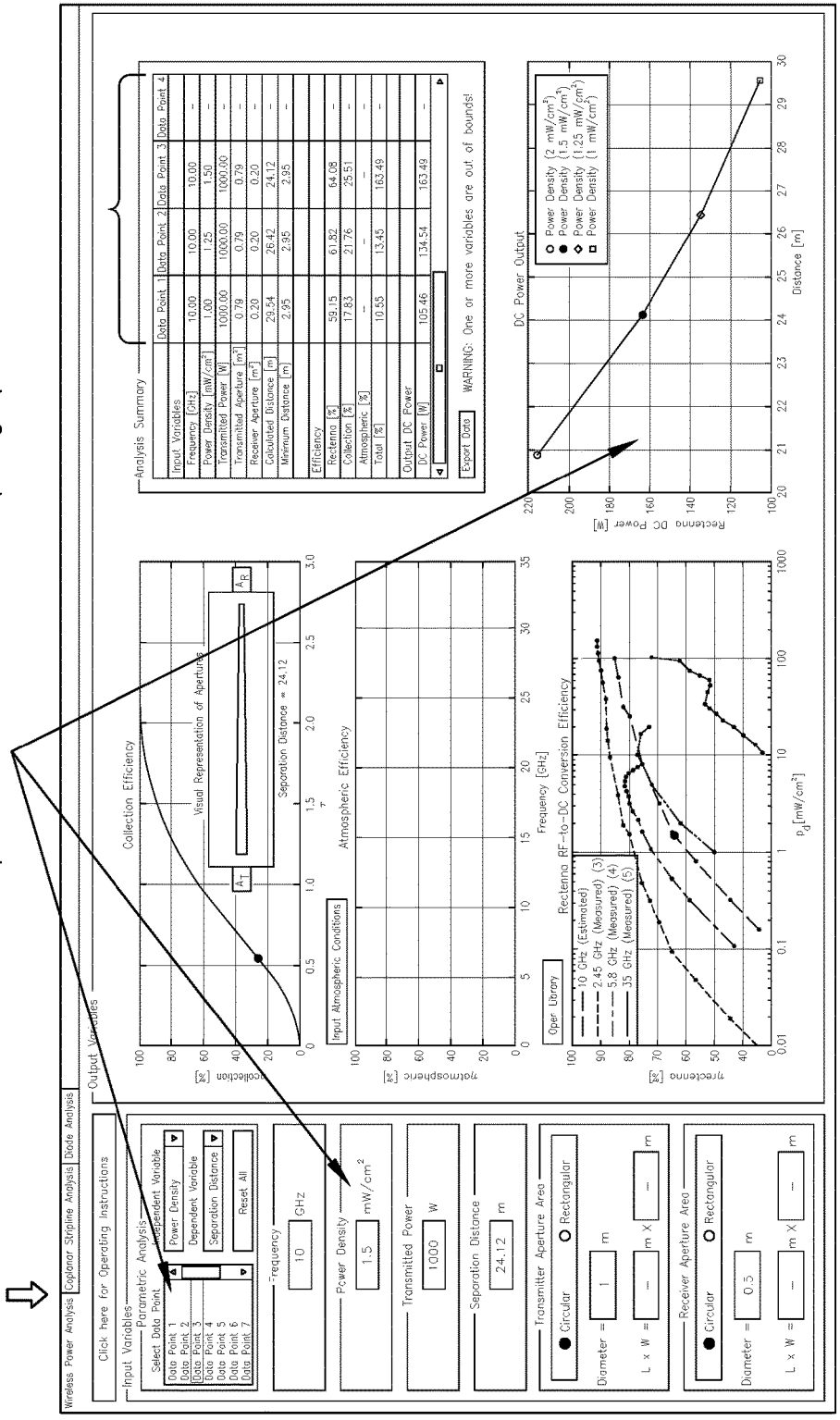
Figure 22D:
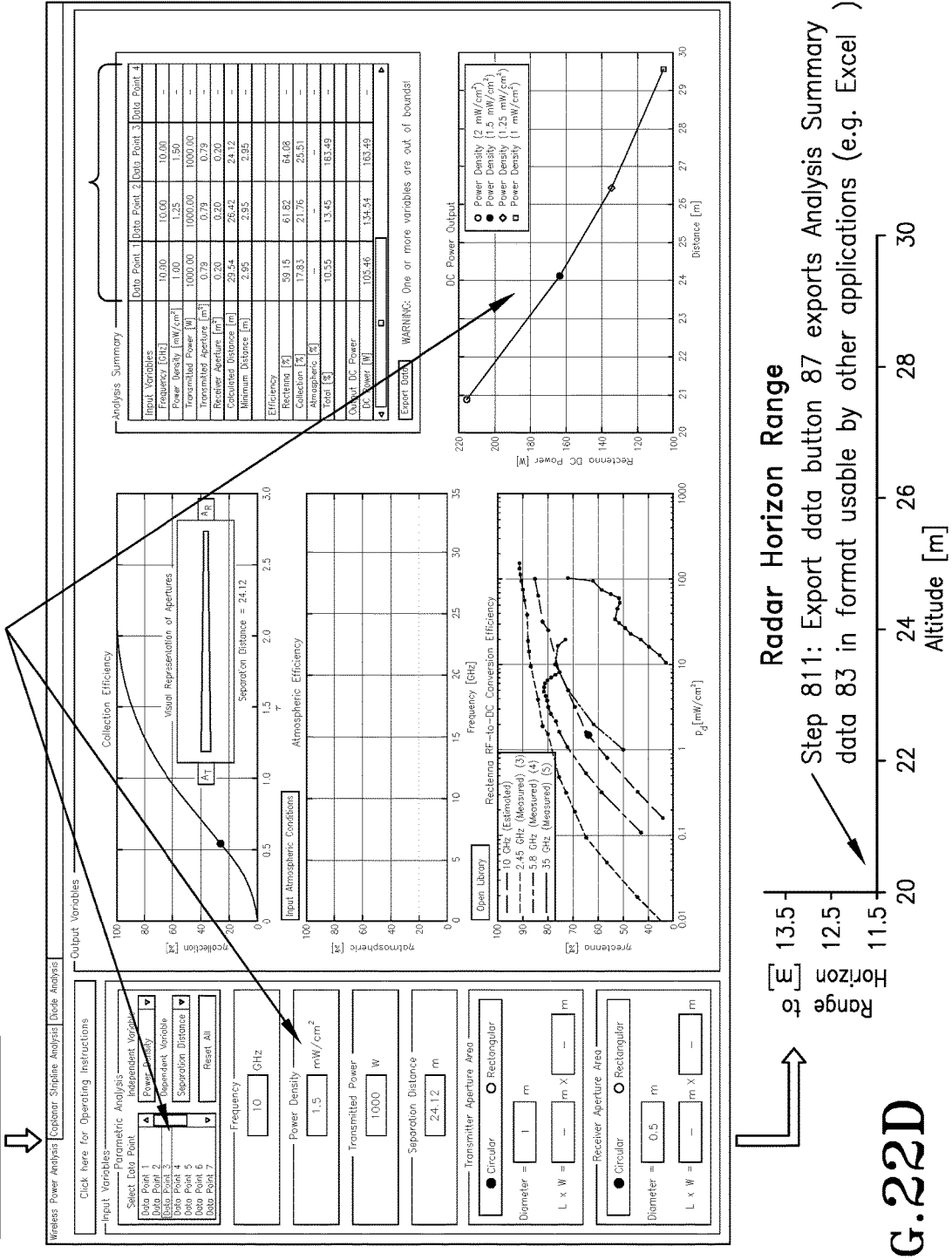

FIG. 21B continues the exemplary block diagram of FIG. 21A. At Step 809 the user uses the DC Power Output graph 89 to evaluate if proposed design scenario (stated independent and dependent variables from step 805) meets the requirement of, for example, 174.2 W DC power, where the power density is expected to be around 1.6 mW/cm² at a separation distance of 23.35 m. At Step 811, the user activates the Export Data action button 87, which exports the analysis summary table 83 for use in other applications (e.g. Excel®) to perform follow up design decisions such as, for example, to calculate horizon range. At Step 813 the user uses the export data from Step 811 to perform design analysis steps and design performance analysis, followed by additional configuration/component selection including diode analysis and selection (e.g., See FIG. 7, FIGS. 25, 26A, 26B, 26C and 26D) and coplanar stripline configuration analysis (e.g., see FIG. 8, FIGS. 23, 24A, 24B, 24C, and 24D) as well as component selection to produce a wireless power transfer system design which is used in subsequent manufacturing steps including component selection, system integration, and fabrication.

FIGS. 22A, 22B, 22C, and 22D show a visualization of the block diagram steps of FIGS. 21A and 21B, with exemplary GUI displays. At Step 803 the user opens WPES MSAV Software 13 and opens Wireless Power Analysis tabb 31. The user designates and selects independent and dependent variables from variable dropdown lists 41, 43 respectively (e.g. frequency 47, power density 49, transmitted power 51, separation distance 53, transmitter aperture area 55, receiver aperture area 59) and enters known values from design question from Step 801. At Step 805 the user enters candidate value for independent variable (e.g. power density 49) for evaluation to determine if resulting combination will meet Application Power Requirement for continuous operation and falling within upper and lower rectenna performance values of data stored in WPES MSAV Experimental Rectenna and Diode Performance Data Library data 12A and display Application Power Requirement for continuous operation 370 on DC Power Output graph 89. At Step 807 the user selects a new data point from Data Point list 39 and enter another candidate value for Independent Variable (e.g. power density 49) and display Application Power Requirement for continuous operation on DC Power Output graph 89. At Step 809 the user can enter multiple independent variables (e.g. power density 49) for multiple data points to be displayed in DC Power Output graph 89. At Step 811 the user activates the Export Data button 87 which exports Analysis Summary data 83 in a format usable by other applications (e.g. Excel®).

Figure 23:
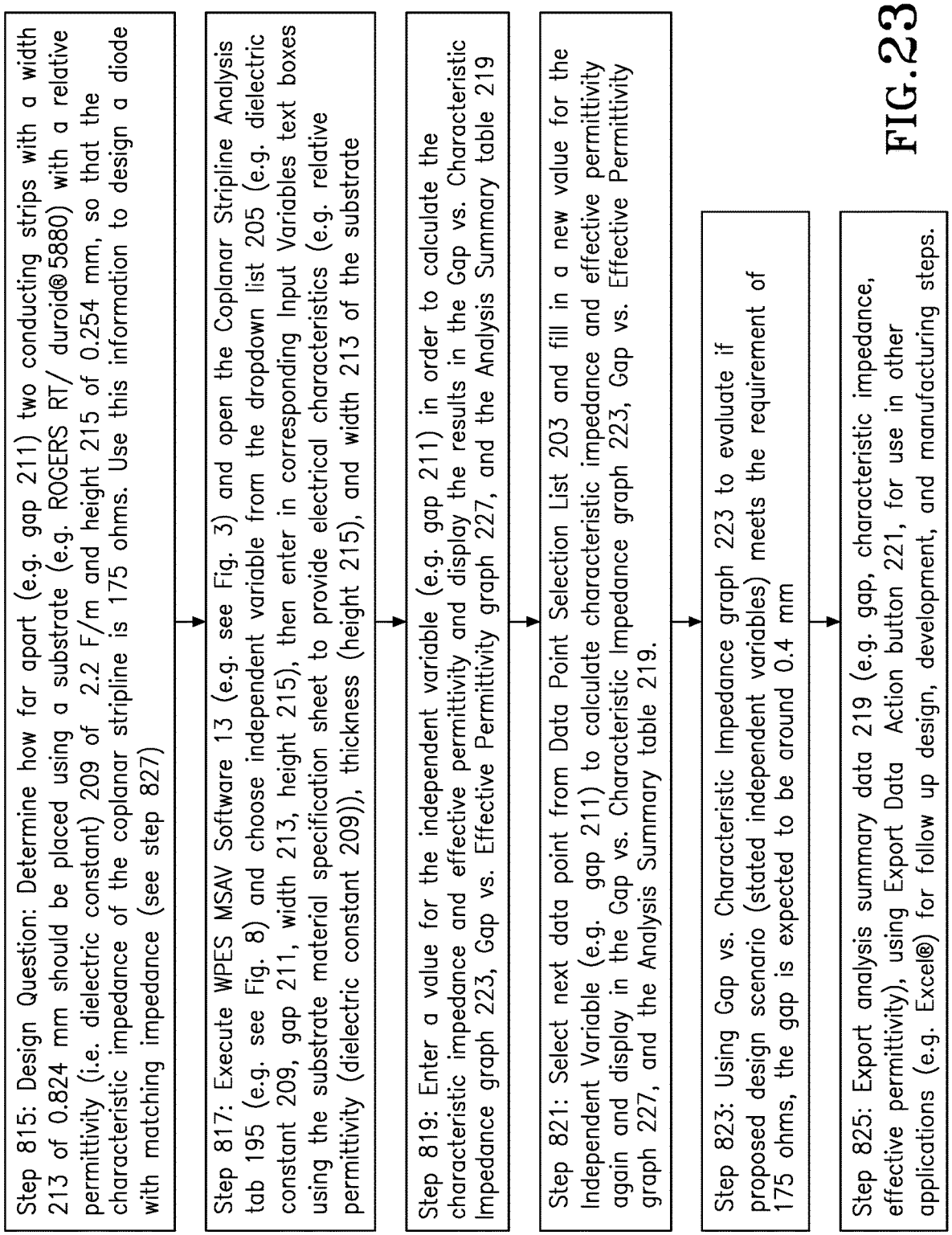
FIG. 23 shows an exemplary block diagram that shows exemplary steps for using the CPSA tool GUI.
Figure 24A:
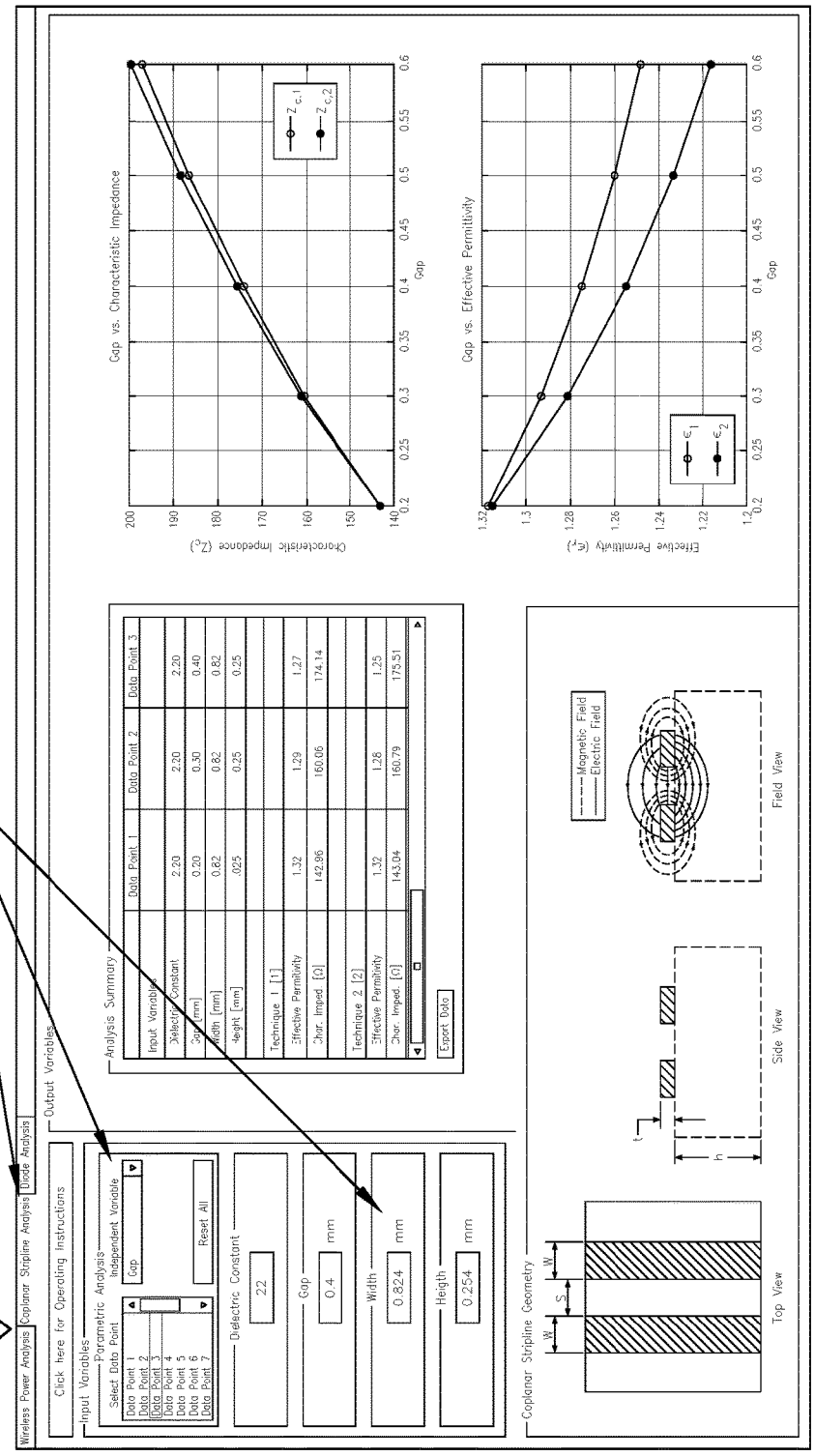
FIGS. 24A, 24B, 24C, and 24D show a simplified visualization of the block diagram steps of FIG. 23 overlaid and associated with exemplary GUI displays.
Figure 24B:
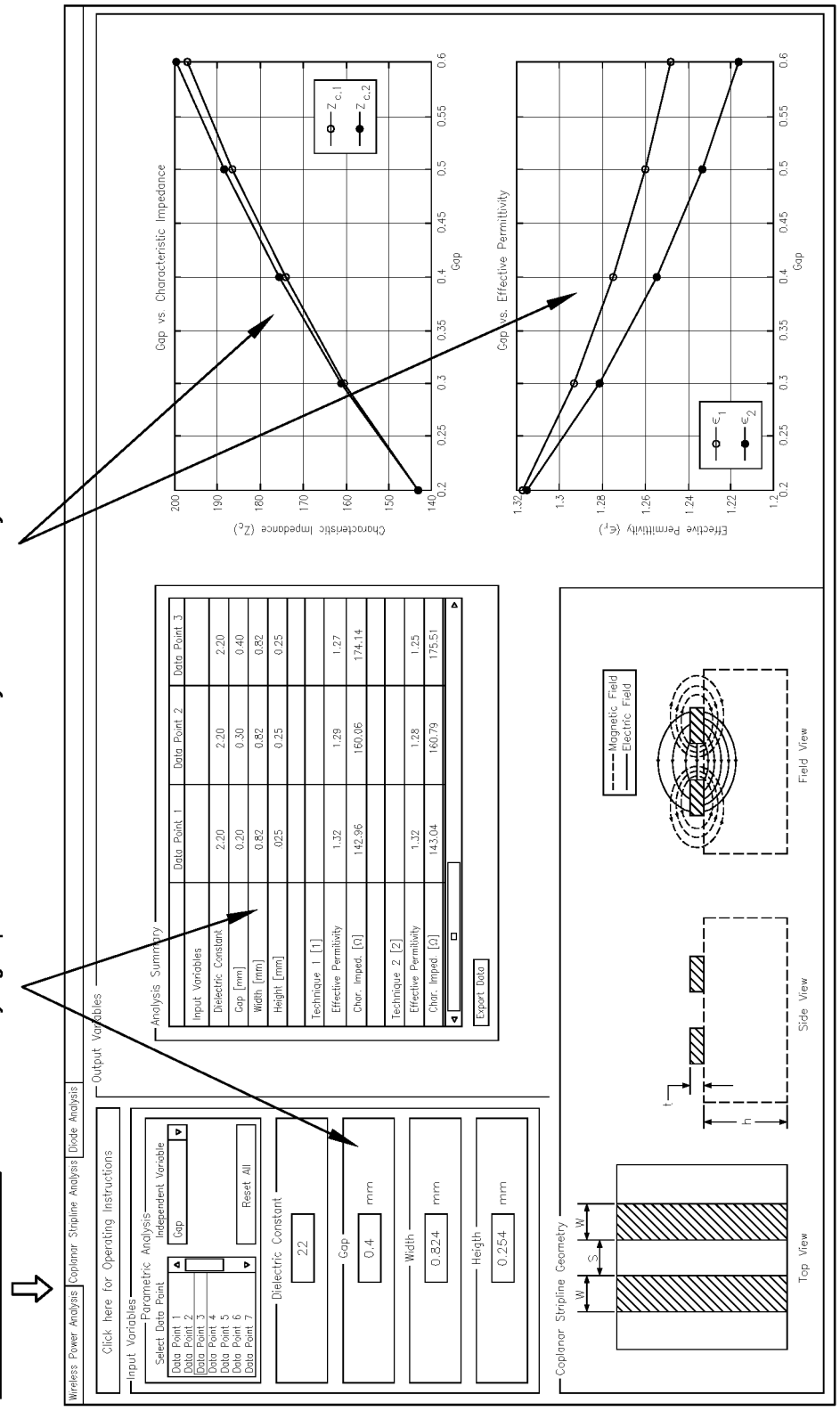
Figure 24C:
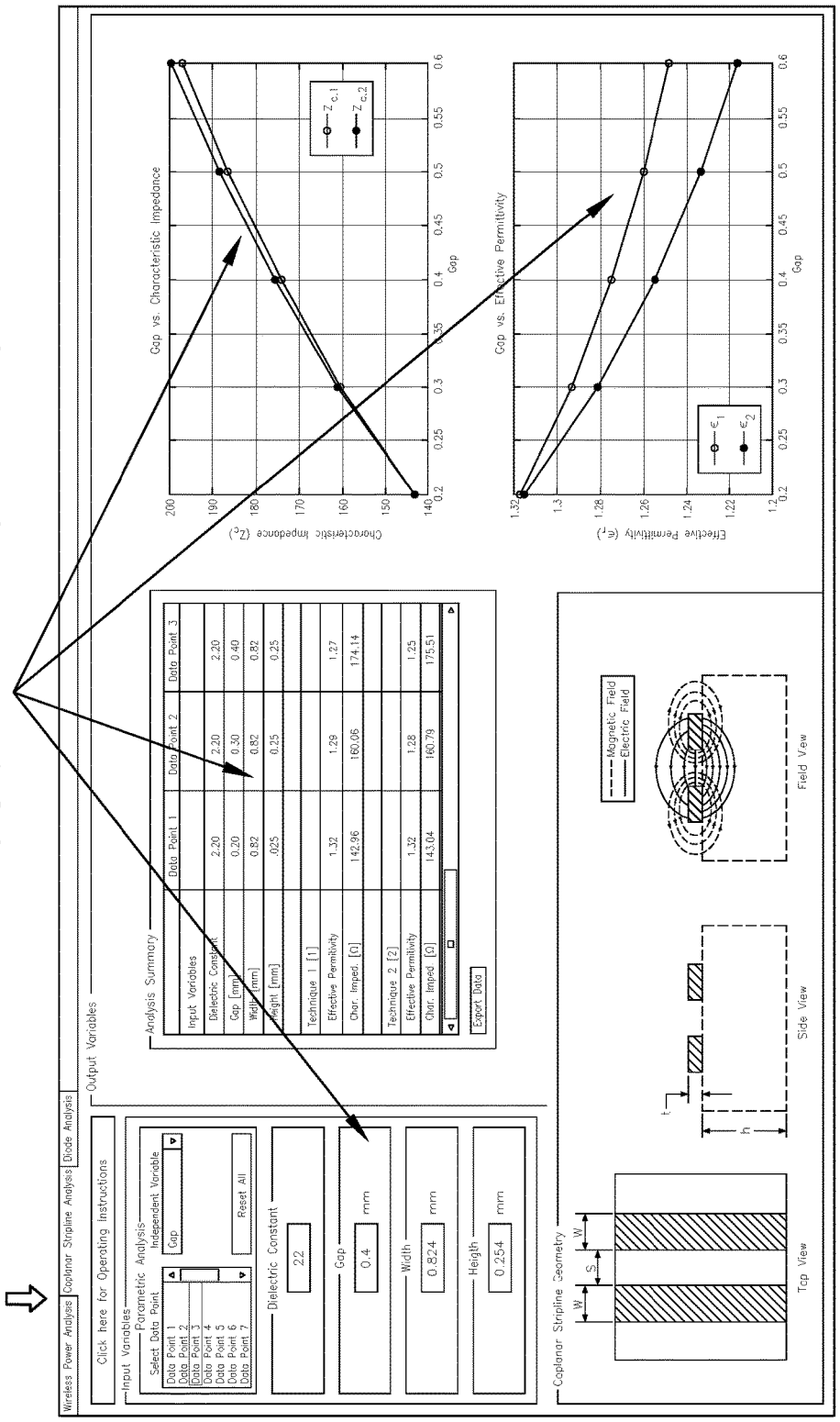
Figure 24D:
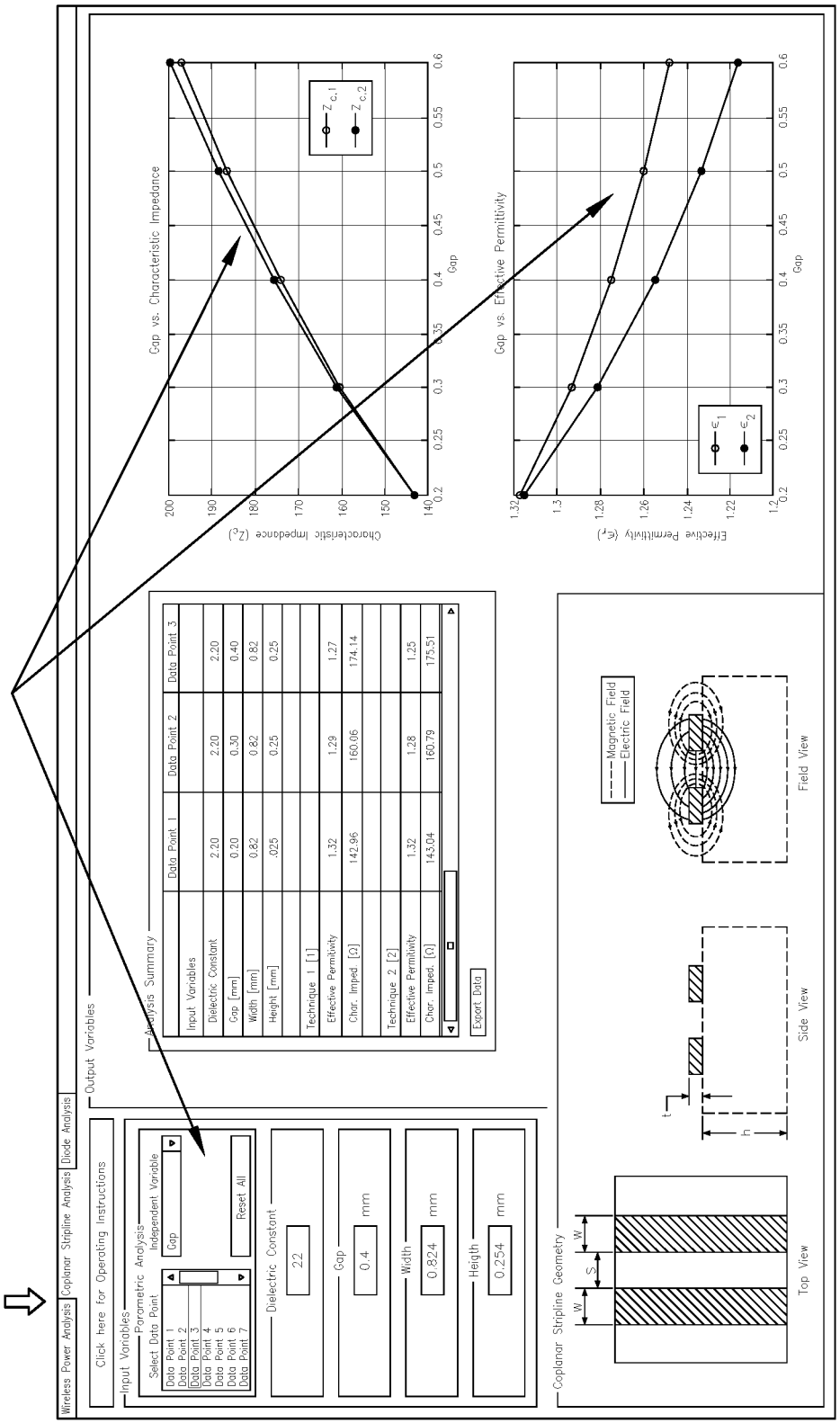

FIG. 23 shows an exemplary block diagram that shows exemplary steps for using the CPSA tool GUI. At Step 815 the user determines design parameters, for example, determining how far apart (e.g. gap 211) two conducting strips with a width 213 of 0.824 mm should be placed using a substrate (e.g. ROGERS RT/Duroid® 5880) with a relative permittivity (i.e. dielectric constant) 209 of 2.2 F/m and height 215 of 0.254 mm, so that the characteristic impedance 345 of the coplanar stripline is 175 ohms. The user then uses this information to design a diode with matching impedance (see step 827). At Step 817, the user executes the WPES MSAV Software 13 (e.g. see FIG. 3) and opens the Coplanar Stripline Analysis tab 195 (e.g. see FIG. 8) and chooses an independent variable (e.g. dielectric constant 209, gap 211, width 213, height 215) from the dropdown list 205, then enter in corresponding Input Variables text boxes using the substrate material specification sheet to provide electrical characteristics (e.g. relative permittivity (dielectric constant 209)), thickness (height 215), and width 213 of the substrate. At Step 819 the user enters a value for the independent variable (e.g. gap 211) in order to calculate the characteristic impedance and effective permittivity and display the results in the Gap vs. Characteristic Impedance graph 223, Gap vs. Effective Permittivity graph 227, and the Analysis Summary table 219. At Step 821, the user selects the next data point from Data Point Selection List 203 and fill in a new value for the Independent Variable (e.g. gap 211) to calculate characteristic impedance and effective permittivity again and display in the Gap vs. Characteristic Impedance graph 223, Gap vs. Effective Permittivity graph 227, and the Analysis Summary table 219. At Step 823 the user uses the Gap vs. Characteristic Impedance graph 223 to evaluate if proposed design scenario (stated independent variables) meets the requirement of, for example, 175 ohms, the gap is expected to be around 0.4 mm. At Step 825, the user activates the Export Data action button 221, which exports the analysis summary data 219 for use in other applications (e.g. Excel®) for follow up design, development, and manufacturing steps.

FIGS. 24A, 24B, 24C, and 24D show a visualization of the block diagram steps of FIG. 23, with exemplary GUI displays. At Step 817 the user opens the WPES MSAV Software 13 and the Coplanar Stripline Analysis tab 195. The user designates and selects the independent variable from the variable dropdown list 205 (e.g. dielectric constant 209, gap 211, width 213, height 215) and enters known values from design question from Step 815. At Step 819, the user enters candidate values for independent variable 199 and the results are displayed in the Gap vs Characteristic Impedance graph 223, Gap vs Effective Permittivity graph 227, and Analysis Summary results table 219. At Step 821 the user selects a new data point from Data Point list 203 and enters another candidate value for the independent variable 199 and results are displayed in the Gap vs Characteristic Impedance graph 223, Gap vs Effective Permittivity graph 227, and Analysis Summary results table 219. At Step 823, the user can enter multiple independent variables (e.g. gap 211) for multiple data points to be displayed in the Gap vs Characteristic Impedance graph 223 and the Gap vs Effective Permittivity graph 227.

Figure 25:
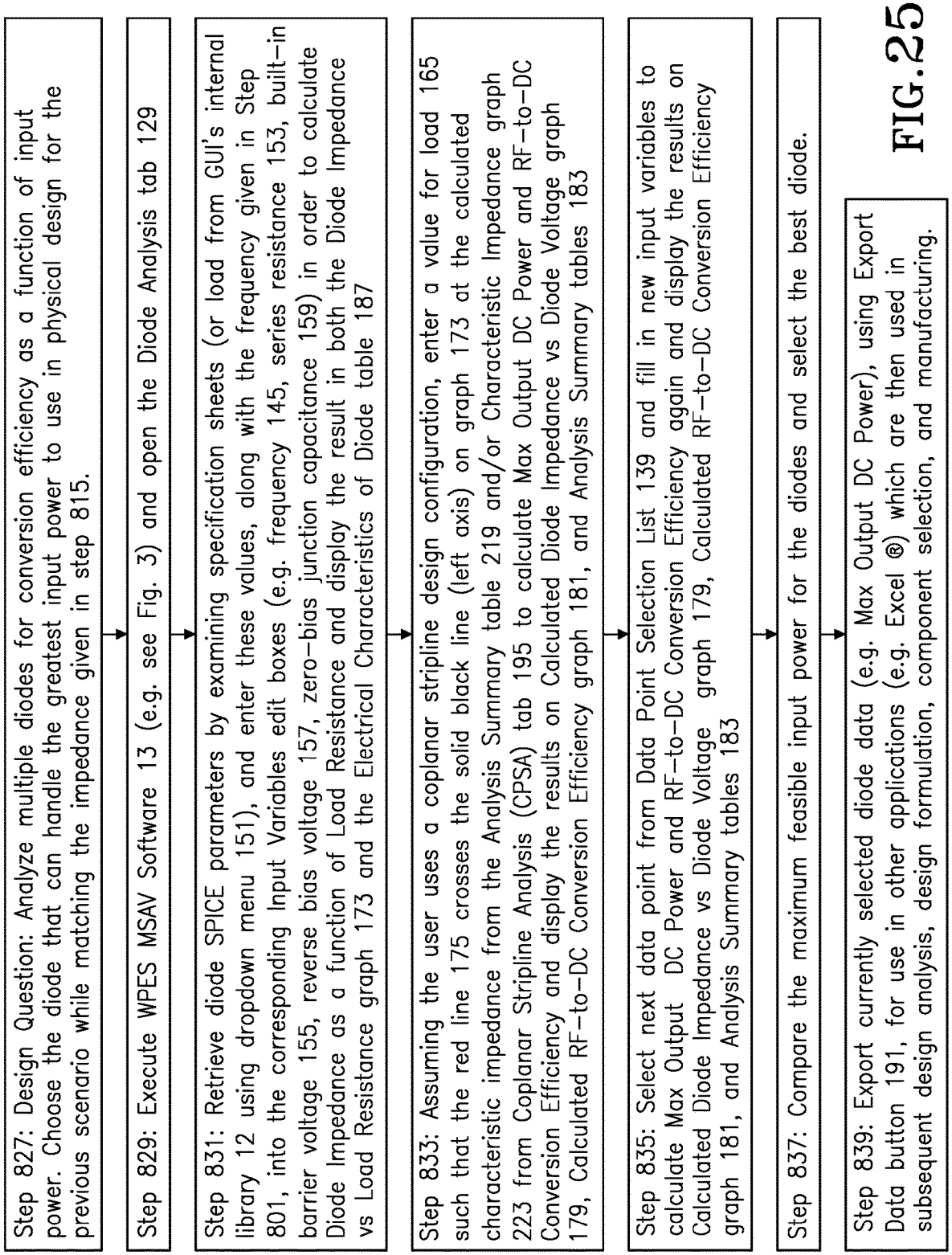
FIG. 25 shows an exemplary block diagram that shows exemplary steps for using the DA tool GUI.
Figure 26A:
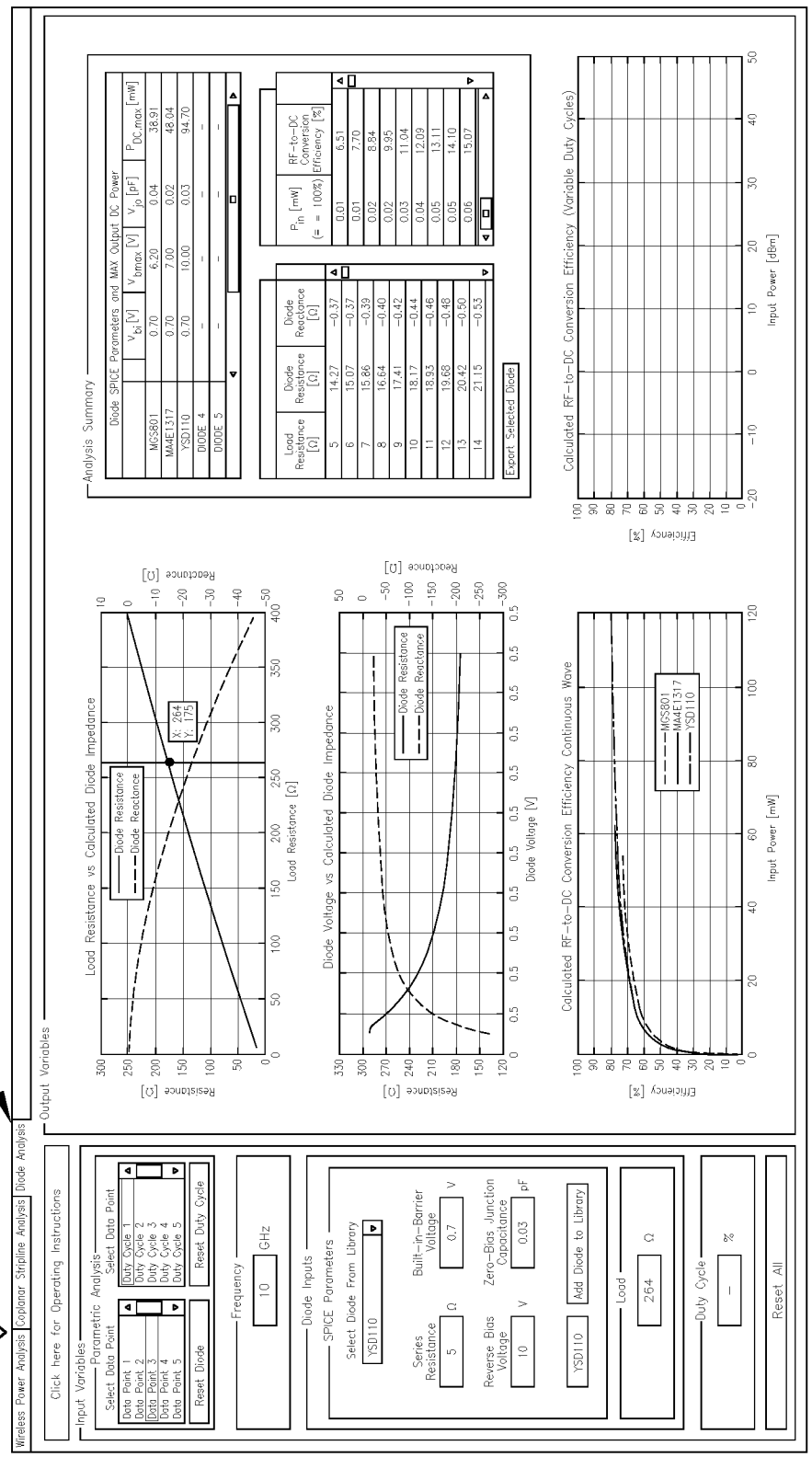
FIGS. 26A, 26B, 26C, and 26D show a simplified visualization of the block diagram steps of FIG. 25 overlaid and associated with exemplary GUI displays.
Figure 26B:
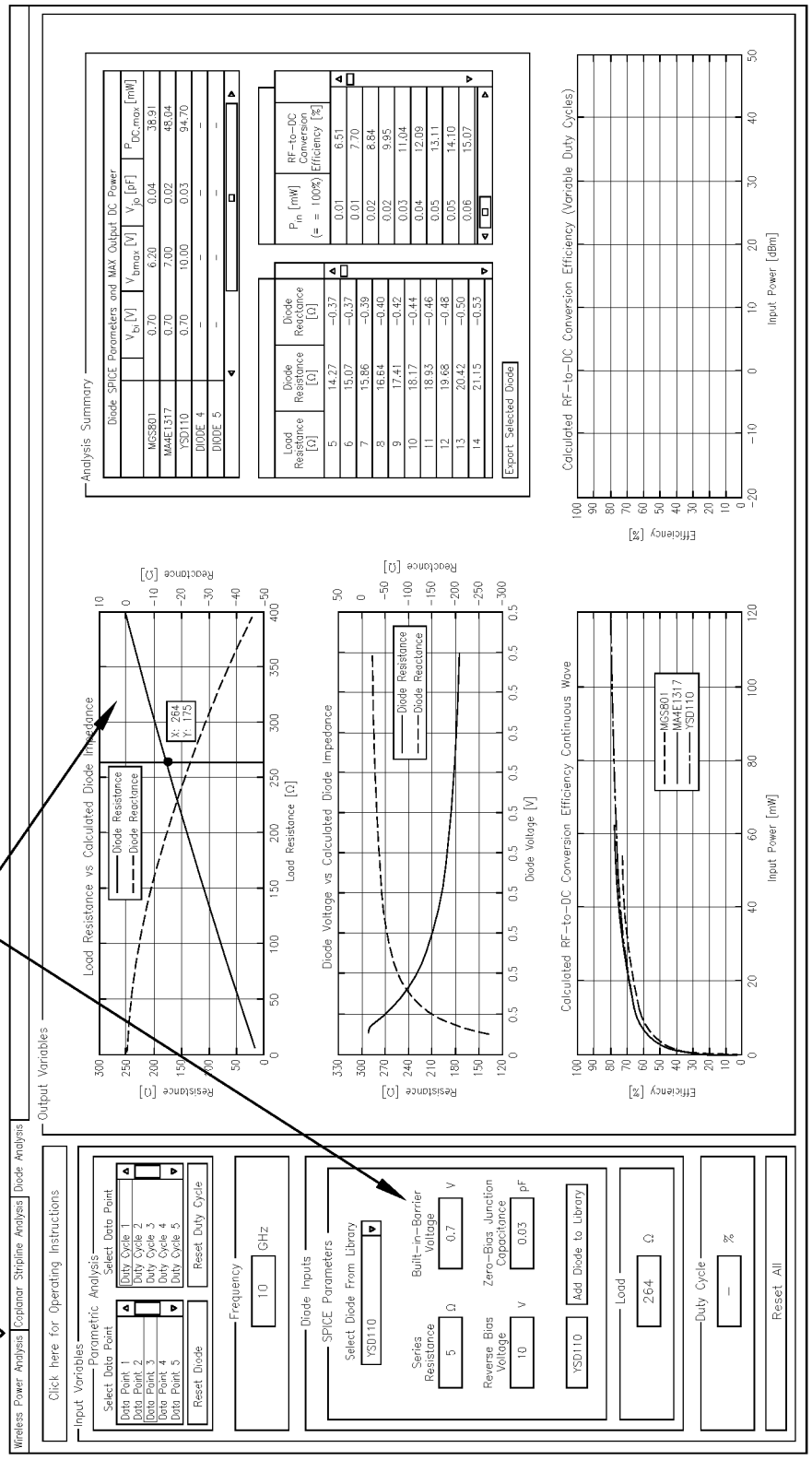
Figure 26C:
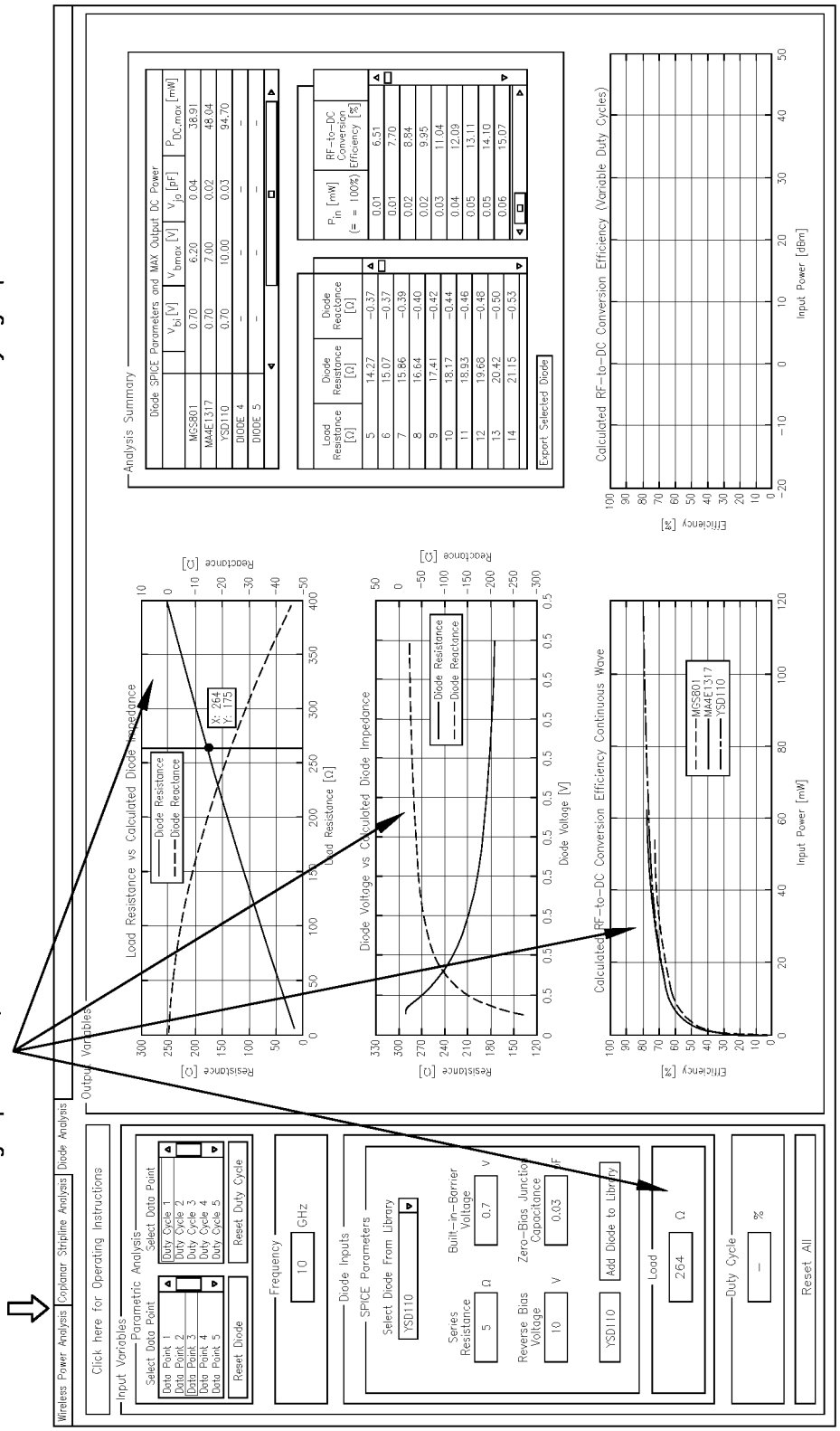
Figure 26D:
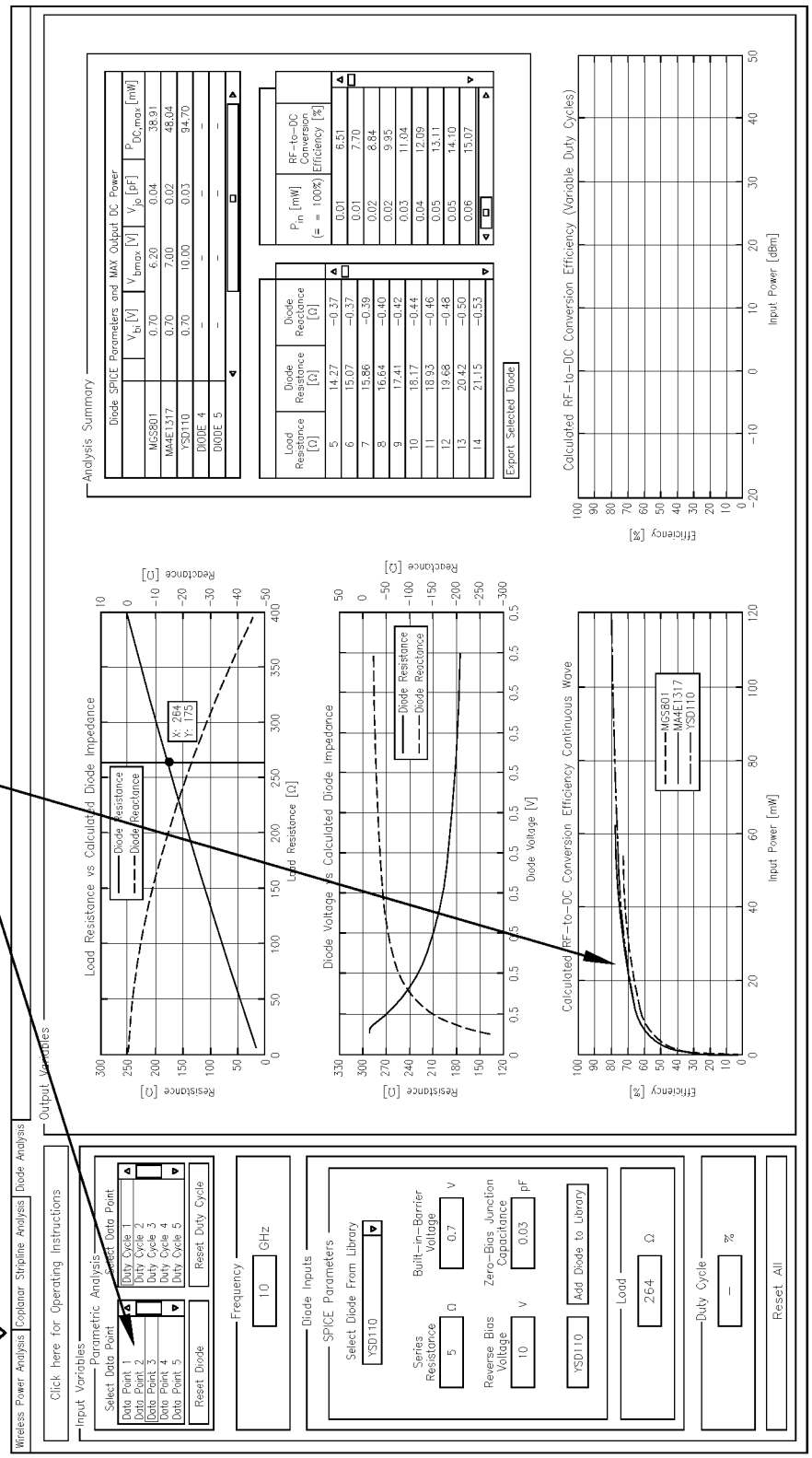

FIG. 25 shows an exemplary block diagram that shows steps for using the DA tool GUI. At Step 827 the user determines a design question. For example, the user may want to analyze multiple diodes for conversion efficiency as a function of input power in order to choose the diode that can handle the greatest input power to use in physical design for the previous scenario while matching the impedance given in step 815. At Step 829 the user executes the WPES MSAV Software 13 (e.g. see FIG. 3) and open the Diode Analysis tab 129. At Step 831, the user retrieves diode SPICE parameters by examining specification sheets (or load from library 12B using dropdown menu 151), and enters these values, along with the frequency given in Step 801, into the corresponding Input Variables edit boxes (e.g. frequency 145, series resistance 153, built-in barrier voltage 155, reverse bias voltage 157, zero-bias junction capacitance 159) in order to calculate Diode Impedance as a function of Load Resistance and display the result in both the Diode Impedance vs Load Resistance graph 173 and the Electrical Characteristics of Diode table 187. At Step 833, assuming the user uses a coplanar stripline design configuration, the user enters a value for load 165 such that the red line 175 crosses the solid black line (left axis) on graph 173 at the calculated characteristic impedance from the Analysis Summary table 219 and/or Characteristic Impedance graph 223 from Coplanar Stripline Analysis (CPSA) tab 195 to calculate Max Output DC Power and RF-to-DC Conversion Efficiency and display the results on Calculated Diode Impedance vs Diode Voltage graph 179, Calculated RF-to-DC Conversion Efficiency graph 181, and Analysis Summary tables 183. At Step 835, the user selects the next data point from Data Point Selection List 139 and fill in new input variables to calculate Max Output DC Power and RF-to-DC Conversion Efficiency again and display the results on Calculated Diode Impedance vs Diode Voltage graph 179, Calculated RF-to-DC Conversion Efficiency graph 181, and Analysis Summary tables 183. At Step 837 the user compares maximum feasible input power for the diodes and select the best diode. At Step 839, the user activates the Export Data button 191 which exports the currently selected diode data for use in other applications (e.g. Excel®) which are then used in subsequent design analysis, design formulations, component selection, and manufacturing.

FIGS. 26A, 26B, 26C, and 26D show a visualization of the block diagram steps of FIG. 33, with exemplary GUI displays. At Step 829, the user opens the WPES MSAV Software 13 and opens the Diode Analysis tab 129. At Step 831 the user enters candidate values for input variables (e.g. frequency 145, series resistance 153, etc.) and display Calculated Diode Impedance on Calculated Diode Impedance vs Load Resistance graph 173. At Step 833, the user enters candidate value for Load 165 and display input load resistance marker 175, Calculated Diode Impedance vs Diode Voltage graph 179, and Calculated RF-to-DC Conversion Efficiency graph 181. At Step 835, the user can enter multiple diode data points to be displayed in Calculated RF-to-DC Conversion Efficiency graph 181.

Although the invention has been described in detail with reference to certain preferred embodiments, variations and modifications exist within the spirit and scope of the invention as described and defined in the following claims.

The invention claimed is:

1. A computer-implemented system to aid a user in designing, optimizing, and manufacturing a wireless power system for use in a specific user-defined operational environment, comprising:

an input variable graphical user interface means adapted to enable graphical user interface selection of data point identifiers as well as selection of an independent and dependent variable from a plurality of variables comprising;

an output variable graphical user interface generator means, said output variable graphical user interface generator means comprises a first, second and third graphical generator means that generates collection efficiency graphical analysis graph data, atmospheric efficiency graph data, and rectenna RF to DC conversion efficiency graph data associated with said at least one design scenario, wherein said output variable section further comprises an analysis summary graphical user interface generation means that generates, for each data point identifier and its respective variable data, a summary of input variables, efficiency values comprising rectenna, atmospheric, and collection percentage values associated with the wireless power system being simulated, and output DC power data.

2. A computer-implemented wireless power energy system (WPES) modeling, simulation, analysis and visualization (MSAV) system configured to visually aid a user in designing, optimizing, and manufacturing a wireless power system for use in a specific user-defined operational environment, comprising:

a non-transitory machine readable storage medium comprising a plurality of machine readable instructions, a first library and a second library, wherein said first library comprises previously measured and user input wireless power energy system (WPES) experimental rectenna performance library data comprising usable power output and a list of power conversion efficiency performance data by design and power density comprising a list of rectenna designs with measured rectenna performance data at specific frequencies comprising a list of rectenna data with RF to DC power conversion efficiency as a function of power density of a directed energy beam for a specific rectenna element with an associated diode, wherein said a second library comprises diode SPICE performance parameters for each said diode;

wherein said plurality of machine readable instructions comprises a wireless power and energy system modeling and simulation and analysis visualization machine instruction system comprising:

a first plurality of machine readable machine instructions that generates a Wireless Power Analysis (WPA) graphical user interface (GUI), Coplanar Stripline Analysis (CPSA) GUI, and Diode Analysis (DA) GUI;

wherein the WPA GUI generates visualizations comprising simulation, and visual correlation of WPES system variables, WPES constants, a plurality of efficiency graphs, an output variable analysis summary section, and visual WPES design limitation boundary condition warning flags, wherein the WPA GUI further comprises:

an input variable section that enables user selection, input, and storage of sets of potential WPES system variables comprising WPES independent variable data, dependent variable data, and WPES constant data, wherein each said set is respectively associated with one of a plurality of graphically selected data point identifiers, each said sets comprising said WPES independent variable, WPES dependent variable and WPES constants having common WPES independent and dependent variable identifier selections and common WPES constant selections but different user input WPES independent variable data values associated with each said data point identifier; and an output variable section comprising GUI generation sections that generate said plurality of efficiency graphs, said output variable analysis summary section, and said visual design limitation boundary condition warning flags, wherein said plurality of efficiency graphs comprises WPES collection efficiency defined by percentage of an electromagnetic spectrum beam is absorbed by a selected rectenna array, atmospheric efficiency depicting how much energy is absorbed by specified atmospheric conditions, and WPES rectenna radio frequency (RF) to direct current (DC) conversion efficiency;

wherein the CPSA GUI displays selectable coplanar stripline (CPS) design configuration data comprising at least a balanced uniplanar transmission line formed by two metallic conductor strips separated by a certain gap width on a substrate for a rectenna design which is used by the DA GUI, where the DA GUI generates visualization graphs and analysis data for diode component and CPS design.

3. A computer-implemented system to aid a user in designing, optimizing, and manufacturing a wireless power system for use in a specific user-defined operational environment, comprising:

a machine readable storage medium comprising plurality of non-transitory wireless power system (WPS) design scenario selection, input, computation, simulation, and graphical user interface (GUI) generator machine readable instructions operable to operate at least one processor, memory and display to generate a plurality of WPS GUIs on the at least one display enabling concurrent viewing and rapid switching of WPS design performance and said design scenarios with design parameter limitation tradeoff space and design limitation warnings that increases design insights and reduces WPS design and production rework or errors, the WPS GUI generator comprising:

a wireless power analysis (WPA) GUI wherein the first that enables input of wireless power system (WPS) design or performance data comprising:

a first section comprising a WPA design or performance parameter selection and value input GUI section that enables input or selection of a plurality of WPS data points and related WPS data for each said WPS data point into a non-transitory first relational database storage section comprising a plurality of WPS data points that serve as data keys, a plurality of WPS design or performance parameters identifiers, and a plurality of WPS design or performance parameter values data that are each associated with one of the plurality of WPS design or performance parameters identifiers and further are respectively associated with each said data key, wherein the WPA design or performance parameter selection and value input GUI section enables designation of one of the plurality of WPS design or performance parameter identifiers as an independent variable and selection of another one of said plurality of WPS design or performance parameter identifiers as a dependent variable, wherein remaining ones of said plurality of WPS design or performance parameters that are not selected as dependent or independent variables are used as constants in WPA computations and said first section's GUI generation, wherein each of said independent and dependent variable identifier associated with each said data key are common to each other, wherein the first section further comprises a plurality of WPS design or performance parameter data input fields each associated with one of the plurality of WPS design or performance parameters identifiers receive WPS design or performance parameter values for storage as said plurality of WPS design or performance parameter values, wherein said first section further comprises machine instructions that generate one of a plurality of colored borders around respective ones of said plurality of WPS design or performance parameter data input fields where each colored border is associated with one of said independent variable, dependent variable, and constants;

a second section comprising a WPA analysis GUI generator section, the WPA GUI generator section generates a plurality of WPS efficiency graphs that generates the efficiency graphs based on the plurality of said plurality of WPS design or performance parameter values, a WPA analysis summary section, and a DC power output graph section, wherein the plurality efficiency graphs comprises wireless power system collection efficiency, atmospheric efficiency determined based on percentage of attenuation of a propagating electromagnetic wave, and an electromagnetic (EM) field to direct current (DC) conversion graph, wherein the WPA analysis summary comprises, for each said data point, a listing of said plurality of WPS design or performance parameter values, an associated efficiency value drawn from each of the said efficiency graphs, and an output DC power value, wherein the WPA analysis section further comprises a design warning visual indicator section that is generated when one or more of the said plurality of WPS design or performance parameter values fall outside boundary conditions associated with at least a selected design constraint, wherein the DC power output graph section generates a graph of rectenna EM power axis to said dependent variable axis graph, wherein said second section further comprises a rectenna performance specification data library selection section that selectively opens a menu of rectenna performance data sets each associated with at one of a plurality of rectenna designs, said rectenna performance data sets each comprising EM to DC conversion percentages at different power density values, wherein selection of one more said rectenna performance data sets is used to generate said design warning visual indicator and render said EM to direct current (DC) efficiency graph;

a diode analysis (DA) GUI comprising an input variable section and an DA output variable section, wherein the input section comprises data point identifier list and a diode specification or performance scenario data input section comprising frequency, diode inputs, and duty cycle percentage, wherein the output section comprises a plurality of diode performance graphs, an analysis summary section, and an EM to DC conversion efficiency graph section;

a rectenna power transfer configuration GUI section comprising a coplanar stripline (CPS) analysis GUI comprising an input section, an output section, and an analysis summary section; and a library of diode specification parameters comprising a plurality of electrical characteristics of one or more diodes.

4. A computer-implemented system to aid a user in designing, optimizing, and manufacturing a wireless power system for use in a specific user-defined operational environment, comprising:

at least one non-transitory computer readable storage medium storing:

a plurality of machine readable data libraries comprising a first and second machine readable data library, wherein the first machine readable data library comprises at least one measured output power density data efficiency defined as a percentage of electromagnetic energy absorbed by a rectenna and converted into direct current power by at least one diode, wherein the second machine readable data library comprises a power conversion efficiency percentage for each of said diodes as a function of input power to diode converted power output;

a plurality of machine readable instructions that operates at least one processor comprising:

a first plurality of machine readable instructions that generates a first GUI on a display, the first GUI comprises a first user-input variable section, a first graph generation section, a second graph generation section, a third graph generation section, and a first analysis output section, wherein:

the first user-input variable section further comprises:

a data point selection section that generates a data point selection user interface that enables user selection of one or more graphing data point identifiers which are used by the first user-input variable section and associated machine instructions as respective data keys for storing and retrieving independent, dependent and constant variable data value inputs and calculated for each graphing data point identifier stored within a variable data relational database storage section stored within said at least one non-transitory computer readable storage medium or another non-transitory computer readable storage medium corresponding to a wireless power system under test, wherein the data point selection section generates a first list menu with the graphing data point identifiers that a user can respectively select via the display;

a first independent variable identifier selection section that generates an independent variable identifier selection graphical user interface section that enables the user to select an independent variable identifier from an independent variable identifier dropdown menu displaying a list of selectable independent variable identifiers that are associated with said dependent variable values respectively associated with each graphing data point identifiers, wherein the list of selectable independent variable identifiers comprise a frequency variable (f), a power density variable ($p_d$), a transmitted power variable ($P_t$), a separation distance variable (d), a transmitter aperture area variable ($A_t$), and a receiver aperture area variable ($A_r$);

a first dependent variable identifier selection section generates a dependent variable identifier selection graphical user interface section that enables the user to select a dependent variable identifier that will be associated with a computed said dependent variable respectively associated with each said graphing data point identifiers and will be used to generate, said dependent variable identifier selection section enables the user to select one of said dependent variable identifiers from a dependent variable dropdown menu containing a list of selectable said dependent variable identifiers, wherein the list of selectable dependent variable identifiers comprises frequency, power density, transmitted power, separation distance, and transmitter aperture area;

a first user-input variable section that generates a user-input variable graphical user interface section that that enables the user to input a first plurality of user-input design values for the wireless power system being tested into a plurality of input fields corresponding to the wireless power system design variables, the first plurality of user-input design values comprising independent variable values and other variable values not selected as either independent or dependent variables in the first with listed in the independent or dependent variable identifier which are not designated as either independent or dependent variables in the independent and dependent variable identifier selection graphical user interface sections, wherein the user-input design values comprises the frequency variable, the power density variable, the transmitted power variable, the separation distance variable, the transmitter aperture area variable, and the receiver aperture area variable;

the first graph generation section further comprises:
a first graph section that generates and displays an invariant collection efficiency curve, the invariant collection efficiency curve generated comprising an algorithm based on a first formula $\eta_1 = 1-e^{-\tau}$ wherein a variable r is calculated by the first graph section using a second formula $$\tau = \frac{f\sqrt{A_t A_r}}{cd}$$

and a collection efficiency variable $\eta_1$ that represents collection efficiency of the wireless power system being tested, and a first tracking dot displayed on the invariant collection efficiency curve indicating the collection efficiency of the wireless power system being tested for the value of $\tau$ calculated using the second formula;
a visual representation of separation distance section displaying separation distance, receiving aperture area, and transmitting aperture area as input by the user in the first user-input variable section, for the wireless power system being tested;

the second graph generation section further comprises:
a second graph section that generates and displays a conversion efficiency curve corresponding with collection efficiencies stored in the first machine readable data library comprising an x-axis that displays the independent power density variable ($p_d$) and a y-axis that displays a plurality conversion efficiency variables ($\eta_2$) stored in the first machine readable data library;
a library graphical user interface action section which, when selected by the user, executes a second plurality of machine readable instructions which generates a second GUI comprising:
a diode performance library data section displaying a plurality of rectenna conversion efficiency data for different rectenna and diode combinations;
a plurality of graphical checkboxes associated with each rectenna and diode library dataset that enables the user to toggle select or display of at least one of the plurality of rectenna conversion efficiency data on the conversion efficiency curve displayed within the second graph generation section;
a user measured diode and rectenna conversion efficiency data input section that receives user input measured conversion efficiency data for at least one other diode and rectenna system, stores the user input measured conversion efficiency data within the first machine readable data library, and selectively displays the user input measured conversion efficiency data on the conversion efficiency curve displayed within the second graph generation section;
wherein the first plurality of machine instructions further generates a second tracking dot on the conversion efficiency curve displayed within the second graph generation section, the second tracking dot indicating the conversion efficiency of the wireless power system being tested at the power density ($p_d$) input by the user in the first user-input variable section;
the third graph generation section comprises a third graph section showing a DC power output curve comprising an x-axis that displays the separation distance variable (d) as entered in the first user-input variable section for at least one of the data points selected by the user in the first data point selection section and a y-axis that displays a DC power output variable ($P_{DC}$), the DC power output variable calculated using a third formula, $P_{DC} = P_t \eta_1 \eta_2 \eta_3$;
the first analysis output section displays output comprising:
a first table of analysis data containing both a first plurality of user-input design variables, a first plurality of efficiency data and a first output variable for each data point selected by the user, wherein the first plurality of user-input design variables comprise the frequency variable, the power density variable, the transmitted power variable, the separation distance variable, the transmitter aperture area variable, and the receiver aperture area variable, the first plurality of efficiency data comprises the collection efficiency ($\eta_1$), the conversion efficiency ($\eta_2$), and a total efficiency ($\eta$) calculated by the formula $\eta = 100\eta_1\eta_2$ and the first output variable comprises the DC power output variable ($P_{DC}$);
a first export action button which when selected by the user exports the first table of analysis data as a first set of non-transitory computer readable data for use by other computer systems;
a boundary flag warning section which displays a warning flag if the power density of the wireless power system being tested falls outside either an upper limit or a lower limit calculated using the equation $\min(p_{d,scaled}) \leq p_d \leq \max(p_{d,scaled})$;
a third plurality of machine readable instructions which generate a third GUI on a display, the third GUI comprises a second user-input variable section, a fourth graph generation section, a fifth graph generation section, a sixth graph generation section, and a second analysis output section relating to a diode being analyzed wherein:
the second user-input variable section further comprises:
a second data point selection section that enables the user to select a data point value corresponding to one of a plurality of diodes for testing from a second list menu that will be displayed in at least one of the fourth, fifth, or sixth graph generation sections;

a frequency input section which contains an edit box allowing the user to input a custom value for a second frequency variable corresponding to the diode being analyzed;

a diode variable input section comprising:

a diode dropdown menu allowing the user to select the diode to be analyzed from a plurality of diode data stored on the second machine readable data library;

a plurality of diode edit boxes which display a plurality of SPICE parameters of the diode selected from the diode dropdown menu and which allow the user to input custom values for the plurality of SPICE parameters and an action button which allows the user to save those values to the second machine readable data library, wherein the plurality of SPICE parameters comprises a series resistance variable ($R_s$), a built-in voltage variable ($V_{bi}$), a reverse-bias voltage variable ($V_{br}$), and a zero-bias junction capacitance variable ($C_{jo}$);

a load edit box in which the user enters a value for a custom load resistance variable ($R_L$);

the fourth graph generation section comprises a fourth graph section displaying a first diode resistance curve, showing diode resistance as a function of load resistance, stored on the second plurality of machine readable library data, a first diode reactance curve, showing diode reactance as a function of load resistance, stored on the second plurality of machine readable library data, and a tracking line indicating the load resistance value entered by the user in the load edit box;

the fifth graph generation section comprises a fifth graph section displaying a second diode resistance curve showing diode resistance as a function of diode voltage and a second diode reactance curve showing diode reactance as a function of diode voltage as calculated by the third plurality of machine readable instructions using a fourth equation, $$Z_d = \frac{\pi R_S}{\cos\theta_{on}\left(\frac{\theta_{on}}{\cos\theta_{on}} - \sin\theta_{on}\right) + j\omega R_S C_j\left(\frac{\pi - \theta_{on}}{\cos\theta_{on}} + \sin\theta_{on}\right)};$$

the sixth graph generation section comprises a sixth graph section displaying a plurality of curves displaying a conversion efficiency ($\eta_d$) for the diode data points selected by the user in the second data point section as a function of input power calculated using a fifth equation, $$\eta_d = \frac{1}{A + B + C},$$

where $$A = \frac{R_L}{\pi R_S}\left(1 + \frac{V_{bi}}{V_o}\right)^2\left[\theta_{on}\left(1 + \frac{1}{2\cos^2\theta_{on}}\right) - \frac{3}{2}\tan\theta_{on}\right],$$

-continued $$B = \frac{R_S R_L C_j^2 \omega^2}{2\pi}\left(1 + \frac{V_{bi}}{V_o}\right)\left(\frac{\pi - \theta_{on}}{\cos^2\theta_{on}} + \tan\theta_{on}\right),$$

$$C = \frac{R_L}{\pi R_S}\left(1 + \frac{V_{bi}}{V_o}\right)\frac{V_{bi}}{V_o}(\tan\theta_{on} - \theta_{on}), \text{ and}$$

$$\tan\theta_{on} - \theta_{on} = \frac{\pi R_S}{R_L\left(1 + \frac{V_{bi}}{V_x}\right)};$$

the second analysis output section further comprises:

a second table of analysis data containing the plurality of SPICE parameters for all the diodes selected from the diode dropdown menu and a max DC output power variable as calculated using a sixth equation, $P_{out} = P_{in}\eta_d$, where $$P_{in} = \frac{V_x^2}{R_L};$$

a third table of analysis data containing the load resistance value as entered by the user in the load edit box and displayed in the fourth graph section, the diode resistance as calculated by the third plurality of machine readable instructions and displayed in the fourth graph section, and the diode reactance as calculated by the third plurality of machine readable instruction and displayed in the fourth graph;

a fourth table of analysis data containing input power and conversion efficiency as calculated by the third plurality of machine readable instructions and displayed in the sixth graph;

a second export action button which when selected by the user exports the second, third, and fourth tables of analysis data as a second set of non-transitory computer readable data for use by other computer systems;

a fourth plurality of machine readable instruction which generate a fourth GUI on a display, the fourth GUI comprises a third user-input variable section, a seventh graph generation section, an eight graph generation section, and a third analysis output section wherein:

the third user-input variable section further comprises:

a third data point selection section that enables the user to select one of a plurality of coplanar stripline data point values from a third list menu that will be displayed in at least one of the seventh or eighth graph generation sections;

a second independent variable selection dropdown menu allowing the user to select a second independent variable from a plurality of coplanar stripline variables, the plurality of coplanar stripline variables comprising a dielectric constant variable ($\varepsilon_r$), a separation gap variable (S), a width variable (W), and a substrate height variable (h);

a coplanar stripline variable section containing a plurality of coplanar stripline edit boxes in which the user enters custom values for the plurality of coplanar stripline variables comprising the dielectric constant variable ($\varepsilon_r$), the separation gap variable (S), the width variable (W), and the substrate height variable (h);

the seventh graph generation section displays a seventh graph section showing a plurality of characteristic impedance curves with an x-axis displaying the second independent variable as selected by the user in the second independent variable selection dropdown menu and a y-axis displaying a plurality of characteristic impedances ($Z_{c,1}$, $Z_{c,2}$) of the coplanar striplines being analyzed using a seventh equation, $$Z_{c,1} \frac{120\pi}{\sqrt{\varepsilon_{\mathit{eff}}}} \frac{K(k)}{K(k')}$$

and an eighth equation $$Z_{c,2} = \frac{120\pi}{\sqrt{\varepsilon_{\mathit{eff}}}} \frac{K(k_1)}{K'(k_1)};$$

the eighth graph generation section displays an eighth graph section showing a plurality of effective impedance curves with an x-axis displaying the second independent variable as selected by the user in the second independent variable selection dropdown menu and a y-axis displaying a plurality of effective permittivities ($\varepsilon_{\mathit{eff},1}$, $\varepsilon_{\mathit{eff},2}$) of the coplanar stripline being analyzed using a ninth equation $$\varepsilon_{\mathit{eff},1} = 1 + \frac{\varepsilon_r - 1}{2} \frac{K(k')K(k_1)}{K(k)K(k_1')}$$

and a tenth equation $$\varepsilon_{\mathit{eff},2} = 1 + \frac{\varepsilon_r - 1}{2} \frac{K'(k_{10})K(k_1)}{K(k_{10})K'(k_1)};$$

the third analysis output section comprises:
a fifth table of analysis data containing the plurality of custom coplanar stripline variable values for each of the plurality of coplanar stripline data points, the plurality of effective permittivities and the plurality of characteristic impedances as calculated using the ninth and tenth equations;
a third export action button which when triggered by the user exports the fifth table of analysis table as a third set of non-transitory computer readable data for use by other computer systems.

5. A computer-implemented system to aid a user in designing, optimizing, and manufacturing a wireless power system for use in a specific user-defined operational environment, comprising:
a non-transitory computer readable storage medium storing:
a first machine readable data library containing previously measured and user measured data pertaining to a plurality of different rectenna arrays;
a second machine readable data library containing previously or user measured data pertaining to a plurality of different diodes;
a third machine readable data library storing user-input data and at least some outputs from the computer-implemented system;
a first, a second, and a third plurality of machine readable instructions, which generate a wireless power analysis GUI, wherein:
the first plurality of machine readable instructions generates a first data point list menu allowing a user to select at least one of a plurality of data points corresponding to a plurality of wireless power system configurations, a first independent variable dropdown menu, a dependent variable dropdown menu, and a plurality of user-input wireless power system variable edit boxes which accept a plurality of user-input wireless power system variables, the plurality of user-input wireless power system variable edit boxes comprises:
a first transmitted power beam frequency variable edit box;
a received power beam power density variable edit box;
a total transmitted power variable edit box;
a transmitting antenna aperture and receiving antenna aperture separation distance variable edit box;
a transmitter antenna aperture area variable edit box;
a receiver antenna aperture area variable edit box;
the second plurality of machine readable instructions generates a first plurality of output graphs, the first plurality of output graphs comprises:
a first output graph section containing a first output graph displaying an invariant curve of collection efficiencies for the plurality of wireless power configurations stored in the first machine readable data library and a first tracking dot indicating a collection efficiency of the wireless power system being examined, and a visual representation of separation distance between a transmitting aperture antenna and a receiving aperture antenna for the wireless power system being examined;
a second output graph section containing a second output graph displaying a plurality of receiving rectenna conversion efficiency curves corresponding to a plurality of previously measured rectenna conversion efficiency data stored in the first machine readable data library, and an open library action button, wherein the open library action button triggers a third plurality of machine readable instructions when selected by the user, the fourth plurality of machine readable instructions generate a library selection GUI, the library selection GUI further comprises:
a table containing the plurality of previously measured rectenna conversion efficiency data stored in the first machine readable data library;
a plurality of checkboxes allowing the user to choose whether or not to display at least one or more of the plurality of previously measured rectenna conversion efficiency data;
a user measured rectenna conversion efficiency data input section allowing the user to input a set of custom rectenna conversion efficiency data, to choose whether or not to display the set of custom rectenna conversion efficiency data, and to save the custom rectenna conversion efficiency data to the first machine readable data library;

a third output graph section containing a third output graph displaying a DC power output curve consisting of a DC power output variable calculated based on the plurality of user-input wireless power system variables entered in the user-input wireless power system variable edit boxes, wherein each point on the DC power output curve represents one of the plurality of data points corresponding to the plurality of wireless power system configurations;

the fourth plurality of machine readable instructions generates a first analysis summary section, the first analysis summary section comprises:

a first analysis summary table displaying the plurality of user-input wireless power system variables, the collection efficiency of each of the plurality of wireless power system configurations examined, the conversion efficiency of each of the plurality of wireless power system configurations examined, the DC power output variable for each of the wireless power systems tested;

an export data action button that exports the first analysis summary table in a form readable by other computer applications when selected by the user;

a boundary warning section that displays a warning flag when the conversion efficiency of the wireless power system being examined falls outside an upper conversion efficiency limit or a lower conversion efficiency limit as stored on at least one of the plurality of previously measured rectenna conversion efficiency data stored on the first machine readable data library;

a fifth, a sixth, and a seventh plurality of machine readable instructions, which generate a diode analysis GUI, wherein:

the fifth plurality of machine readable instructions generates a second data point list menu allowing the user to select at least one of a plurality of diode data points corresponding to a plurality of different diodes to be examined, and a plurality of user-input diode variable edit boxes, the plurality of user-input diode variable edit boxes comprises:

a second transmitted power beam frequency variable edit box, allowing the user to enter a custom power beam frequency variable;

a diode selection dropdown menu, allowing the user to load a plurality of diode SPICE parameters for a known diode as stored in the second machine readable data library;

a plurality of SPICE parameter edit boxes, the plurality of SPICE parameter edit boxes comprises:
a diode series resistance variable edit box;
a diode built-in barrier voltage variable edit box;
a diode reverse bias voltage variable edit box; and a diode zero-bias junction capacitance variable edit box;

wherein the SPICE parameter edit boxes allow the user to input a plurality of custom diode SPICE parameters for examination and saving;

an add diode to library action button, allowing the user to save the plurality of custom diode SPICE parameters to the second machine readable data library;

a diode load resistance variable edit box, allowing the user to enter a custom diode load resistance variable;

the sixth plurality of machine readable instructions generates a second plurality of output graphs, the second plurality of output graphs comprises:

a fourth output graph section containing a first diode impedance graph which displays a range of potential diode load resistance variables, a first diode resistance curve showing a diode resistance variable as a function of the custom diode load resistance variable, a first diode reactance curve showing a diode reactance variable as a function of the custom diode load resistance variable, and a tracking line showing the diode load resistance variable entered by the user in the diode load resistance variable edit box;

a fifth output graph section containing a second diode impedance graph which displays a range of potential diode voltage values, a second diode resistance curve showing the diode resistance variable as a first function of the range of potential diode voltage values, and a second diode reactance curve showing the diode reactance variable as a second function of the range of potential diode voltage values;

a sixth output graph section containing a diode conversion efficiency graph which displays a range of potential input power values, and a plurality of curves corresponding to the conversion efficiency of each of the plurality of different diodes being examined as selected by the user in the second data point list menu as functions of the range of potential input power values;

the seventh plurality of machine readable instructions generates a second analysis summary section, the second analysis summary section comprises:

a plurality of diode analysis summary tables comprises:
a SPICE parameters table containing the plurality of custom diode SPICE parameters for each of at least one of the plurality of diode data points, an electrical characteristics table containing the diode reactance variable and the diode impedance variable for a plurality of load resistance values, and a power and voltage table containing the conversion efficiency of the plurality of different diodes being examined for a plurality of input power values;
an export diode data action button that exports the plurality of diode analysis summary tables in a form readable by other computer applications when selected by the user;

an eighth, a ninth, and a tenth plurality of machine readable instructions, which generate a coplanar stripline analysis GUI, wherein:

the eighth plurality of machine readable instructions generates a third data point list menu allowing the user to select at least one of a plurality of coplanar stripline data points corresponding to a plurality of different coplanar striplines to be examined, a second independent variable dropdown menu allowing the user to select an independent variable, and a plurality of user-input coplanar stripline variable edit boxes allowing the user to enter custom values for a plurality of coplanar stripline variables, the plurality of coplanar stripline variable edit boxes comprises:
a coplanar stripline dielectric constant edit box allowing the user to input a custom value for a coplanar stripline dielectric constant variable;
a coplanar stripline separation gap edit box allowing the user to input a custom value for a coplanar stripline separation gap variable;
a coplanar stripline width edit box allowing the user to input a custom value for a stripline width variable;
a substrate height edit box allowing the user to input a custom value for a substrate height variable;
wherein each of the plurality of coplanar stripline variables are contained and selectable in the second independent variable dropdown menu;
the ninth plurality of machine readable instructions generates a third plurality of output graphs, the third plurality of output graphs comprises:
a seventh output graph section containing a characteristic impedance graph which displays a plurality of characteristic impedance curves showing a characteristic impedance variable as a function of the independent variable selected by the user from the second independent variable dropdown menu, wherein each curve calculated using one of a plurality of well-known characteristic impedance functions;
an eighth output graph section containing an effective permittivity graph which displays a plurality of effective permittivity curves showing an effective permittivity variable as a function of the independent variable selected by the user from the second independent variable dropdown menu, wherein each curve calculated using one of a plurality of well-known effective permittivity functions;
the tenth plurality of machine readable instructions generates a third analysis summary section, the third analysis summary section comprises:
a coplanar stripline analysis table containing the plurality of coplanar stripline variables for each of the plurality of coplanar stripline data points as entered by the user in the plurality of coplanar stripline variable edit boxes, the effective permittivity variable as displayed in the effective permittivity graph, and the characteristic impedance variable as displayed in the characteristic impedance graph;
an export coplanar stripline data action button that exports the coplanar stripline analysis summary table in a form readable by other computer applications when selected by the user.

6. A computer-implemented system to aid a user in designing, optimizing, and manufacturing a wireless power system for use in a specific user-defined operational environment, comprising:
a machine readable storage medium comprising a plurality of machine readable instructions comprising:
a first plurality of machine readable instructions means for generating a wireless power graphical user interface (GUI) comprising:
WPA_INIT machine instructions that generates wireless power analysis UIObject Variables;
DA_INIT that generates the DA UIObject variables;
CPSA_INIT that generates CPSA UIObject variables;
WPA_CALLBACK creates user interface sections that accepts user input from WPA input variables edit boxes, WPA transmitter aperture radio buttons, receiver aperture radio buttons, parametric analysis lists, and WPA action button_library that generates a GUI for wireless power library data selection;
DA_CALLBACK generates user interface sections that accepts user input from DA input variables edit boxes, DA library menu/edit box, and DA parametric analysis lists;
CPSA_CALLBACK generates CPSA user interface sections that accepts user input from CPSA input variables edit boxes, and CPSA parametric analysis lists;
WPA_UPDATE calculates designated dependent variable data value and displays in a dependent variable input variables edit box, the WPA_UPDATE then updates output variables graphs, analysis summary table, and warning text user interface sections;
DA_UPDATE generates user interface displays of values for DA output variables graphs and DA analysis summary tables;
CPSA_UPDATE displays values for CPSA output variables graphs and DA analysis summary table;
a second plurality of machine readable instructions for performing wireless power analysis (WPA) system initialization comprising:
a parametric_analysis section that generates parametric analysis lists comprising dependent and independent variable identifier drop down selection menus and data point list;
a frequency variable input field box generator that displays a frequency variable input field and generates a first colored border surrounding the frequency variable input field with a default black color;
a power_density variable input field box generator that generates power density user interface panel comprising a second colored border and power density variable edit box within the power density user interface panel;
a power_transmitted variable input field box generator that generates a power transmitted user interface panel comprising a third colored border and power transmitted variable edit box within the power transmitted input user interface panel;
a distance input variable input field box generator that generates a distance user interface panel comprising a fourth colored border and a distance variable edit box within the distance user interface panel;
a transmitter_aperture_area input field box generator that generates a transmitter aperture area user interface panel comprising a fifth colored border and a transmitter aperture area selection interface within the transmitter aperture area user interface panel;

a receiver_aperture_area input field box generator that generates a receiver aperture area user interface panel comprising a sixth colored border and a receiver aperture area selection interface within the transmitter aperture area user interface panel;

a graph axes generator that initializes a plurality of graph display user interface sections and generates an interactive user-input action and experimental rectenna data storage library GUI displaying stored rectenna performance data associated with a plurality of rectenna designs, the rectenna performance data comprising power density, and RF to DC conversion data for different rectennas;

an analysis summary generator that generates an analysis summary user interface section, a WPA analysis table within the analysis summary user interface section that comprises input variable data, efficiency data, and output DC power data, wherein the analysis summary generator further generates warning text based on power density values exceeding design parameters for a selected rectenna comprising an antenna and diode combination in the rectenna data storage library;

a means for performing diode analysis (DA) system initialization;

a means for performing coplanar stripline analysis (CPSA);

a means for performing WPA callback;

a means for generating a WPA library selection GUI;

a means for performing DA system callback functions comprising operating said wireless power GUI elements;

a means for performing CPSA callback;

a means for performing a WPA update;

a means for performing a DA update;

a means for performing a CPSA update;

a WPA variables data structure generator and storage means;

a CPSA analysis variables data structure generator and storage means;

a means for performing a DA variables data structure generator and storage means;

a user interface (UI) Object variables data structure generator and storage means;

a means for an experimental data library UIObject variables data structure generator and storage;

a CPSA UIObject variables data structure generator and storage means; and a DA UIObject variables data structure generator and storage means.

* * * * *